(12) United States Patent
Nakayama et al.

(10) Patent No.: US 7,120,885 B2
(45) Date of Patent: Oct. 10, 2006

(54) COMPUTER AIDED DESIGN APPARATUS FOR AIDING DESIGN OF A PRINTED WIRING BOARD TO EFFECTIVELY REDUCE NOISE

(75) Inventors: Takeshi Nakayama, Katano (JP); Yukihiro Fukumoto, Hirakata (JP); Hiroshi Ikeda, Kyoto (JP); Shinichi Tanimoto, Neyagawa (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 544 days.

(21) Appl. No.: 10/620,535

(22) Filed: Jul. 16, 2003

(65) Prior Publication Data

US 2004/0015804 A1    Jan. 22, 2004

Related U.S. Application Data

(62) Division of application No. 09/771,843, filed on Jan. 29, 2001, now Pat. No. 6,631,509.

(30) Foreign Application Priority Data

Jan. 27, 2000  (JP) ............... 2000-018405
Jan. 28, 2000  (JP) ............... 2000-020843

(51) Int. Cl.
*G06F 17/50*    (2006.01)
(52) U.S. Cl. .................. 716/9; 716/4; 716/12
(58) Field of Classification Search ............ 716/1, 716/4, 9, 12
See application file for complete search history.

(56) References Cited

U.S. PATENT DOCUMENTS 5,847,968 A * 12/1998 Miura et al. ................ 716/8

* cited by examiner

*Primary Examiner*—Thuan Do

(57) ABSTRACT

A CAD apparatus includes a determining unit for determining a component order in ascending order of impedance of components for passive components amongst components to be placed on a printed wiring board. The CAD apparatus places each passive component in the determined component order in a vicinity of power pins of non-passive components that are already placed.

9 Claims, 54 Drawing Sheets

FIG. 5

1201 COMPONENT INFORMATION LIST

| COMPONENT NUMBER 1202 | COMPONENT NAME 1203 | COMPONENT SHAPE 1204 | PLACEMENT SURFACE 1205 | BASE POINT COORDINATES 1206 | PRIORITY ORDER 1207 | MAIN COMPONENT NUMBER 1208 | AUXILIARY COMPONENT NUMBER 1209 | COMPONENT GROUP 1210 |
|---|---|---|---|---|---|---|---|---|
| IC1 | MN1 | QFP1 | A | (132,135) | - | - | C1,C5,C6,C10 L1 | 1 |
| IC2 | MN2 | SOP1 | A | (46,123) | - | - | C2,C7,R1 | 1 |
| IC3 | MN3 | SOP1 | A | (32,45) | - | - | C3,C8 | 1 |
| ... | ... | ... | ... | ... | ... | ... | ... | ... |
| C1 | EC1 | SOP11 | A | (143,120) | 28 | IC1 | - | 2 |
| C2 | EC1 | SOP11 | A | (50,101) | 28 | IC2 | - | 2 |
| C3 | EC1 | SOP11 | A | (28,30) | 28 | IC3 | - | 2 |
| ... | ... | ... | ... | ... | ... | ... | ... | ... |

FIG. 6

1301 COMPONENT MASTER INFORMATION LI

| 1302 | 1303 | 1304 | 1305 | 1306 | 1307 | 1308 | 1309 | 1310 |
|---|---|---|---|---|---|---|---|---|
| COMPONENT NAME | PIN COUNT | COMPONENT TYPE | L VALUE [nH] | C VALUE [uF] | R VALUE [Ω] | INTERNAL CLOCK-POWER NET NAME | EFFECTIVE FREQUENCY MIN [MHz] | EFFECTIVE FREQUENCY MAX [MHz] |
| MN1 | IC | 48 | – | – | – | 33MHz–vcc2 | – | – |
| MN2 | IC | 14 | – | – | – | – | – | – |
| MN3 | IC | 14 | – | – | – | – | – | – |
| ... | ... | ... | ... | ... | ... | ... | ... | ... |
| EC1 | C | 2 | 1.1 | 10 | 0.1 | – | 0 | 50 |
| EC2 | C | 2 | 0.8 | 0.1 | 0.1 | – | 0 | 200 |
| EC3 | C | 2 | 0.6 | 0.01 | 0.1 | – | 0 | 500 |
| ... | ... | ... | ... | ... | ... | ... | ... | ... |

1401 NET INFORMATION LIST

| 1402 | 1403 | 1404 | 1405 | 1406 | 1407 | 1408 | 1409 | 1410 |
|---|---|---|---|---|---|---|---|---|
| NET INFORMATION LIST | CONTACT PIN NUMBER (COMPONENT NUMBER-PIN NUMBER) | FREQUENCY [MHz] | RISING TIME [ns] | FALLING TIME [ns] | OUTPUT VOLTAGE HIGH [V] | OUTPUT VOLTAGE LOW [V] | NET TYPE | DUTY RATIO |
| clk1 | IC1-2,R1-1 | 30 | 1.4 | 1.35 | 3.3 | 0.0 | clock | 0.48 |
| clk3 | IC1-20,IC2-2, IC3-2,IC4-2 | 16 | 1.5 | 1.48 | 3.3 | 0.0 | clock | 0.49 |
| n1 | IC1-1,IC2-3 | — | — | — | — | — | — | — |
| n101 | R1-2,IC4-12 | 30 | 1.4 | 1.35 | 3.3 | 0.0 | clock | 0.48 |
| v1 | IC1-4,IC1-6, IC2-6,IC2-10 C1-1,C2-1,C3-1 | — | — | — | — | — | power | — |
| ... | ... | ... | ... | ... | ... | ... | ... | ... |

FIG. 8

1501 PIN INFORMATION LIST

| COMPONENT NUMBER | PIN NUMBER | PIN NAME | POWER NET NAME | POWER PIN NUMBER | FREQUENCY [MHz] | RISING TIME [ns] | FALLING TIME [ns] | OUTPUT VOLTAGE HIGH [V] | OUTPUT VOLTAGE LOW [V] | PRIORITY ORDER | USAGE FREQUENCY MIN [MHz] | USAGE FREQUENCY MAX [MHz] | PIN TYPE | CONSUMED CURRENT [mA] | DUTY RATIO |
|---|---|---|---|---|---|---|---|---|---|---|---|---|---|---|---|
| IC1 | 1 | p1 | – | – | – | – | – | – | – | – | – | – | normal | – | – |
| IC1 | 2 | clk | v1 | 4 | 30 | 1.4 | 1.35 | 3.3 | 0.0 | – | 0 | 300 | clock | – | 0.49 |
| IC1 | 4 | v1 | – | – | 30 | 1.4 | 1.35 | 3.3 | 0.0 | 1 | 0 | 300 | power | 10 | – |
| IC1 | 6 | v1 | – | – | 15 | 1.5 | 1.48 | 3.3 | 0.0 | 2 | 0 | 200 | power | 20 | – |
| IC1 | 20 | clk3 | v1 | 18 | 15 | 1.5 | 1.48 | 3.3 | 0.0 | 1 | 0 | 200 | clock | – | 0.48 |
| IC1 | 47 | v2 | – | – | 33 | 1.0 | 0.9 | 2.0 | 0.0 | – | 0 | 400 | power | 20 | – |
| ... | ... | ... | ... | ... | ... | ... | ... | ... | ... | ... | ... | ... | ... | ... | ... |

FIG. 9

1601 EFFECTIVE FREQUENCY SPECTRUM INFORMATION LIST

| 1602 PIN SPACING [mm] | 1603 INDUCTANCE VALUE [nH] | 1604 EFFECTIVE FREQUENCY SPECTRUM [MHz] |
|---|---|---|
| 0−0.5 | 0.8 | (0.1−500) |
| 0.5−1.0 | 0.9 | (0.1−300) |
| 1.0−1.5 | 1.1 | (0.1−100) |
| 1.5−2.0 | 1.2 | (0.1−100) |
| ... | ... | ... |

1701 COMPONENT SHAPE INFORAMTION LIST

| COMPONENT SHAPE | MINIMUM/MAXIMUM DOMAIN | PIN NUMBER | PIN COORDINATES | PIN SPACING [mm] |
|---|---|---|---|---|
| QFP1 | (0,0) — (15,15) | 1 | (0,3,0,3) | 0.2 |
| | | 2 | (0,3,0,5) | |
| | | ... | ... | |
| BGA1 | (0,0) — (13,13) | 1 | (0,2,0,2) | 0.2 |
| | | 2 | (0,2,0,4) | |
| | | ... | ... | |
| SOP1 | (0,0) — (10,15) | 1 | (0,2,0,2) | 0.2 |
| | | 2 | (0,2,0,4) | |
| | | ... | ... | |
| ... | ... | ... | ... | ... |
| SOP11 | (0,0) — (1.0,0.5) | 1 | (0,15,0,25) | 0.7 |
| | | 2 | (0,85,0,25) | |
| ... | ... | ... | ... | ... |

FIG. 36

1801 HIERARCHICAL NET INFORMATION LIST 1800

| | | HIERARCHICAL NET INFORMATION | | |
|---|---|---|---|---|
| NET NAME | CONTACT PIN NUMBER (COMPONENT NUMBER-PIN NUMBER) | HIERARCHICAL NET NUMBER | REPRESENTATIVE PIN NUMBER | HIERARCHICAL NET CONTACT PIN NUMBER (COMPONENT NUMBER-PIN NUMBER) |
| Vcc1 | IC1-4,IC1-6,IC1-15,IC1-18,IC1-32,IC1-36,···C1-37,IC2-6,IC2-11,IC2-14 ···,C1-1,C2-1,C3-1,··· | 1 | C1-1 | IC1-4,IC1-6,IC1-15,IC1-18, IC1-32,IC1-36,···C1-1,C5-1,··· |
| | | 2 | C2-1 | IC2-6,IC2-11,IC2-14, C2-1,C7-1 |
| | | ··· | ··· | ··· |
| Vcc2 | IC1-47,IC10-6,IC12-15, ···, C10-1,C21-1,C23-1,··· | 1 | C10-1 | IC1-47,C10-1 |
| | | ··· | ··· | ··· |
| ··· | | | | |

1822 1823 1824 1825 1835 1826

1802 1803 1804 1805 1806

FIRST HIERARCHICAL NET

FIG. 39A

COMPONENT INFORMATION

| COMPONENT NUMBER | COMPONENT NAME | COMPONENT TYPE | CAPACITY [μF] | INDUCTANCE [nH] | EFFECTIVE PIN COUNT [NUMBER OF PINS] | REPRESENTATIVE POINT COORDINATES | MINIMUM /MAXIMUM DOMAIN |
|---|---|---|---|---|---|---|---|
| IC1 | MN1 | IC | – | – | – | (64,11) | (56,10) · (72,30) |
| IC2 | MN2 | IC | – | – | – | (84,11) | (76,10) · (92,30) |
| ... | ... | ... | – | – | – | ... | ... |
| C1 | EC10 | CAPACITOR | 0.1 | 0.5 | 3 | (139,59) | (137,59) · (141,60) |
| C2 | EC20 | CAPACITOR | 0.1 | 0.5 | 3 | (150,59) | (148,59) · (152,60) |
| ... | ... | ... | ... | ... | ... | ... | ... |

FIG. 39B

PIN INFORAMTION

| COMPONENT NUMBER | PIN NUMBER | NET NAME | NET TYPE | FREQUENCY [MHz] | NECESSARY CAPACITY [μF] | REPRESENTATIVE POINT COORDINATES |
|---|---|---|---|---|---|---|
| IC1 | 1 | PWR1 | POWER | 100 | 0.03 | (69,29) |
|  | 2 | GND1 | GROUND | 100 | 0.05 | (69,11) |
|  | 3 | CLK | CLOCK | 100 | 0.01 | (59,11) |
|  | 4 | SIG1 | GENERAL | 100 | 0.01 | (59,29) |
|  | ... | ... | ... | ... | ... | ... |
| ... | ... | ... | ... | ... | ... | ... |
| C1 | 1 | PWR1 | POWER | – | – | (138,59) |
| C1 | 2 | GND1 | GROUND | – | – | (140,59) |
| C2 | 1 | PWR2 | POWER | – | – | (139,59) |
| C2 | 2 | GND2 | GROUND | – | – | (151,59) |
| ... | ... | ... | ... | ... | ... | ... |

FIG. 39C

NET INFORMATION

| NET NAME | COMPONENT NUMBER | PIN NUMBER |
|---|---|---|
| GND1 | IC1 | 2 |
|  | C1 | 2 |
|  | ... | ... |
| GND2 | C2 | 2 |
|  | ... | ... |
| PWR1 | IC1 | 1 |

FIG. 40

| GROUP NUMBER | IC | | BYPASS CAPACITOR | | EFFECTIVENESS |
| --- | --- | --- | --- | --- | --- |
| | COMPONENT NUMBER | PIN NUMBER | COMPONENT NUMBER | PIN NUMBER | |
| 1 | IC1 | 4 | C1 | 1 | 90 |
| 2 | IC2 | 1 | C2 | 1 | 70 |
| 3 | IC3 | 1 | C2 | 1 | 60 |
| 4 | IC4 | 8 | C3 | 1 | 50 |
| 5 | IC4 | 8 | C4 | 1 | 70 |
| ... | ... | ... | ... | ... | ... |

COMPUTER AIDED DESIGN APPARATUS FOR AIDING DESIGN OF A PRINTED WIRING BOARD TO EFFECTIVELY REDUCE NOISE

This is a divisional application of U.S. patent application Ser. No. 09/771,843, filed on Jan. 29, 2001 and issued as U.S Pat. No. 6,631,509 on Oct. 7, 2003.

BACKGROUND OF THE INVENTION (1) Field of the Invention

The present invention relates to a CAD (Computer Aided Design) apparatus for aiding design of a printed wiring board, and in particular to placing components to effectively reduce noise, and confirmation of the placement of the components.

(2) Description of the Related Art

In the design of wiring of printed wiring boards, it is imperative to take measures to suppress noise during operation. In particular, electronic circuits that operate with high frequency are prone to generate noise and it is important to take sufficient measures. Conventionally one measure against noise during operation is in the manner of placement of bypass capacitors on the board.

In particular, in printed wiring boards with high frequency signal wires, absorption of high frequency power ripple that happens at the rising edge of a high frequency signal, in other words supply of high frequency current to an IC, is mainly performed by a capacitor. Therefore, in order to reduce electromagnetic noise and improve quality of wiring boards, it is desirable to place the capacitor as close as possible to the IC power pin. This kind of technique is described in "Printed Circuit Board Techniques for EMI Compliance", Mark I Montrose, IEEE Order No. PC5595 and "HIGH-SPEED DIGITAL DESIGN A Handbook of Black Magic", Howard W. Johnson and Martin Graham, PTR Prentice-Hall.

Furthermore, conventionally in wiring board placement/ wiring CAD, small components such as capacitors, coils (inductors), resistors, filters etc are assigned to large components such as ICs and connectors according to conventional component types or the state of net connection. The components are placed by treating these sets of mutual components as one component, reducing the number of components to be considered on the wiring board overall. This kind of technique is described in "A Method of Suppressing EMI from Printed Circuit Boards by Automatic Placement, Based on Limited Length of Critical Notes", Shinichi Tanimoto et. al, Shingaku Giho, EMCJ99-92, pp. 17–22, 1999.

However, when components are assigned based on component type, there is no differentiation between capacitors with high capacity for supplying low frequency current such as electrolytic capacitors and tantalum capacitors, and low capacity ceramic capacitors for supplying high frequency current in relation to main, large components (ICs), but rather all are simply treated as capacitors. For this reason, as with capacitors C6 to C8 (that have a lower capacity than C1 to C3) in FIG. 1, the capacitors are assigned in clusters. Therefore the component assigning is not carried out appropriately, requiring the user to make revisions. Moreover, capacitors that supply higher frequency current should be placed closer to the IC power pin. However, it has become common recently for ICs to have a plurality of power pins, and also many pin pair combinations of IC power pins and power pins of pluralities of capacitors, making selecting and wiring suitable pin pairs difficult.

A CAD apparatus for confirming whether the placement of a bypass capacitor is appropriate is disclosed in Japanese laid-open patent application H10-07560 (Computer Aided Design System).

This CAD apparatus makes confirmation of the placement of bypass capacitors possible by displaying on the board the effective range for eliminating noise for each bypass capacitor.

FIG. 2 shows a display example of a wiring board being designed displayed on the monitor of the CAD apparatus disclosed in Japanese laid-open patent application H10-07560.

At this point, a bypass capacitor 2110, an IC 2120, and an IC 2130 have been placed on a wiring board 2101 shown in FIG. 2.

The effective range for eliminating noise with the bypass capacitor 2110 is shown by an ellipse 2141 and an ellipse 2142. Here, the ellipse 2141 shows the range in which noise elimination by the bypass capacitor 2110 is highly effective, while ellipse 2124 shows the range in which noise elimination by the bypass capacitor 2110 is moderately effective.

Designers, referring to these effective ranges for eliminating noise, can confirm the placement of bypass capacitors by judging whether each pin of the components placed on a wiring board is in an effective range for eliminating noise by a bypass capacitor.

Here, the 4 pins on the left side of the IC 2120 are within the ellipse 2141, therefore noise elimination is estimated to be highly effective. The 4 pins on the right side of the IC 2120 are within the ellipse 2142, therefore noise elimination is estimated to be moderately effective. None of the pins of IC 2130 is within either the ellipse 2141 or the ellipse 2142, therefore noise elimination is estimated to be less than moderately effective.

However, in a display such as the above, as the number of bypass capacitors placed on a wiring board increases, the number of ellipses also increases. As a result, the ellipses overlap and the display becomes extremely difficult to see when the number of bypass condensers exceeds a certain level.

Furthermore, because each pin of a component has different operating characteristics, such as operation frequency, there are cases in which each pin conforms to a different bypass capacitor. In such cases, in a display such as the above-described, it is difficult to know which bypass capacitor is effective with which pin of which component, possibly resulting in errors in judgement.

In addition, capacitors have capacities, so even if the characteristics match, if the capacity is insufficient the noise elimination effect will be inadequate. However, in a display such as above, the capacity of bypass capacitors is not considered so it is difficult to detect if the capacity is insufficient.

Moreover, a judgement method using a display such as the above-described is inaccurate because the effectiveness of a bypass capacitor is judged by the linear distance on the surface between the bypass capacitor and a pin on the board. The reason for this inaccuracy is that the effectiveness of a bypass capacitor is not determined by the linear distance on a surface, but rather depends on the length of the path determined by the wiring pattern along which the harmonic content of the transient current flows.

SUMMARY OF THE INVENTION

It is a first objective of the present invention to provide a CAD apparatus for performing component placement to effectively reduce electromagnetic radiation noise.

It is a second objective of the present invention to provide a CAD apparatus for easily confirming whether bypass capacitor placement is suitable.

A CAD apparatus that achieves the above-described first objective includes a determining unit for determining a component order in an ascending order of impedance of passive components amongst components to be placed on the printed wiring board, and placement unit for placing the passive components in the determined component order.

According to this construction, the passive components are placed in ascending order of impedance. The lower the impedance of a component, the higher the component reduces high frequency noise, so passive components are placed in order from high frequency noise to low frequency noise. The earlier a component is placed, the greater freedom there is in placement, therefore, the higher the frequency of the noise, the more effectively a passive component can be placed to reduce the noise.

Here, the placement unit places each of the passive components in a vicinity of a power pin of a non-passive component which is already placed.

According to this structure, high frequency noise in power pins that is caused by current can be effectively reduced.

Here, the determining unit may determine the component order using an ascending order of equivalent series inductance of the passive components as the ascending order of impedance.

According to this construction, the equivalent series inductance is used instead of the impedance of passive components, so that different types of passive components can be treated in the same way.

Here, the determining unit may include a table unit for retaining a plurality of pin spacings of passive components and an inductance value corresponding to each pin spacing, a referring unit for referring to the equivalent series inductance corresponding to the pin spacing of each passive component retained in the table unit, and a sorting unit for sorting the inductance value referred for each passive component in ascending order, and making the ascending order of inductance value the component order.

According to this construction, the conversion unit utilizes the property that the lower the pin spacing is, the lower the equivalent series inductance is, and converts the pin spacing to the equivalent series inductance by referring to the table unit. Therefore, if the pin spacing of passive components is known, a component order can be easily determined for different types of passive components, even if the electrical characteristics of the components are not known.

Here, the determining unit may determine the component order using a descending order of effective frequency spectrum as the ascending order of impedance, the effective frequency spectrum being a frequency spectrum in which the impedance of a passive component is no greater than a threshold value.

According to this construction, the component order is determined in descending order of frequency at which passive components are effective against noise. Therefore, the passive components can be placed effectively in descending order of high frequency because the component order is the descending order of effectiveness.

Here, the determining unit may include a table unit for retaining a plurality of pin spacings of passive components, and an effective frequency spectrum corresponding to each pin spacing, a referring unit for referring each the effective frequency spectrum corresponding to the pin spacing of each passive component retained in the table unit, and an sorting unit for sorting the effective frequency spectrum referred for each component in descending order, and making the descending order of effective frequency spectrum the component order.

According to this construction, the conversion unit converts the pin spacing to the effective frequency spectrum by referring to the table unit. Therefore, if the pin spacing of passive components is known, a component order can be easily determined for different types of passive components, even if the electrical characteristics of the components are not known.

Here the determining unit may include a calculation unit for calculating the effective frequency spectrum for each passive component from at least one of a capacitance and an inductance of the passive component, and an sorting unit for sorting the effective frequency spectrum calculated for each component in descending order, and making the descending order of effective frequency spectrum the component order.

According to this construction, the effective frequency for each component is directly converted from the capacitance and the inductance, therefore the component order can be determined accurately in descending order of effective frequency spectrum.

Here, the calculation unit may calculate the effective frequency spectrum using at least the inductance of a passive component, when the passive component is one of a capacitor, a resistor, and a filter.

According to this construction, even when a passive component is one of a capacitor, a resistor, and a filter, it is possible to calculate the effective frequency spectrum from the inductance, therefore the component order can be determined accurately in descending order of effective frequency spectrum.

Here, the passive components may be capacitors, and the determining unit may determine the component order using an ascending order of the equivalent series inductance of the capacitors as the ascending order of impedance.

According to this construction, components are placed in a component priority order which uses the ascending order of equivalent series inductance of capacitors, in other words the descending order of frequency effective in noise reduction, as the component order. Therefore, design of a wiring board having good noise characteristics can be performed effectively.

Here, the determining may determine the component order using an ascending order of capacity of the capacitors as the ascending order of equivalent series inductance.

According to this construction, the property that the lower the capacity of a capacitor is, the lower the equivalent series inductance is, is utilized. Therefore, the component order can be determined easily.

Here, the determining unit may determine the component order considering an ascending order of terminal spacing of the capacitors to be the ascending order of equivalent series inductance.

According to this construction, the property that the smaller the terminal spacing of a capacitor is, the lower the equivalent series inductance is, is utilized. Therefore, the component order can be determined easily.

Here, the determining unit may include a table unit for retaining a plurality of pin spacings of capacitors, and an equivalent series inductance corresponding to each pin spacing, referring unit for referring to each the effective frequency spectrum corresponding to the pin spacing of each capacitor retained in the table unit, and an sorting unit for sorting the equivalent series inductance referred for each component in descending order, and making the sorted equivalent series inductances the component order.

According to this construction, the conversion unit converts the pin spacing to an effective frequency spectrum by referring to the table unit, therefore, if the pin spacing is known the effective frequency spectrum of capacitors can easily be converted.

Here, the passive components may be capacitors, and the determining unit may determine the component order using a descending order of effective frequency spectrum, the effective frequency spectrum being a frequency spectrum in which the impedance of a capacitor is no greater than a threshold value, instead of the ascending order of impedance.

According to this construction, the component order of capacitors is determined in descending order of frequency in which a capacitor is effective in noise reduction. Therefore, appropriate capacitors can be placed in order from high frequency noise to low frequency noise.

Here the CAD apparatus may further include a pin order determining unit for setting a pin order for each power pin of non-passive components in order of seriousness of noise that can occur in a current that flows through the power pin, and an assigning unit for assigning each passive component to a component which has a power pin, in descending pin order and descending component order, and the placement unit may each passive component in a vicinity of the power pin of the component to which the passive component is assigned, in the descending order of component order.

According to this construction, the assigning unit assigns pins in descending order of pin priority to passive components is descending priority order, therefore the placement unit places passive components in descending order with power pins in descending order of seriousness of noise that can occur, therefore component placement with good noise characteristics can be performed.

Here, the pin order determining unit may determine the pin order using a descending order of a signal frequency which is driven by a current which flows through the power pin, as the order of seriousness.

According to this construction, components having low impedance can be placed with power pins which are the source of high frequency noise.

Here, the pin order determining unit may determine the pin order using an order of shortness of one of a rising time and a falling time of a signal which is driven by a current which flows through the power pin, instead of the order of seriousness.

Here, the pin order determining unit may determine the pin order using an ascending order of shortness of the shorter of a rising time and a falling time of a signal which is driven by a current which flows through the power pin, as the order of seriousness.

According to this construction, the pin order of can be determined for power pins having noise which results from current which flows through the power pins in order of the seriousness of the noise.

Here, the pin order determining unit may determine the pin order using a descending order of an amount of consumed current of a signal which is driven by a current which flows through the power pin, as the order of seriousness.

According to this construction, the pin order can be determined using the property that the greater the amount of current a power pin consumes, the more serious noise caused by the pin is.

Here, the pin order determining unit may calculate a voltage waveform of a signal which is driven by the current which flows through the power pin, based on a voltage, a frequency, a rising time, a falling time, and a duty ratio of the signal and sets the pin order using a descending order of a maximum frequency of a voltage that exceeds a voltage threshold in the voltage waveform, as the order of seriousness.

According to this construction, the pin order determining unit can determine the pin order making the descending order of maximum frequency obtained from the waveform of the signal driven by the current which flows through the power pin, the order of seriousness.

Here, the pin order setting unit may determine the pin priority order of power pins connected to a net, for each net, and the assigning unit may assign components to be connected to a net to one net.

According to this construction, power nets are made independent, and passive components can be assigned to noise-causing power pins.

Furthermore, the CAD apparatus of the present invention is a CAD apparatus for a printed wiring board for placing a component belonging to a second type of components in a vicinity of a component belonging to a first type of components, including a first determining unit for determining a pin order in order of seriousness of noise that can occur in a current that flows through a power pin, for a power pin of each of the components belonging to the first type of components, a second determining unit for determining a component order in ascending order of impedance for each component belonging to the second type of components, and an assigning unit for assigning a second type component which is highest amongst the components in the component order that are not assigned, to a first type component having a power pin which is highest amongst the power pins in the pin priority that are not assigned. The first type of components includes active components, and the second type of components is passive components. The CAD apparatus of the present invention further includes a placement unit for placing each second type component in a vicinity of a first type component having the power pin to which the second type component is assigned, in the component order. The CAD apparatus of he present invention further includes a storage unit for storing sets of net information, each set of net information showing a net made up of a plurality of pins to be connected, a dividing unit for dividing, based one set of net information, a net whose power pins are to be connected into section nets, each section net corresponding to a component group made up of one first type component and at least one second type component assigned thereto, a selection unit for selecting, for each section net, a power pin of a component whose impedance is highest, from amongst the second type components connected to the section net, as a representative pin, and a wiring unit for wiring each section net independently, and for wiring so that a plurality of the representative pins are connected.

According to this construction, each power net is divided into section nets, and a net made up of representative pins connecting the plurality of section nets is wired independently. Therefore, the propagation of noise between section nets can be reduced.

A CAD apparatus that achieves the second object of the present invention is a CAD apparatus for displaying at least one component placement on a wiring board, and aiding an evaluation by a user of whether a placement of a position dependent component, whose effectiveness differs according to a placement position, is appropriate, the CAD apparatus including a design information storage unit for storing sets of position information which show the position of each component on the wiring board, a relationship information storage unit for storing sets of relationship information of the placement dependent component in relation with an effected component which is effected by the placement dependent component, and a display unit for displaying, according to one set of placement information, the position dependent component and the effected component which is in relation therewith in the relationship information in correspondence, in a user-recognizable state.

According to this construction, corresponding effected components and position dependent components can be displayed in correspondence. Therefore, the user can easily evaluate whether a placement of a position dependent component is appropriate.

Here, the display unit may display the related position dependent component and the effected component in correspondence by linking the components by a line.

Here, the display unit may link one of a pin of the position dependent component and a main body of the position dependent component with one of a pin of the effected component and a main body of the effected component, by a line.

According to this construction, corresponding effected components and position dependent components can be displayed linked by a line. Therefore, the user can easily evaluate whether a placement of a position dependent component is appropriate without the display becoming difficult to distinguish even when the number of effected components and position dependent components increases.

Here, the relationship information storage unit may further store an effectiveness showing a degree of an effect, and the display unit may further display the effectiveness stored by the relationship information storage unit in a user-recognizable state.

According to this construction, the effectiveness can be recognized by the user, therefore the user can take effectiveness into consideration when evaluating whether the placement of position dependent components is appropriate.

Here, the display unit may link the related position dependent component and the effected component in a display state which differs according to a degree of effectiveness.

According to this construction, different effectiveness' can be displayed by different lines. Therefore, the user can easily evaluate whether a placement of a position dependent component is appropriate without the display becoming difficult to distinguish even when the number of effected components and position dependent components increases.

Here, the display unit may distinguish the degree of effectiveness by one of a line thickness, a line shape, a line color, a line shade, and a line pattern.

According to this construction, different effectiveness' can be displayed distinguished by different line thickness', line shape, line color, line shade, or line pattern.

Here, the CAD apparatus may further include a retrieval unit for retrieving, based on the sets of position information stored by the position information storage unit, the position dependent component and the effected component effected by the position dependent component; and the relationship information storage unit may store the retrieved position dependent component and the retrieved effected component in relation.

According to this construction, a position dependent component and the effected component that is effected thereby can be retrieved form the design information.

Here, the retrieval unit may retrieve a position dependent component and an effected component which are within a predetermined distance of each other.

According to this, a position dependent component and effected components within a predetermined distance of a placement dependent component can be stored in relation with the placement dependent component.

Here, the retrieval unit may retrieve, for each position dependent component, a predetermined number of effected components which are in a predetermined ascending order of closeness to the relevant effected component.

According to this, a predetermined number of effected components which are within a predetermined distance of a placement dependent component can be stored in relation with the placement dependent component in order, for each placement dependent component.

Here, the retrieval unit may further set an effectiveness which shows a degree of effectiveness according to the distance or the order.

According to this, effectiveness can be set according to distance or order, therefore precise relationship information taking effectiveness into consideration can be produced.

Here, the position dependent component may be a capacitor, the effected component may be a switching element on which a noise elimination effect is potentially had by a capacitor, and the retrieval unit may further retrieve within a range in which a capacity that is required by a switching element for noise reduction does not exceed a capacity of the capacitor.

According to this construction, a switching element within a range that does not exceed the capacity of a capacitor can be put in relation with the capacitor.

Here, the retrieval unit may further retrieve within a range in which a total value of capacities which a plurality of switching elements require for noise reduction does not exceed the capacity of the capacitor.

According to this construction, a plurality switching elements within a range that does not exceed the capacity of a capacitor can be put in relation with the capacitor.

Here, the retrieval unit may further retrieve within a range in which an amended value, which is a total value of capacities required by a plurality of switching elements for noise reduction multiplied by a ratio of the plurality of switching elements being switched simultaneously, does not exceed the capacity of the capacitor.

According to this construction, a plurality of switching elements made up of a greater number of switching elements can be put into relation with a capacitor more accurately.

Here, the retrieval unit may further retrieve only when a frequency characteristic of the position dependent component and a frequency characteristic of the effected component match.

According to this construction, more accurate relationship information can be produced by taking frequency characteristics into account.

Here, a distance used in the retrieval unit may be one of a straight line distance, a Manhattan distance, an actual wiring distance, and a path distance in which a loop area is a minimum.

According to this construction, one of straight line distance, Manhattan distance, actual wiring distance, and path distance in which loop area is a minimum may be selected according to the wiring state.

Here, the CAD apparatus may further include an extraction unit for extracting, from amongst the effected components or the pins of the relevant effected components stored in the position information storage unit, an effected component or a pin thereof that is not in relation with a position dependent component or a pin thereof in the sets of relationship information stored by the relationship information storage unit, and a display unit for displaying the effected component or the pin thereof extracted by the extraction unit, in a user-recognizable state.

According to this construction, an effected component or a pin of an effected component that is not related to any position dependent component can be displayed. Therefore, leaks in placement of position dependent components can be detected easily.

Here, the CAD apparatus may further include an extraction unit for extracting, from amongst the position dependent components or the pins of the relevant position dependent components stored in the position information storage unit, a position dependent component or a pin of an position dependent component that is not relation with an effected component or a pin of an effected component in the sets of relationship information stored by the relationship information storage unit, and a display unit for displaying the position dependent component or the pin of the position dependent component extracted by the extraction unit, in a user-recognizable state.

According to this construction, an effected component or a pin of an effected component that is not related to any position dependent component can be displayed. Therefore, leaks in placement of position dependent components can be detected easily.

Furthermore, a program which implements each of the above-described units on a computer is a program which realizes the above-described first and second objectives.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings:

FIG. 5 shows an example of the component information list 1201;

FIG. 6 shows an example of the component master information list 1301;

FIG. 7 shows an example of the net information list 1401;

FIG. 8 shows an example of the pin information list 1501;

FIG. 9 shows an example of the effective frequency list 1601;

FIG. 10 shows an example of the component shape information list 1701;

FIG. 36 is a diagram showing an example of the hierarchical net information list 1801 stored in the design information storage unit 1108 of the CAD apparatus 5000;

FIG. 39A is a diagram showing an example of the component information included in the design information;

FIG. 39B is a diagram showing an example of the pin information included in the design information;

FIG. 39C is a diagram showing an example of the net information included in the design information;

FIG. 40 is a diagram showing an example of the group information made by the bypass capacitor grouping unit 14 and stored in the bypass capacitor group information storage unit 15;

DESCRIPTION OF THE PREFERRED EMBODIMENT

First Embodiment

<Outline>

The CAD apparatus of the present embodiment is an apparatus for aiding the design of a printing wiring board and is constructed to set an order of priority for components (hereafter "component priority order") which shows a placement order of specified types of components, and place the components following the component priority order. Here, specified types of components are those that are noise-countering components; passive components that reduce noise in a printed wiring board such as capacitors, resistors, inductors, and filters.

The present CAD apparatus sets the component priority order in ascending order of impedance, in particular the apparatus sets the component priority order in ascending order of impedance against high frequency signals. In detail, the lower the inductance (also called ESL: Equivalent Series Inductance) a component has (or can be regarded as having), the higher the component priority order given. This component priority order is the placement order, so components are placed on a printed wiring board in descending order of component priority. In this case, the higher in the priority order a component is, the greater freedom of placement, in other words the empty spaces where components have not been placed are larger, so that the component is placed in an optimum position near a power pin. As a result, the lower the ESL of a component, the lower the impedance value against high frequency noise, so that the more a component reduces high frequency noise, the closer the present CAD apparatus is able to place the component to a power pin.

<Construction>

Figure 3:
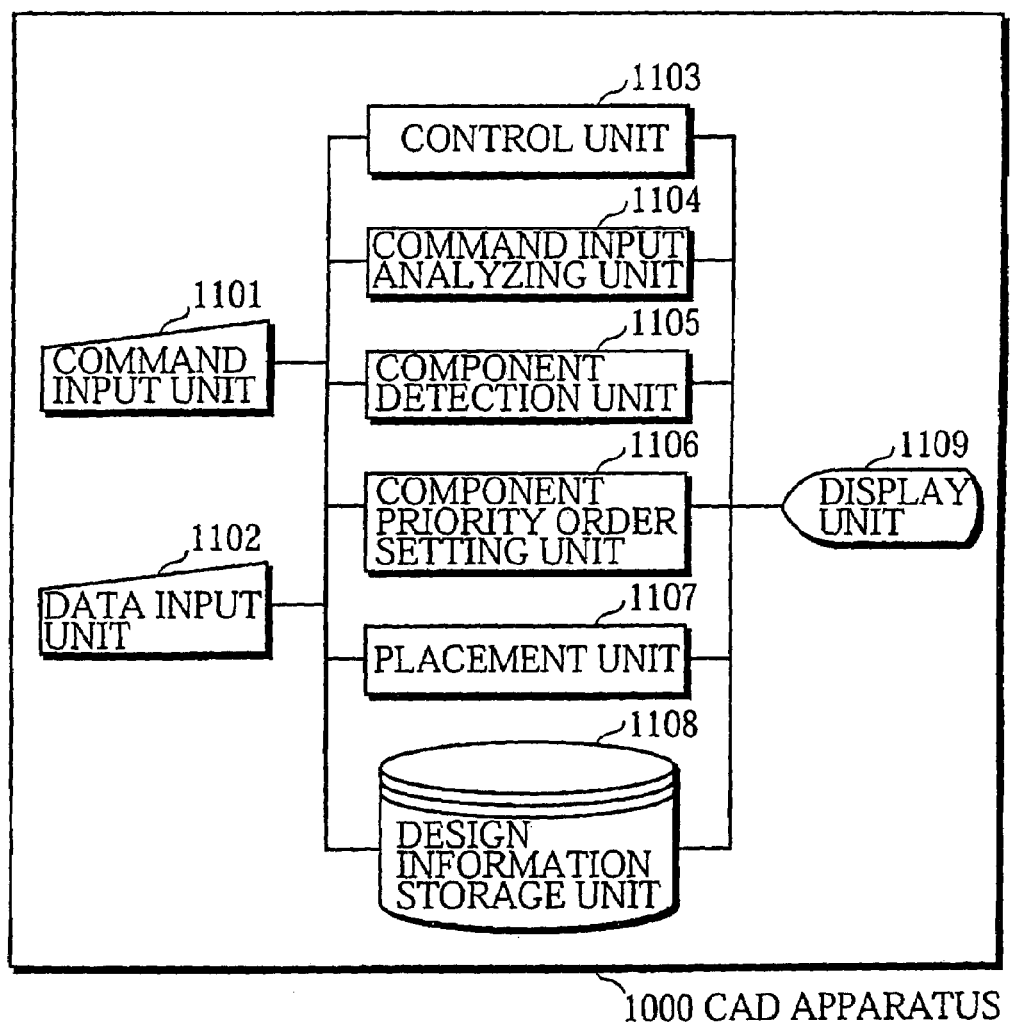
FIG. 3 is a block diagram showing the construction of the CAD apparatus 1000 of the first embodiment of the present invention.
Figure 4:
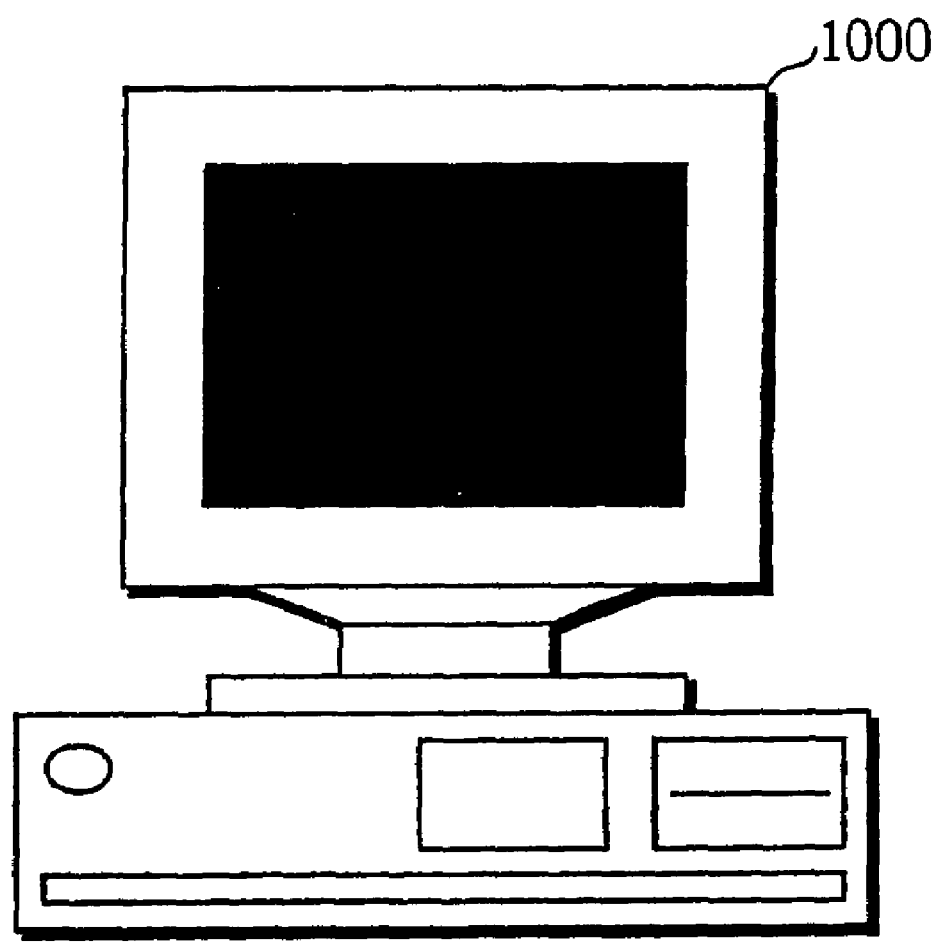
FIG. 4 is an external view of a CAD apparatus.

FIG. 3 is a block diagram showing the construction of a CAD apparatus 1000 of a first embodiment of the present invention. The CAD apparatus 1000 is realized by executing software that implements the functions shown in each of the blocks shown in FIG. 3, on computer hardware such as a work station shown in FIG. 4. This computer hardware includes a microprocessor, a RAM, a ROM, a hard disk apparatus, a display apparatus, a keyboard, and a mouse.

The CAD apparatus 1000 in FIG. 3 includes a command input unit 1101, a data input unit 1102, a command input analyzing unit 1104, a control unit 1103, a component detection unit 1105, a component priority order setting unit 1106, a placement unit 1107, a design information storage unit 1108, and a display unit 1109. For convenience, these units will be explained in the following order: 1101, 1102, 1109, 1104, 1103, 1108, 1105, 1106, 1107.

The command input unit 1101 receives various commands through user operations of the keyboard, mouse and so on.

The data input unit 1102 receives inputs of circuit diagram information made by a circuit diagram design CAD apparatus (not shown). The received circuit diagram information is stored in the design information storage unit 1108 as design information.

The display unit 1109 displays placement diagrams of components on a printed wiring board, wiring diagrams, and user operation input boxes, according to the design process of the printed wiring board.

The command input analyzing unit 1104 analyzes a command received by the command input unit 1101, judges the type of command, and outputs commands to each unit of the CAD apparatus according to the judged type of command. The types of commands include circuit diagram information input commands, placement commands for instructing the placement of a component on a printed wiring board, and wiring commands for wiring between placed components.

In the present embodiment there is considered to be two types of placement commands: a first placement command and a second placement command. The first placement command instructs the placement of large components (active components such as ICs, and connectors). The second placement command instructs the placement of small components (passive components such as capacitors, inductors, resistors etc.). The second placement command is inputted into the command input unit 1101 after the first placement command.

The control unit 1103 controls the command input unit 1101, the data input unit 1102, the command input analyzing unit 1104, and the CAD apparatus 1000 overall. In particular, the control unit 1103, when it receives a second placement command from the command input analyzing unit 1104, activates the component detection unit 1105 and the component priority order setting unit 1106 in the stated order. According to this, the component priority order setting unit 1106 to set the above-described component priority order of the specified types of components. In addition, the control unit 1103 selects components following the component priority order, and has the placement unit 1107 place the selected components.

The design information storage unit 1108 stores design information about the printed wiring board being made, based on circuit diagram information received by the data input unit 1102. The design information includes (1) a component information list, (2) a component master information list 1301, (3) an effective frequency spectrum list, and (4) a component shape information list 1701.

(1) Component Information List

The component information list is made up of information about the placement of each component forming a circuit shown in the circuit information.

FIG. 5 shows a specific example of the component information list. In FIG. 5 the columns of the component information list 1201 include, for each component: a component number 1202, a component name 1203, a component shape 1204, a component placement surface 1205, basic coordinates 1206, a priority order 1207, a main component number 1208, an auxiliary component number 1209, and a component group 1210. The rows of the component information list 1201 show information about each component.

Of the component information, the component number 1202, the component name 1203, and the component shape 1204 are set directly in the component information list 1201 from circuit information received by the data input unit 1102. The remaining component information is set successively according to the design steps of the CAD apparatus 1000. In the present embodiment the main component number 1208, the auxiliary component number 1209, and the component group name 1210 are considered to be inputted from the command input unit 1101 by the user. The component group name 1210 does not have to be set.

The component number 1202 shows a number for identifying each component in the circuit.

The component name 1203 shows a name for identifying the component master information corresponding with each component.

The component shape 1204 is an identifier that identifies the shape of a component.

The placement surface 1205 is an identifier that identifies the surface of a printed wiring board on which a component is placed. One placement surface of the printed wiring board is called an A side, and the other a B side.

The basic coordinates 1206 show the (X,Y) coordinates of where a component is placed.

The priority order 1207 is a number showing a priority order for component placement. The priority order 1207 is not necessarily set for all components, but is set by the component priority order setting unit 1106 for noise-countering components.

The main component number 1208 shows the number of the corresponding main component when a component is an auxiliary component. Here, components such as ICs and connectors are called main components, and components such as capacitors, inductors, resisters, and filters are called auxiliary components. The terms main component and auxiliary component are used in order to differentiate components that preferably should be placed as close as possible to each other on a printed board. Main components refer to components that are a source of noise generation and require measures to be taken against this noise. Auxiliary components refer to components that are noise-countering components. The placement unit 1107 places main components before auxiliary components, and then places auxiliary components as close as possible to main components.

The auxiliary component number 1209 shows the component number of an auxiliary component assigned to a relevant component (main component). In the present embodiment, an auxiliary component is assigned to a main component by the user. In other words, it is assumed that the user sets the main component number 1208 and the auxiliary component number 1209.

The component group 1210 shows an identifier that identifies the group to which a relevant component belongs. In the present embodiment it is not necessary to set the component group number 1210.

Please note that in the list "-" shows that a category has not been set.

(2) Component Master List

The component master information list is a list made up of component master information showing the properties of each component.

FIG. 6 shows a specific example of a component master information list 1301. In FIG. 6 the master information list 1301 includes a column for each of a component name 1302, a component type 1303, a pin count 1304, an L value 1305, a C value 1306, an R value 1307, an internal clock-power net name 1308, an effective frequency MIN 1309, and an effective frequency MAX 1310. In the present embodiment, the columns 1307 to 1310 do not necessarily have to be set.

Each line in the component master list 1310 shows the master information for one component.

The component name 1302 shows an identifier that identifies a component name.

The component type 1303 shows an identifier that identifies the type of a component. The component types include IC (integrated circuit), C (capacitor), R (resistor), L (inductor), and CN (connector).

The pin count 1304 shows the number of pins which a component has.

The L value 1305, the C value 1306, and the R value 1307 show respectively an inductance value, a capacity value, and a resistance value of a component. These values are set according to component type.

The internal clock-power net name 1308 shows the internal clock of a component and the name of the power net that the internal clock uses. Not all components necessarily have an internal clock power net name. For example, "33 MHz-vcc2" shows that the internal clock frequency is 33 MHz, and the name of the power net for the internal clock is vcc2.

The effective frequency MIN 1309 and the effective frequency MAX 1310 show the minimum frequency and the maximum frequency respectively for a relevant component to operate effectively.

(3) Effective Frequency Spectrum List

The effective frequency spectrum list is a list for storing information such as an equivalent series inductance (ESL) value and an effective frequency spectrum of passive elements such as capacitors and resistors. The effective frequency spectrum list is a list for converting pin spacing of noise-countering components, other than inductors, into an equivalent series inductance and an effective frequency spectrum.

FIG. 9 shows a specific example of an effective frequency spectrum list. In FIG. 9 the effective frequency spectrum list 1601 includes columns for each of a pin spacing 1602, an inductance value 1603, and an effective frequency spectrum 1604. Each line in the effective frequency spectrum list 1601 shows one set of effective frequency spectrum information.

The pin spacing 1602 shows the distance between the first pin and the second pin in passive components such as capacitors, resistors, and inductors. In a case such as a component of resistor array, in components such as three terminal filters, the spacing of a first pin and a second pin connected inside the component shows the spacing of a first pin and a second pin other than a ground pin.

The inductance value 1603 shows the equivalent series inductance (ESL) corresponding to the pin spacing 1602. For capacitors and resistors (not including inductors) it is thought that the shorter the pin spacing is, the lower the ESL.

The effective frequency spectrum 1604 shows the effective frequency spectrum corresponding to the pin spacing 1602. It is thought that the lower the ESL is, the higher the effective frequency spectrum. The lower the impedance by the ESL, the lower the impedance value, and the higher the effective frequency spectrum.

The impedance value 1603 and the effective frequency spectrum 1604 value are set in advance by the user. These values may be values discovered by the user through experiment or experience.

(4) Component Shape Information List 1701

The component shape list is a list of component shape information showing the shape of each component.

FIG. 10 shows a specific example of a component shape list. In FIG. 10 the component shape list 1701 includes columns for each of a component shape 1702, a minimum/maximum area 1703, a pin number 1704, pin coordinates 1705, and a pin spacing 1706.

The component shape 1702 shows an identifier that identifies a component shape.

The minimum/maximum area 1703 is a set of coordinates showing the outward form of a component; a set of top left coordinates and bottom right coordinates. In FIG. 10 the top left coordinate is the relative coordinates (0,0). The coordinates are (X,Y) coordinates.

The pin coordinates 1705 show, for each pin shown by a pin number 1704, the relative coordinates of pins of a component whose basic coordinates 1206 are, shown in the component information.

The pin spacing 1706 shows the distance between the basic coordinates of the first pin and the second pin of a component.

In FIG. 3, the component detection unit 1105, under the control of the control unit 1103, retrieves the component information, the component master information, and the component shape information for each component from the component information list 1201, the component master list 1301, and the component shape list 1701 stored in the design information storage unit 1108. The component detection unit 1105 passes this information to the component priority order setting unit 1106 and the placement unit 1107. In addition, the component detection unit 1105 stores the type (the above-described specified types) of components for which the component priority order is to be set. In the present embodiment, the stored specified types are set by the user as one of (A) capacitors, (B) capacitors and inductors, and (C) capacitors, inductors, and resistors.

The component priority order setting unit 1106 refers to the information retrieved by the component detection unit 1105 and sets the component priority order information in the component information of the above-described specified component types. At this point, processing for setting the component priority order varies somewhat depending on whether the specified types stored in the component detection unit 1105 are the above-described (A), (B), or (C).

Namely, when the specified types stored in the component detection unit 1105 are (A) capacitors, the component priority order setting unit 1106 sets the component priority order in ascending order of capacity. Here, the component priority order unit 1106 considers components with lower capacity to have lower ESL. Furthermore, when the specified types are (B) capacitors and inductors, the component priority order setting unit 1106 converts the pin spacing of specified components to ESL values, in accordance with the effective frequency spectrum information list 1601 in FIG. 9. The component priority order is set in ascending order of these ESL values. When the specified types are (C) capacitors, inductors, and resistors, the component priority order setting unit 1106 converts the pin spacing of the specified types of components to an effective frequency spectrum, in accordance with the effective frequency spectrum information list 1601 in FIG. 9. The component priority order is set in descending order of effective frequency spectrum.

The placement unit 1107 receives component numbers 1230 from the control unit 1103, places components, and ends the process. Ordinarily, a component for which the component priority order has been set is given a main component number. When a component has a main component number, the placement unit 1107 places the relevant component as close as possible to the main component number.

<Component Priority Order Setting Unit 1106>

The processing performed by the component priority order setting unit 1106 to set the component priority order will be explained in each instance of the specified types stored in the component detection unit 1105; (A) capacitors, (B) capacitors, and inductors, and (C) capacitors, inductors, and resistors, will be explained.

(A)

Figure 11:
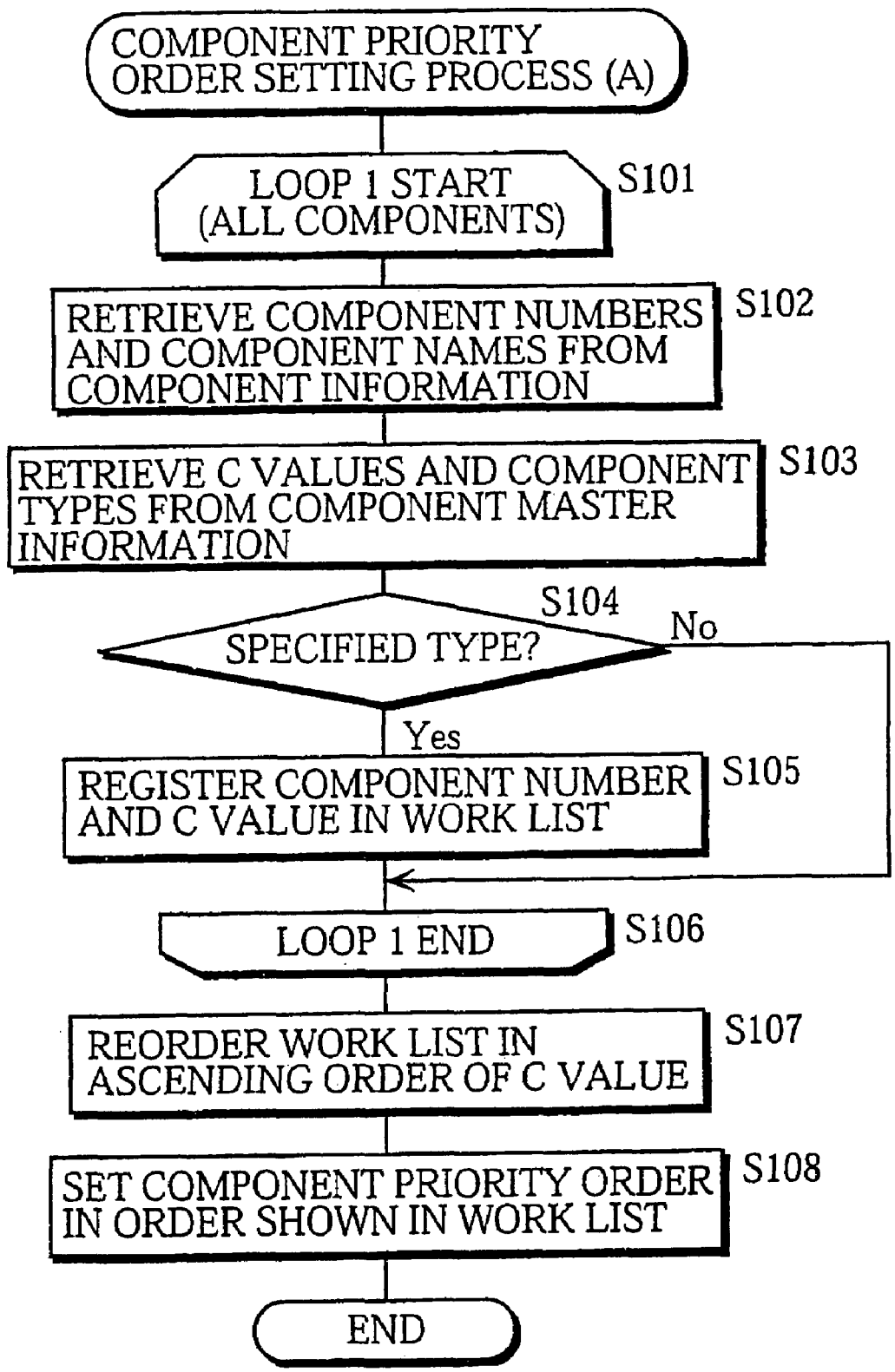
FIG. 11 is a flowchart showing details of the component priority order setting process (A) in the component priority setting unit 1106.

FIG. 11 is a flowchart showing the details of the component priority order setting process (A) in the component priority order setting unit 1106.

In FIG. 11, the component priority order setting unit 1106 performs process loop 1 (S101 to S106) on all the component information (see FIG. 5) retrieved by the component detection unit 1105. Namely, the component priority order setting unit 1106 retrieves the component number and the component name of one component from the component information (S102). Then the component priority order setting unit 1106 retrieves the C value and the component type corresponding to the retrieved component name from the component master information (see FIG. 6) (S103). When the component type is the specified type stored in the component detection unit 1105 (here capacitors) (S104:Yes), the component priority order setting unit 1106 registers the component number and the C value in a work area in a memory (not shown)(S105).

By repeating the process from S102 to S105 for each component, after the loop 1 process is completed, a work list retains the sets of component number and C value for all specified components in the order registered in the loop 1 process.

Furthermore, the component priority order setting unit 1106 reorders the sets in the work list in ascending order of C value (S107). After rearranging the sets, the component priority order setting unit 1106 sets the component priority order in the same order in the component information list 1201 (S108). As a result, the capacitors in the component information list 1201 are set in a component priority order of ascending order of C value.

Please note that in FIG. 11 the ascending order of C value is treated as the ascending order of ESL, but the pin spacing of capacitor pins may be substituted for the C value. In other words, the ascending order of pin spacing may be considered to be the ascending order of ESL, because generally the smaller the pin spacing, the lower the ESL. In this case at the above-described step S103, instead of the C value, the pin spacing may be retrieved from the component shape information list 1701. As a result, the work list retains the rearranged above-described sets in ascending order of pin spacing, and the component priority order is set in ascending order of pin spacing.

(B)

Figure 12:
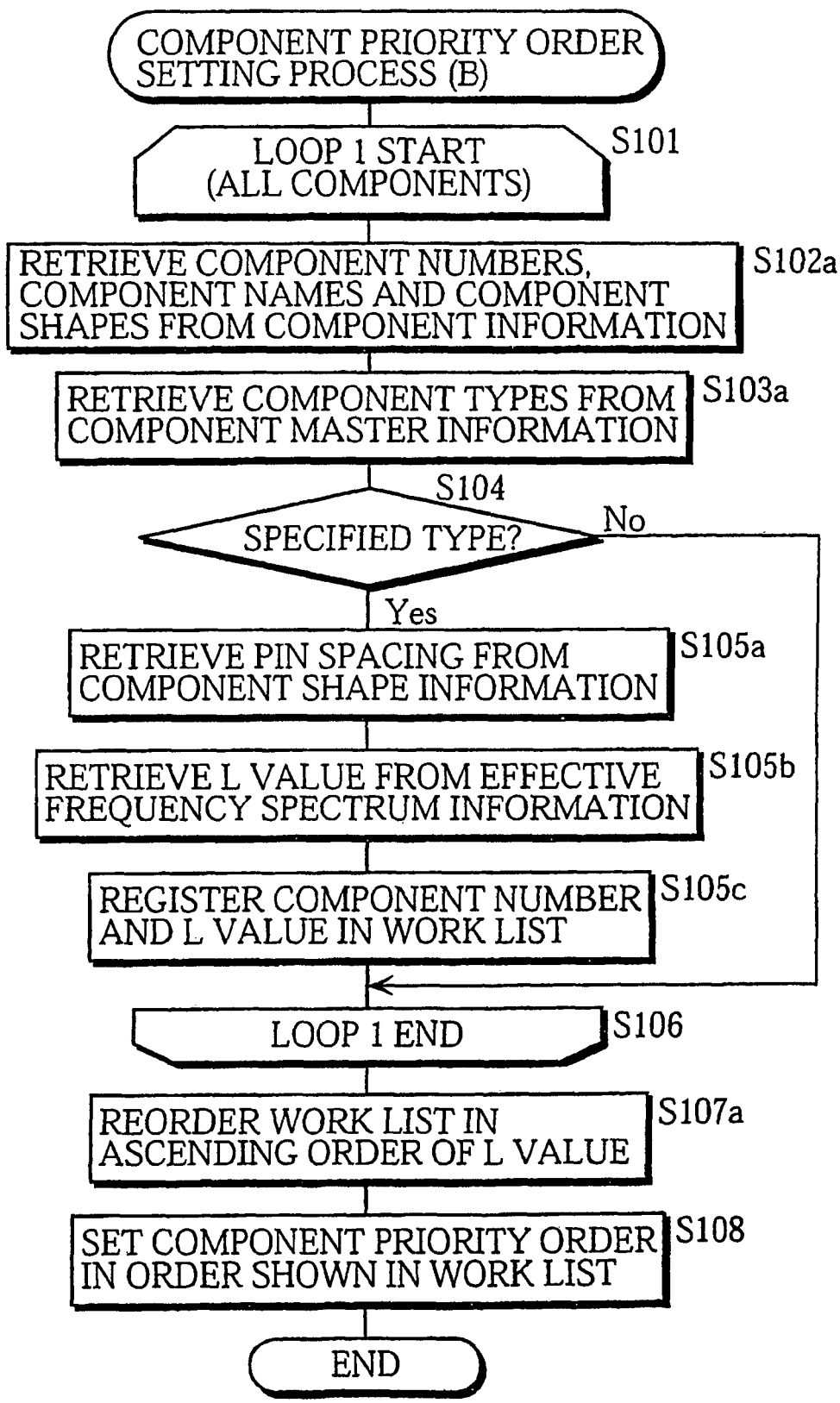
FIG. 12 is a flowchart showing details of the component priority order setting process (B) in the component priority setting unit 1106.

FIG. 12 is a flowchart showing the details of the component priority order setting process (B) in the component priority order setting unit 1106. Steps in FIG. 12 which are common to the flowchart in FIG. 11 are numbered in the same way as FIG. 11. The following primarily explains the different steps, omitting the common steps.

The flowchart in FIG. 12 has steps S102a, S103a, S105a to S105c, and S107a instead of steps S102, S103, S105, and S107 in FIG. 11. The specified types stored in the component detection unit 1105 are the above-described (B).

At step S102a and step S103a the component priority order setting unit 1106, in addition to the processing at S102, also retrieves the component shape identifier from the component shape 1204 column. (FIG. 5). However, the component priority order setting unit 1106 does not read the C value at S103 in the case of (B).

After a component is judged to be of the specified type at S104, the component priority order setting unit 1106 retrieves the pin spacing from the component shape information (see FIG. 10) corresponding to the component shape identifier retrieved at S102a (S105a). Then the component priority order setting unit 1106 retrieves the inductance value corresponding to the pin from the effective frequency spectrum information list 1601 (S105b), and registers the component number and the inductance value in the work list (S105c).

By repeating the process from S102a to S105c for each set of component information, after the loop 1 is completed, the work list retains the sets of component name and inductance value for all the specified components in the order registered in the loop 1 process.

Furthermore, at step S107a the component priority order setting unit 1106 reorders the sets in the task list in ascending order of inductance value.

As a result, the component priority order of the capacitors and inductors in the component information list 1201 is set in ascending order of ESL value.

Please note that at S105b the L value may be retrieved from the master information list 1301, rather than the inductance value being retrieved from the effective frequency spectrum list 1601.

(C) Capacitors, Inductors, and Resistors

Figure 13:
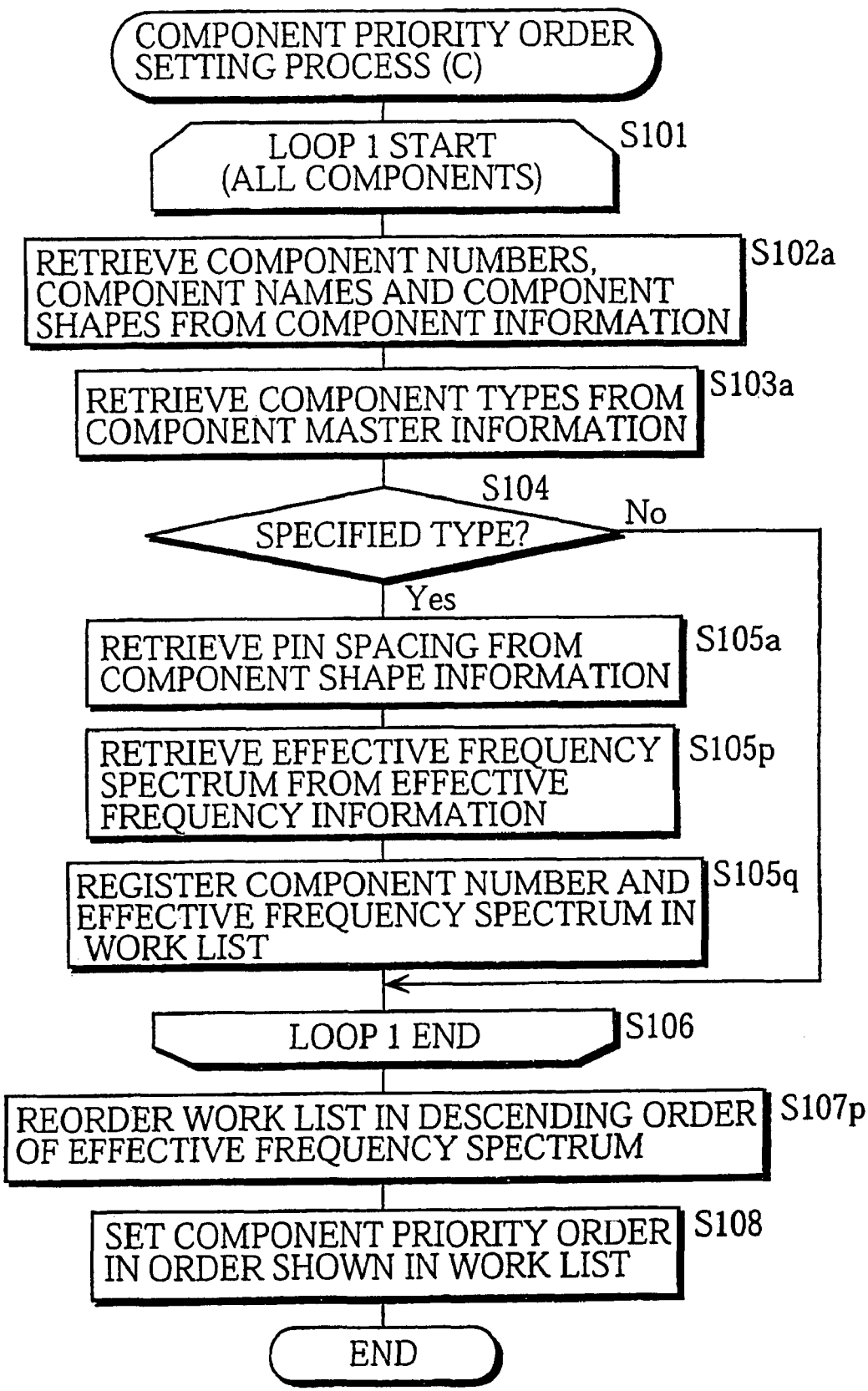
FIG. 13 is a flowchart showing details of the component priority order setting process (C) in the component priority setting unit 1106.

FIG. 13 is a flowchart showing the details of the component priority order setting process (C) in the component priority order setting unit 1106. Steps in FIG. 13 which are common to the flowchart in FIG. 12 are numbered in the same way as FIG. 12. The following primarily explains the different steps, omitting the common steps.

The flowchart in FIG. 13 has steps S105p, S105q, and S107p instead of steps S105b, S105c and S107a in FIG. 12. The specified types stored in the component detection unit 1105 are the above-described (C). In the processing at steps S105p, s105q, and S107p, the effective frequency spectrum is used instead of the inductance value.

Furthermore, at step S107a the component priority order setting unit 1106 reorders the sets in the work list in ascending order of inductance value.

As a result, the component priority order of the capacitors and inductors in the component information list 1201 is set in ascending order of ESL value.

<Control Operations by the Control Unit 1103>

The process from when the control unit 1103 receives a second placement command from the command input analyzing unit 1104, through to when placement of small components controlled by the control unit 1103 ends will be explained.

Figure 14:
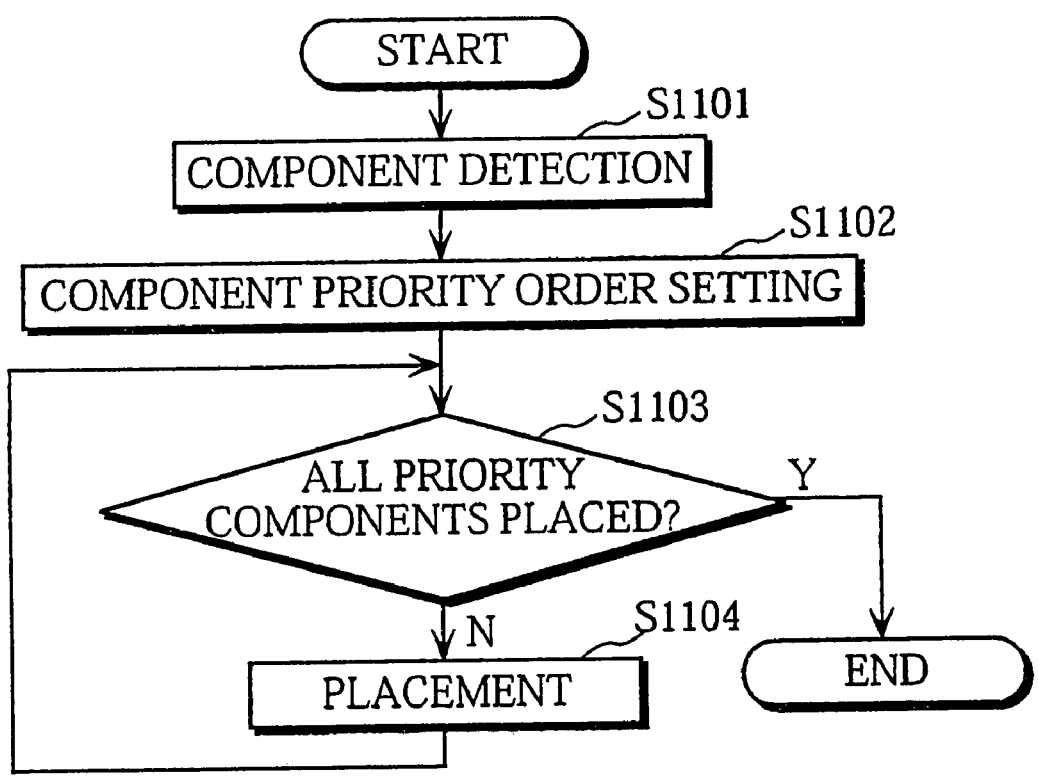
FIG. 14 is a flowchart showing the general operations of the CAD apparatus 1000.

FIG. 14 is a flowchart showing the operations of the CAD apparatus 1000 from receiving a second placement command through to the end of the placement of small components. The placement of large components according to a first placement command is assumed to have already been completed.

The control unit 1103 receives a second placement command from the command input analyzing unit 1104 and activates the component detection unit 1105 (S1101). The component detection unit 1105 retrieves component information from the design information storage unit 1108. Next, the control unit 1103 activates the component priority order setting unit 1106 (S1102). The activated component priority order setting unit 1106 refers to the component information retrieved by the component detection unit 1105 and sets the component priority order in the in the component information list 1201 (see FIG. 11 to FIG. 13).

Next, the control unit 1103 retrieves the component priority order set in the component priority order setting unit 1106, and when retrieval has finished (S1103) the placement unit 1107 places the components following the component priority order (S1104). In this placement, the auxiliary components are placed as close as possible to the main parts. This process is repeated unit retrieval of the component priority order is finished.

In this way, components with high priority order have more space on the printed board in which to be placed, compared with components with low priority, allowing for more freedom in placement of high-priority components and placement in an optimum position.

As explained above, the CAD apparatus of the present embodiment considers specified, types of components with lower capacity or smaller pin spacing, to have lower ESL or impedance value (or higher effective frequency spectrum). The component priority order is set in ascending order of ESL, and placement is performed in the component priority order.

As a result, the placement of noise-countering components is performed in ascending order of impedance (ESL), meaning that noise-countering components with lower impedance are placed with more freedom. As a result, placement can be performed with better noise characteristics. This is because components with lower impedance (lower ESL) reduce high frequency noise, and because higher frequency noise-countering components have to be placed as close as possible to large components, in other words main components, which have greater placement limitations.

Furthermore, the component shape information list 1701 is a table for converting pin spacing into an inductance value or an effective frequency spectrum, therefore, the component priority order setting unit 1106 can set the component priority order of different types of noise-countering components (such as capacitors, inductors, resistors, and filters) in the same way.

Please note that in the above-described embodiment three examples of specified types (A), (B), and (C) are given, but (B) and (C) may be other arbitrary combinations of components generally used for noise-countering such as capacitors, inductors, resistors, and filters. Furthermore, in the cases of (B) and (C), the component priority order setting unit 1106 may set the component priority order in either ascending order of inductance or descending order of effective frequency range.

Second Embodiment

<Outline>

In the CAD apparatus of the first embodiment, the effective frequency spectrum uses a value converted according to the pin spacing in the effective frequency spectrum information list 1601 shown in FIG. 9. However, the CAD apparatus of the present embodiment differs in that an f-Z characteristic (frequency versus impedance value characteristic) is calculated from one or both of the capacity value and the inductance value of a component. The CAD apparatus of the present embodiment calculates the effective frequency spectrum from the f-Z characteristic, and sets the effective frequency spectrum in the component master information list 1301.

<Construction>

Figure 15:
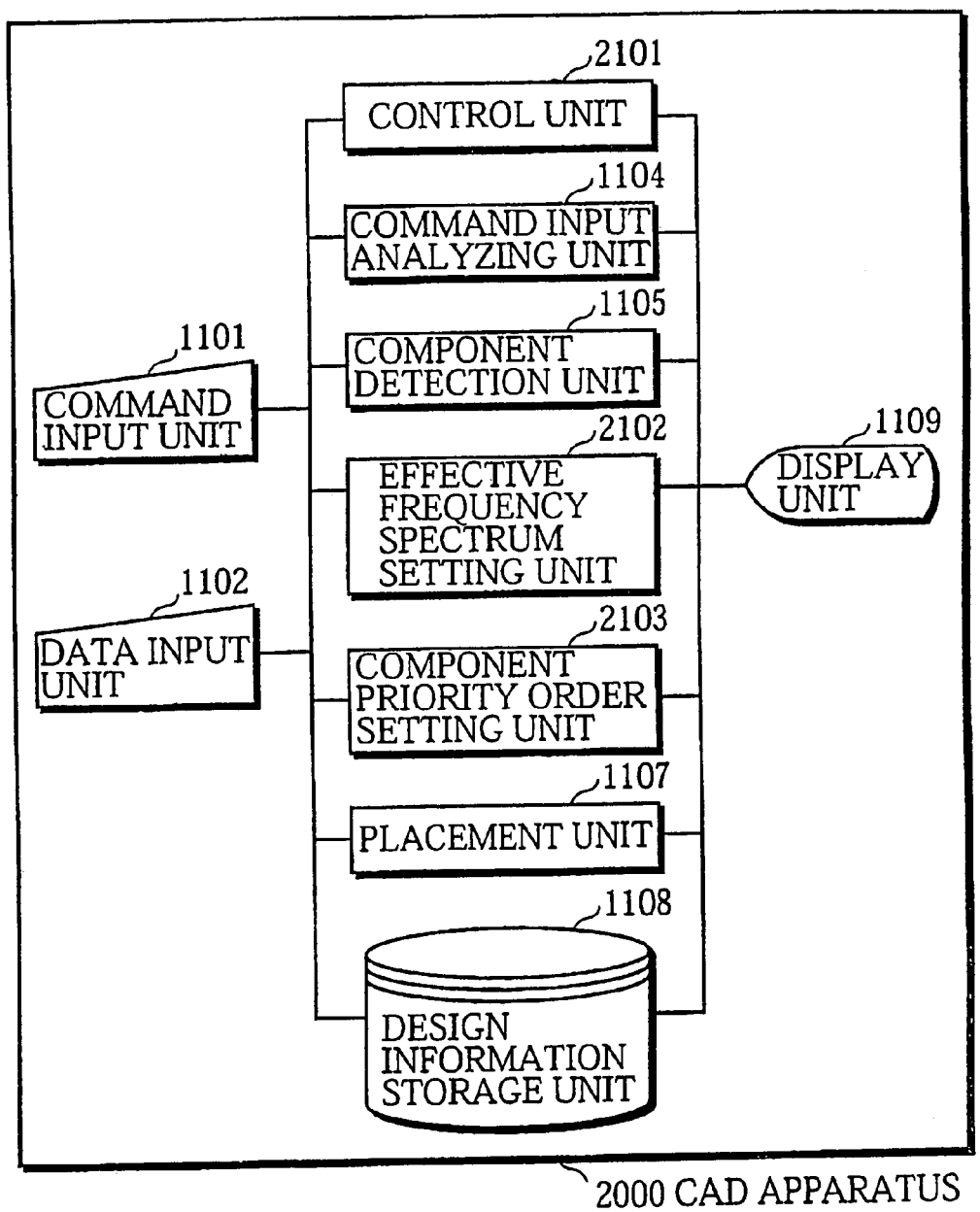
FIG. 15 is a block diagram showing the construction of the CAD apparatus 2000 of the second embodiment.

FIG. 15 is a block diagram showing the construction of the CAD apparatus 2000 of the present embodiment.

Here the elements of the CAD apparatus 2000 that are common to the CAD apparatus 1000 have the same numbering as FIG. 3. The following primarily explains the different elements, omitting the common elements.

The CAD apparatus 2000, compared with the CAD apparatus 1000 shown in FIG. 3, includes a control unit 2101 instead of the control unit 1103, a component priority order setting unit 2103 instead of the component priority order setting unit 1106, and in addition includes an effective frequency spectrum setting unit 2102.

The control unit 2101 receives a second placement command from the command input analyzing unit 1104, then activates the component detection unit 1105, and has the component detection unit 1105 retrieve component information. Then the control unit 2101 activates the effective frequency spectrum setting unit 2102 and the component priority order setting unit 2103 in the stated order. Other than this, the control unit 2101 is identical to the control unit 1103.

The component priority order setting unit 2103 performs the component priority setting order processes (A) and (B) shown in FIG. 11 and FIG. 12 identically to the control unit 1103, however, the component priority order setting process (C) differs in part to that shown in FIG. 13.

Figure 16:
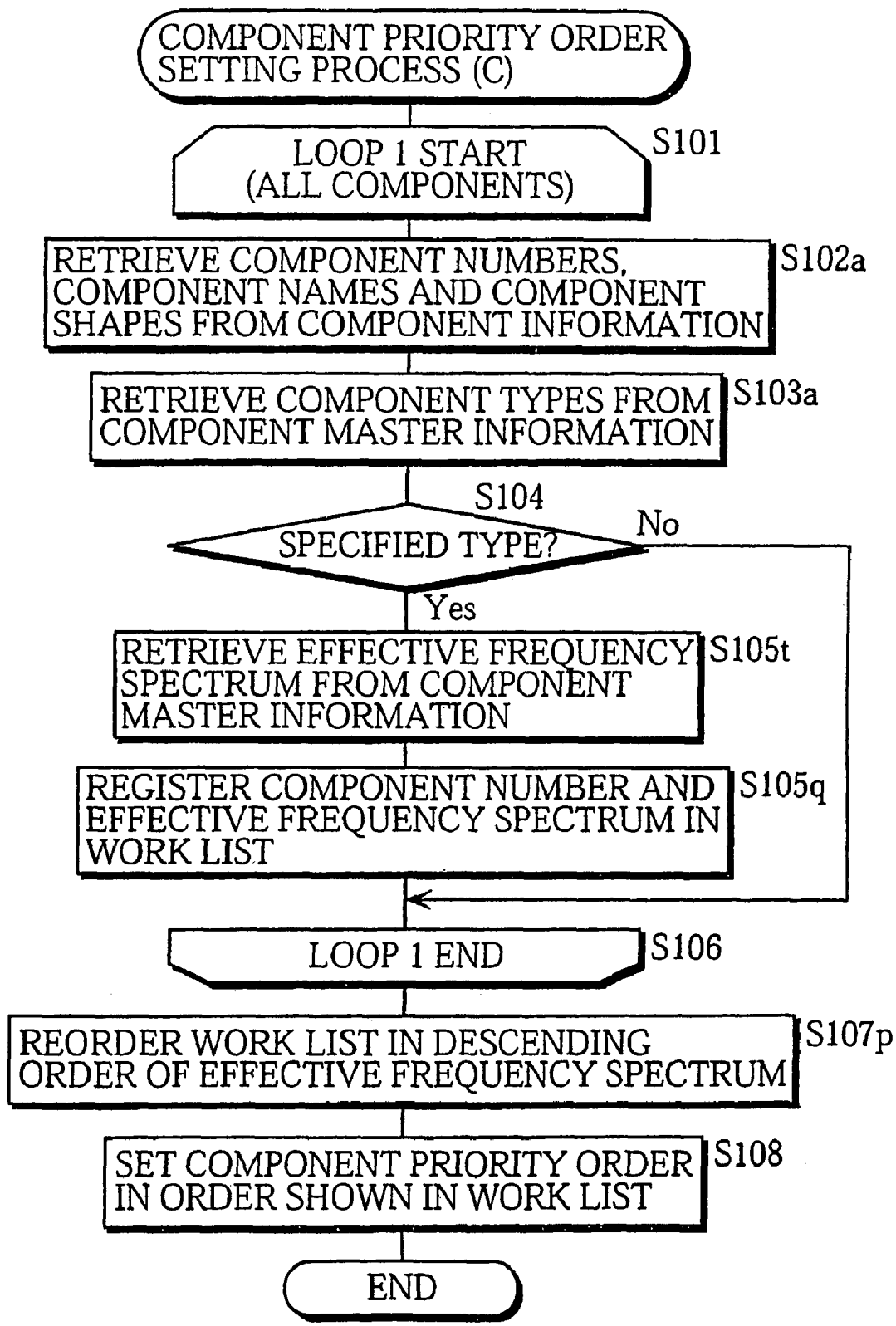
FIG. 16 is a flowchart showing details of the component priority order setting process (C') in the component priority setting unit 1106.

FIG. 16 is a flowchart showing the component priority order setting process performed in the component priority order setting unit 2103 when the specified types are (C) capacitors, inductors, and resistors (hereafter "C").

FIG. 16 includes a step S105t instead of the steps S105a and 5105p (conversion from pin distance to effective frequency spectrum) in FIG. 13.

At step S105t the component priority order setting unit 2103 retrieves the effective frequency spectrum MAX 1310 set in the component master information list by the effective frequency spectrum setting unit 2102. As a result, the component priority order is set in descending order of the effective frequency spectrum MAX 1310 calculated by the effective frequency spectrum setting unit 2102 in the processing after step S105q in FIG. 13.

The effective frequency spectrum setting unit 2102, when informed of one or both of the C value and the L value of a component of the specified type by the control unit 2101, calculates the frequency range in which, the component is effective in noise-countering (EMI-countering) based on the informed value(s). Specifically, the effective frequency spectrum setting unit 2102 stores a predetermined threshold value Th. The effective frequency spectrum setting unit 2102 receives one or both of a C value 1323 and an L value 1322 of a component number 1230 from the control unit 2101, judges which of the C value and the L value has been received, and according to the received value, calculates the f-Z characteristic (for example, each impedance value for a frequency at particular intervals) in the following way, and seeks a frequency range in which the impedance value is smaller than the above-described threshold value, as an effective frequency range.

Equation 1 shows the impedance value Z(f) when the effective frequency spectrum setting unit 2102 receives only the C value 1323.

$$Z(f)=|1/(2\pi fC)| \qquad \text{Equation 1}$$

Equation 2 shows the impedance value Z(f) when the effective frequency spectrum setting unit 2102 receives only the L value 1322.

$$Z(f)=|2\pi fL| \qquad \text{Equation 2}$$

Equation 3 shows the impedance value Z(f) when the effective frequency spectrum setting unit 2102 receives both the C value 1323 and the L value 1322.

$$Z(f)=|2\pi fL-(1/(2\pi fC))|  \quad \text{Equation 3}$$

The effective frequency spectrum setting unit 2102 compares the impedance value in the f-Z characteristic with the threshold value, searches for a section in which the impedance value is lower than the threshold value (Th>Z (f)) as an effective frequency spectrum, and sets the effective frequency spectrum in the effective frequency MIN 1309 and the effective frequency MAX 1310, in the component master information list 1301.

Figure 17:
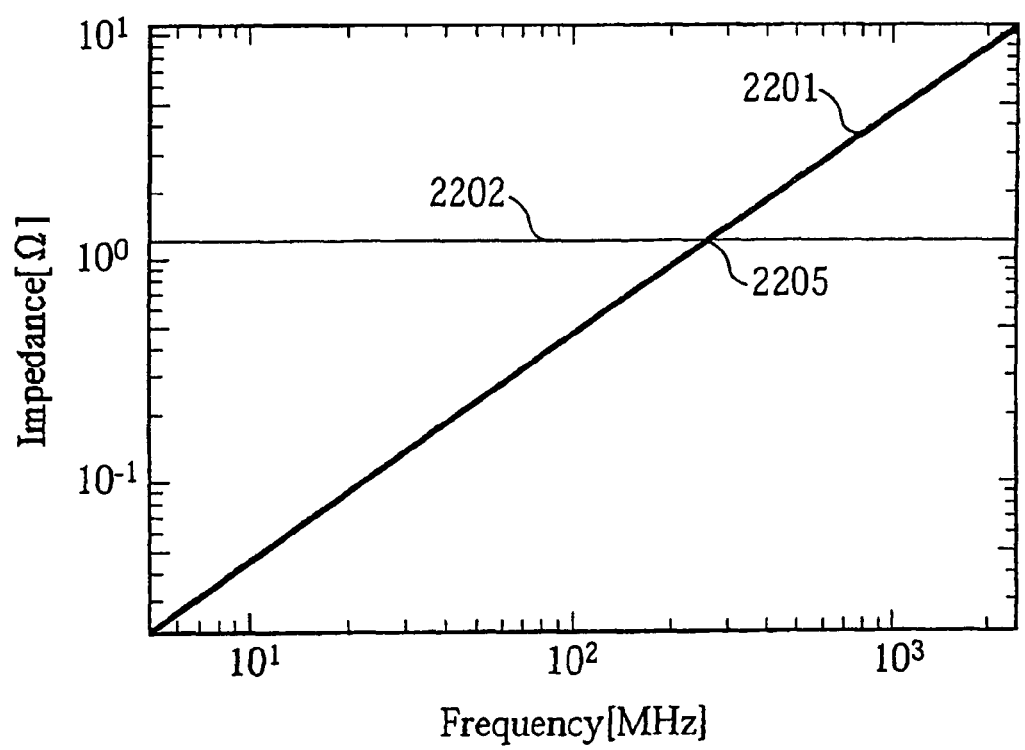
FIG. 17 is a conceptual figure of when the effective frequency spectrum is determined using the f-Z characteristic calculated from the L value.

FIG. 17 shows an example of the calculated f-Z characteristic when the effective frequency spectrum setting unit 2102 receives only the L value 1322 from the control unit 2101. In FIG. 17, the effective frequency spectrum setting unit 2102 compares the impedance 2201 (Z(f)) with the threshold value 2202 (Th), and sets the section in which the impedance 2201 is lower than the threshold value 2202 (the section left of the intersection point 2205) as the effective frequency spectrum in the component master information list 1301.

Figure 18:
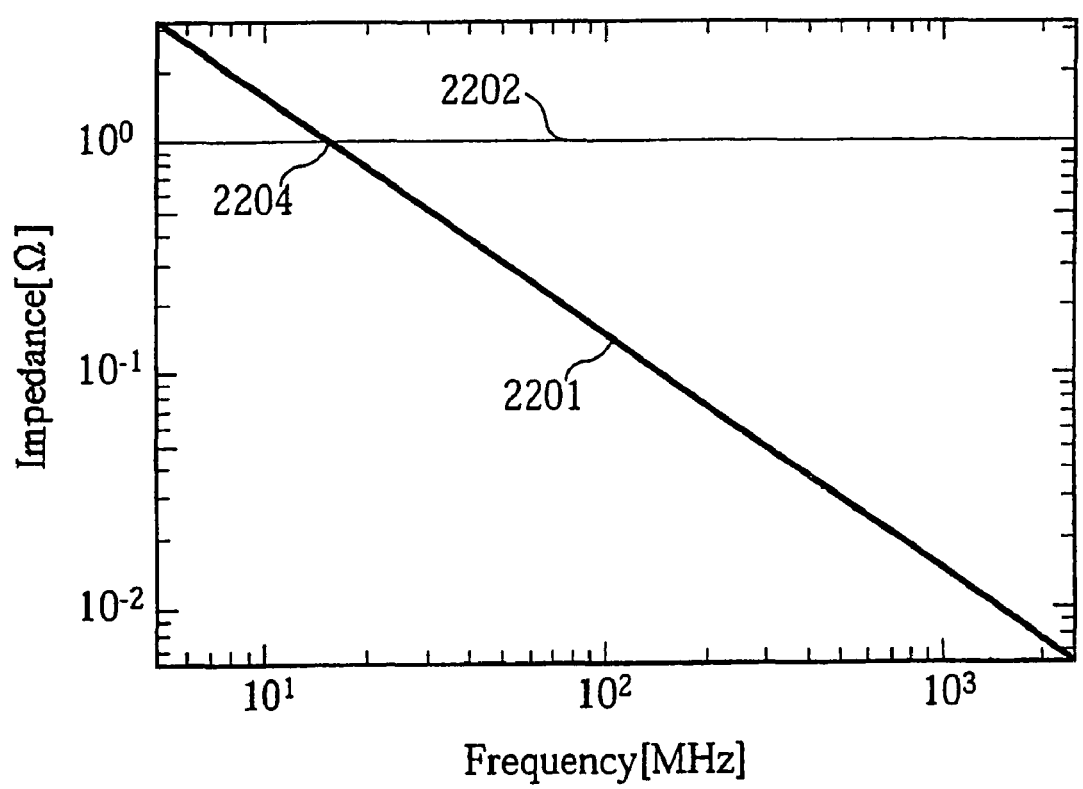
FIG. 18 is a conceptual figure of when the effective frequency spectrum is determined using the f-Z characteristic calculated from the C value.

FIG. 18 shows an example of the calculated f-Z characteristic when the effective frequency spectrum setting unit 2102 receives only the C value 1323 from the control unit 2101. In FIG. 18, the effective frequency spectrum setting unit 2102 sets the section in which the impedance 2201 is lower than the threshold value 2202 (the section right of the intersection point 2204) as the effective frequency spectrum in the component master information list 1301.

Figure 19:
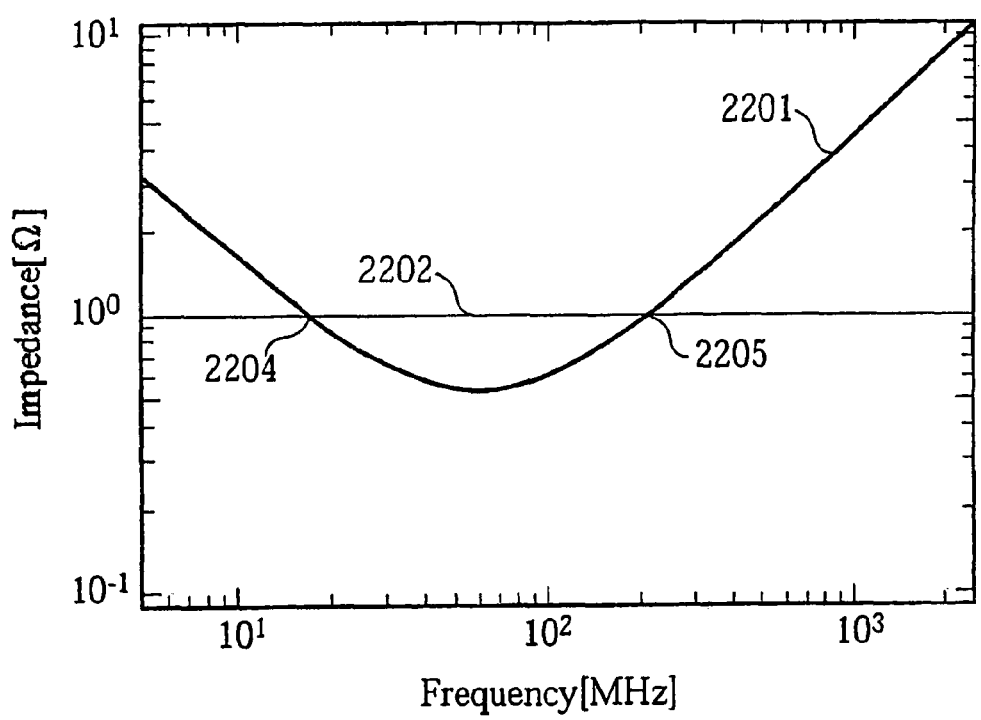
FIG. 19 is a conceptual figure of when the effective frequency spectrum is determined using the f-Z characteristic calculated from the L value and the C value.

FIG. 19 shows an example of the calculated f-Z characteristic when the effective frequency spectrum setting unit 2102 receives both the L value 1322 and the C value 1323 from the control unit 2101. In FIG. 19, the effective frequency spectrum setting unit 2102 sets the section in which the impedance 2201 is lower than the threshold value 2202 (the section between the intersection point 2204 and the intersection point 2205) as the effective frequency spectrum.

In FIG. 17 to FIG. 19 the threshold value Th is 1 Ω. Here, the effective frequency spectrum means the range of a frequency in which a relevant component that can apply (or supply to an IC power pin) a high frequency current at an impedance lower than 1Ω. Please note that the threshold value Th does not have to be 1Ω, the value may be set according to the capacity of the high frequency current necessary (or the supply to an IC power pin necessary) to be applied by a particular component. Furthermore, the threshold value may be stored as a default value such as 1[Ω] or may be input by the user.

The effective frequency spectrum unit 2102 writes, as the result of the calculation of the effective frequency spectrum, the frequency 2204 as the effective frequency MIN 1309 showing the minimum effective frequency, and the frequency 2205 as the effective frequency MAX 1310 showing the maximum effective frequency, into the component master information list 1301.

The component priority order setting unit 2103 retrieves the effective frequency MAX 1310 from the master component information list and sets the component priority order 1233 in descending order of high frequency of the effective frequency MAX 1326. As a result, specified type components (auxiliary components) are placed in the same order as the component priority order as close as possible to the main components. As a result, there is a greater degree of freedom in placing components with a higher effective frequency MAX 1326, making placement with better noise characteristics possible.

<Control Operations by the Control Unit 2101>

The following explains the process performed by the CAD apparatus 2000 from when the control unit 2101 receives a second placement command from the command input analyzing unit 1104, through to when the control of the placement of small components by the control unit 2101 ends.

Figure 20:
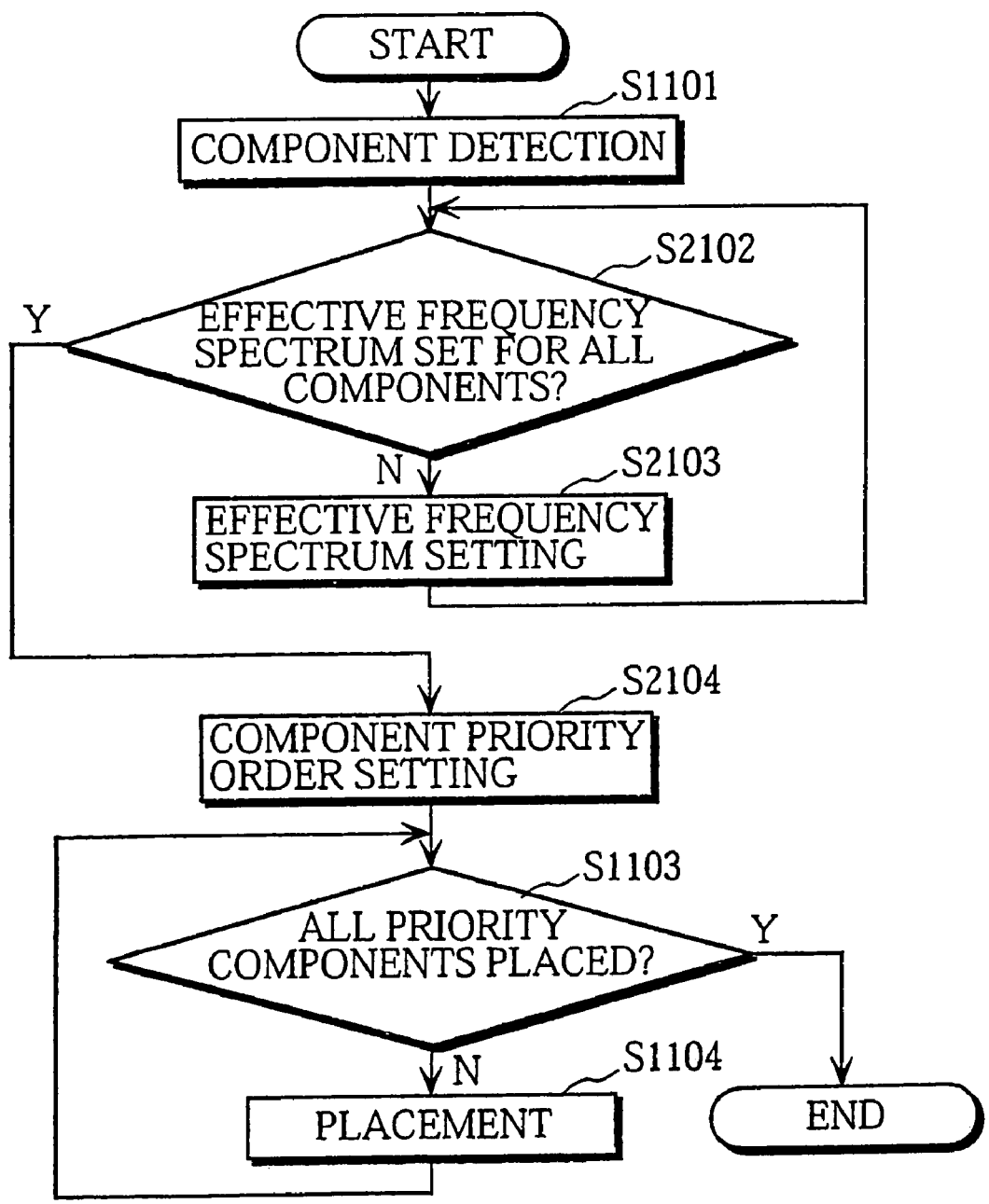
FIG. 20 is a flowchart showing the general operations the CAD apparatus 2000.

FIG. 20 is a flowchart showing the operations of the CAD apparatus 2000 from when a second placement command is received through to when the placement of small components ends. It is assumed that the placement of large components according to a first placement command has already been completed.

FIG. 20, apart from including additional steps S2102 and S2103 between the steps S1101 and S1102, is identical to the flowchart in FIG. 14.

The control unit 2101 receives a second placement command from the command input analyzing unit 1104, then activates the component detection unit 1105 (S1101) According to this, the component detection unit 1105 retrieves component information from the design information storage unit 1108. Next, the control unit 2101 reads the component number 1230 from the retrieved component information, and if the setting of the effective frequency spectrum of all specified type components has not been completed (S2102), retrieves the L values and the C values corresponding to the component names in the component information from the master component information list, and has the effective frequency spectrum setting unit 2102 set the effective frequency spectrum from the L values and the C values. According to this, the effective frequency spectrum setting unit 2102 writes the effective frequency MIN 1309 and the effective frequency MAX 1310 in the component master information list.

The control unit 2101, after finishing reading all component information (component numbers) at step S2102, activates the component priority order setting unit 2103 (S1102). The activated component priority order setting unit 2103, when the specified types are (C) capacitors, inductors, and resistors, sets the component priority order in the same way as at step S1101 in FIG. 14, besides the retrieving of the effective frequency spectrum MAX set in the component master information, instead of converting the pin spacing into an effective frequency spectrum as shown in FIG. 16. Processing following this is identical to that of the first embodiment.

As explained above, in the CAD apparatus of the present embodiment, the priority order, in other words placement order, of specified type components is set in descending order of the effective frequency MAX 1310 set in the component master list.

In this way, the component priority order setting unit 2103 does not convert the pin spacing to the effective frequency spectrum using the effective frequency spectrum information list 1601, but rather calculates the effective frequency MAX form the L value and the C value.

Please note that the CAD apparatus 2000 may be structured so that the user selects whether the effective frequency is converted from the pin spacing as in the first embodiment, or whether the effective frequency is calculated from the L value and the C value as in the present embodiment.

Furthermore, in the present embodiment, the effective frequency spectrum setting unit 2102 calculates the effective frequency spectrum by using the L value included in the component master information list 1301, however, the CAD apparatus 2000 may be structured so that the effective frequency spectrum setting unit 2102 calculates the effective frequency spectrum by retrieving the pin spacing in the component shape information list 1701, instead of the L value, referring to the effective frequency spectrum information list 1601, and using the inductance value 1611 corresponding to the pin spacing.

Please note that in the present embodiment the effective frequency MIN 1325 and the effective frequency MAX 1326 set in the component master information list 1201 are calculated based on the L value and the C value in the component information master list 1301, but if the L value and the C value are unknown, the effective frequency spectrum information list 1601 may be referred to after retrieving the pin spacing 1713, and the effective frequency spectrum 1612 used.

Third Embodiment

The CAD apparatus 3000 of the present embodiment, in addition to the features of the CAD apparatus 1000 of the first embodiment, assigns main components (such as ICs and connectors) and auxiliary components (such as capacitors, inductors, resistors, and filters) in the following manner.

Namely, the CAD apparatus 3000, of the power pins of main components, gives a higher pin priority order to power pins of which the noise estimated to occur in current flowing through the power pin is estimated to be more serious. Starting with power pins which are high in the pin priority order, the CAD apparatus 3000 successively assigns auxiliary components in descending component priority order. Here noise seriousness refers to the height of noise frequency, the strength of noise power, and so on. As a result, auxiliary components high in the priority order are assigned in priority of those in which the current flowing through the power pins generates serious noise.

Figure 21:
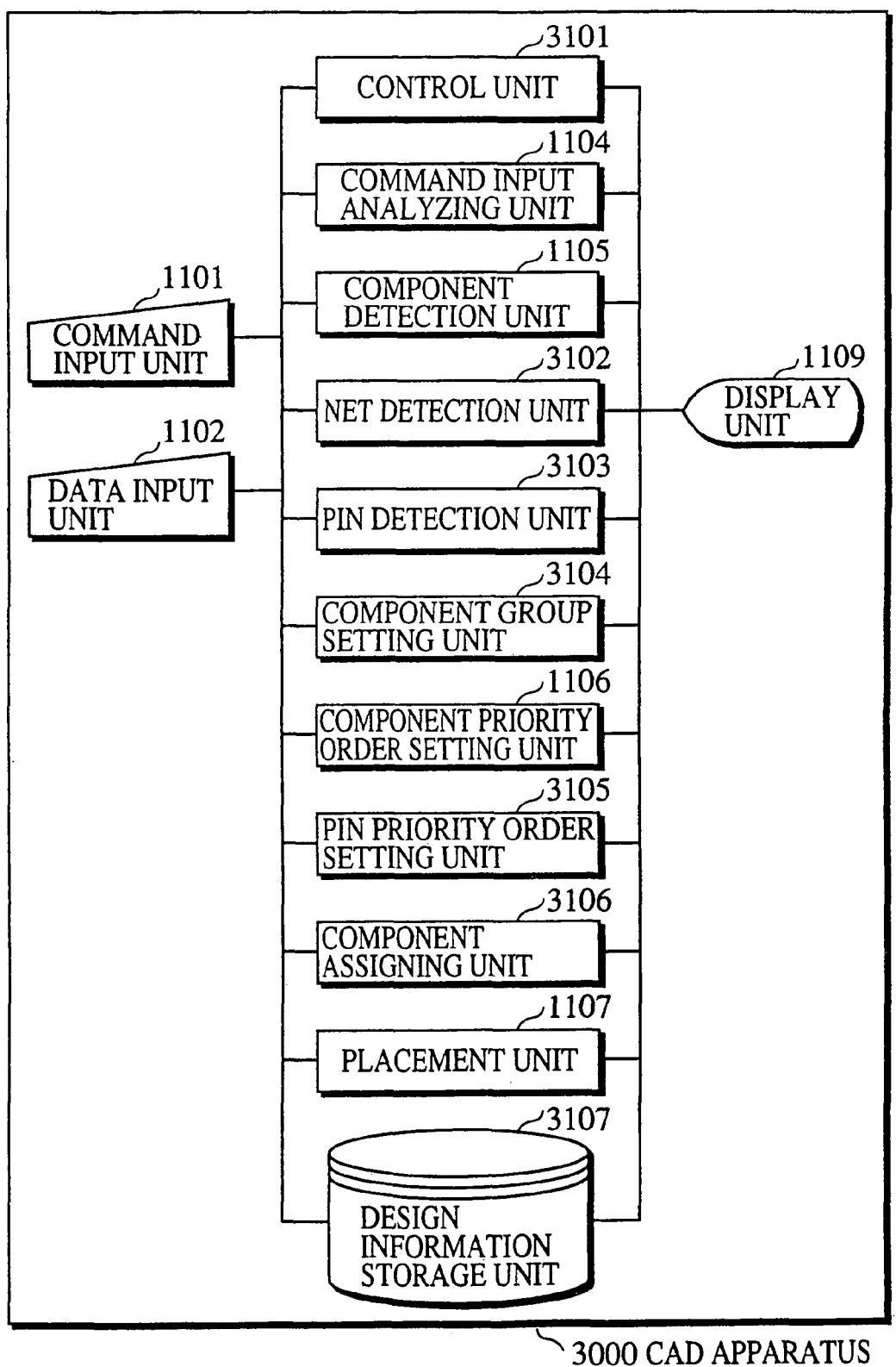
FIG. 21 is a is a block diagram showing the construction of a CAD apparatus 3000 of the second embodiment.

FIG. 21 is a block diagram showing the construction of the CAD apparatus 3000 of the present embodiment. In FIG. 21 the elements with the same numbering as in FIG. 3 have the same functions, therefore an explanation of these elements will be omitted, and the focus will be on differing structure.

The CAD apparatus 3000 in FIG. 21 differs from FIG. 3 in that it includes a design information storage unit 3107 instead of the design information storage unit 1108, and in addition includes a net detection unit 3102, a pin detection unit 3103, a component group setting unit 3104, a pin priority order setting unit 3105, and a component assigning unit 3106. Furthermore, the CAD apparatus 3000 includes a control unit 3101 instead of the control unit 1103.

The design information storage unit 3107 is the same as the design information storage unit 1108 in FIG. 3 in that it stores the component information list 1201, the component master information list 1301, the effective frequency spectrum information list 1601, and the component shape information list 1701. However the design information storage unit 3107 further stores a net information list 1401 and a pin information list 1501.

(1) Net Information List 1410

FIG. 7 shows an example of the net information list 1401. The net information list 1401 shows net information about nets which connect the pins of components (in other words, which pins are connected (wired) to each other).

Figure 25:
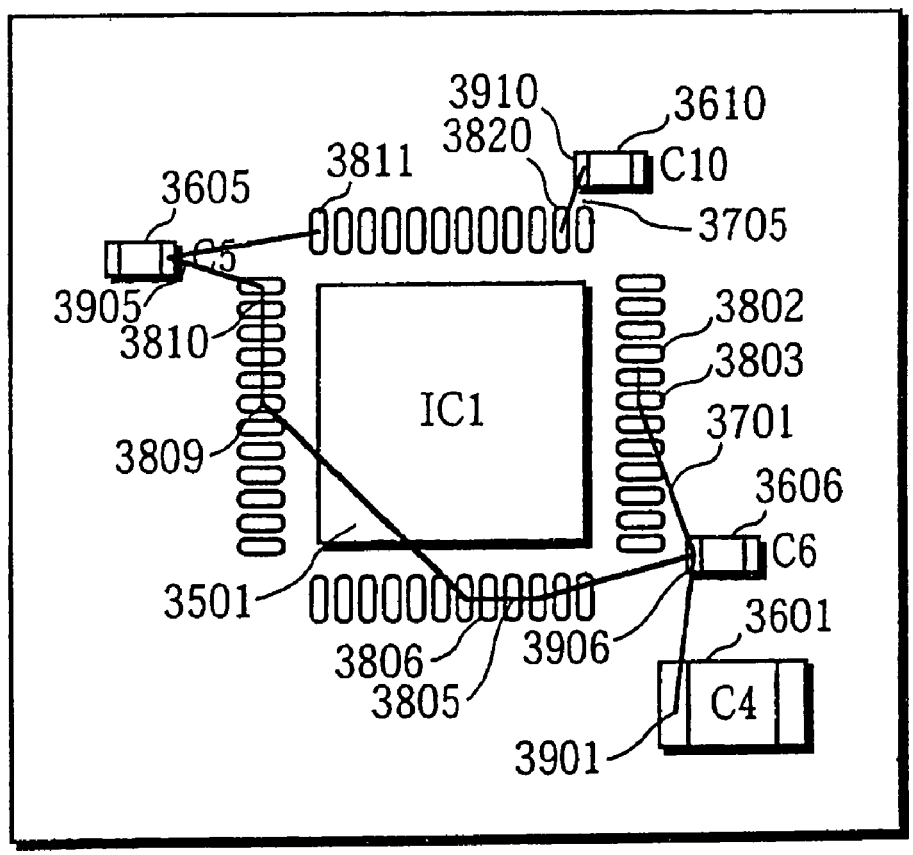
FIG. 25 is a conceptual figure of components assigned to the component number 3501 and the component number 3501.

FIG. 25 shows an explanatory diagram of nets. In FIG. 25 components 3501, 3601, 3605, 3606, and 3610 are placed on the A side of a printed wiring board. Net 3701 shows the relationship between a pin of the component 3501, a pin of the component 3601, a pin of the component 3605, and a pin of the component 3606. Net 3705 shows the relationship between a pin of the component 3501, and a pin of the component 3601.

As shown in FIG. 7, the net information list 1401 has information about each net. The net information includes a net name 1402, contact pin numbers 1403, a frequency number 1404, a rising time 1405, a falling time 1406, an output voltage HIGH 1407, an output voltage LOW 1408, a net type 1409, and a duty ratio 1410.

The net name 1402 is an identifier for identifying a net.

Each contact pin number 1403 shows a number of a pin (contact pin) of a component to be connected to a net. Each contact pin number is shown as (a component number identifying a component)-(a pin number identifying a pin of the particular component). For example, "IC1-2" shows a pin having a pin number 1 belonging to an IC whose component number is "IC1". "R1-1" shows a pin having a pin number 1 belonging to a resistor whose component number is R1. Furthermore, the contact pin number 1403 includes at least one set of a component number identifying a component and a pin number identifying a pin belonging to the component, the component number and the pin number being linked by a "-".

The frequency 1404 shows the frequency of a signal applied to a net.

The rising time 1405 and the falling time 1406 show respectively the rising time and the falling time of a signal applied to a net.

The output voltage HIGH 1407 and the output voltage LOW 1408 show respectively the voltage applied to a net when the signal output is at HIGH and LOW.

The net type 1409 is an identifier for identifying a type of net. Types of nets include "power" for power, "ground" for 0V, "clock" for high speed signals such as clock signals, and "normal" for other general signals.

The duty ratio 1410 shows the duty ratio of a signal applied to a net.

The above-described frequency 1405 and duty ratio 1410 are not necessarily shown in all nets. In FIG. 7 "-" shows that a category is not shown.

(2) Pin Information List 1501

FIG. 8 shows an example of a pin information list 1501. The pin information list, as shown in FIG. 8, is a list made up of pin information. The pin information list 1501 includes a component number 1502, a pin number 1503, a pin name 1504, a power net name 1505, a power pin number 1506, a frequency 1507, a rising time 1508, a falling time 1509, an output voltage HIGH 1510, an output voltage LOW 1511, a component order 1512, a usage frequency MIN 1513, a usage frequency MAX 1514, a pin type 1515, a consumed current 1516, and a duty ratio 1517.

The component number 1502 is an identifier for identifying a component to which a pin belongs. The pin number 1501 is an identifier for identifying a pin. The pin name 1504 is an identifier for identifying the name of a pin.

The power net name 1505 is an identifier for identifying a power net which supplies the current applied to an inner circuit of an IC to which a pin is connected.

The power number 1506 is a number for identifying a power net which supplies the current applied to the inner circuit of an IC which is connected to a pin.

The frequency 1507 shows the frequency of a signal applied to a net that connects pins.

The rising time 1508 and the falling time 1509 show respectively the rising time and the falling time of a signal applied to a net that connects to a pin.

The output voltage HIGH 1510 and the output voltage LOW 1511 show respectively the voltage applied to a net which is connected to a pin when the output of a signal applied to a net is at HIGH and LOW.

The priority order 1512 shows the priority order of a pin.

The usage frequency MIN 1513 and the usage frequency MAX 1514 show respectively the lowest frequency and the highest frequency amongst frequency components of a signal that is applied to a net connected to a pin.

The pin type 1515 shows the type of net connected to a pin. The types of nets include "normal", "power", "ground", and "clock".

The consumed current 1516 shows the consumed current of a component of a signal that flows in a net connected to a pin.

The duty ratio 1517 shows the duty ratio of a signal that flows is a net connected to a pin.

The above-described frequency 1507 through to the duty ratio 1517 are, naturally, not originally set for power pins. However, in the present embodiment they are set by the component priority setting unit 3105 even for power pins. Furthermore, in FIG. 8 "-" shows that a category is not shown.

The net detection unit 3102, under the control of the control unit 3101, retrieves all of the pin information in order from the pin information list 1501 stored in the design information storage unit 3107. The retrieved pin information list 1501 is primarily used by the pin priority order setting unit 3105 and the component assigning unit 3106.

The component group setting unit 3104 sets the component group name for each set of component information in the component information list 1201 (see FIG. 5) retrieved by the component detection unit 1105. The name of a first component group is called "1", and the name of a second component group is called "2". The first component group name "1" shows that a component is an IC or a connector which belongs to the first component group (main components). The second component group name "2" shows that a component is a resistor, a capacitor, an inductor or a filter which belongs to the second component group (auxiliary components). The component group setting unit 3104 makes the component name 1221 in the component information list 1201 (see FIG. 5) retrieved by the component detection unit 1105 into a key. Then the component group setting unit 3104 extracts the component type 1331 that corresponds to the key from the component master information in the component master information list 1301 (see FIG. 6) retrieved by the component detection unit. The component group setting unit writes "1" in the component group 1210 if the component type is included in the first component group, and "2" in the component group 1210 if the component type is included in the second component group.

For example, in FIG. 5, a component with a component number 1220 "IC1" has a component name 1330 "MN1". Furthermore, in FIG. 6 the component type of the component name 1330 "MN1" is IC. Therefore the component group setting unit 3104 sets the component group 1222 of the component number 1220 "IC1" in FIG. 5 as "1". Please note that there may be more than two component groups.

The component group setting unit 3104 finishes processing after setting the component group 1210 for all the components in the component information list 1201. However components that do not belong to any group are set as "-".

The pin priority order setting unit 3105 sets the pin priority order of power pins. The pin priority order is set for a power pin connected to one net, in descending order of height of frequency of the signal driven by the current supplied by the pin (or in descending order of speed of rising time/falling time).

The current supplied to a power pin is, in theory, direct current so frequency information does not exist. However, the pin priority order setting unit 3105 uses the information about the frequency of the pin for the "clock" signal as the power pin frequency information when the power pin is a power pin for a close high frequency ("clock") and current supply is received inside an IC from the power pin.

Figure 22:
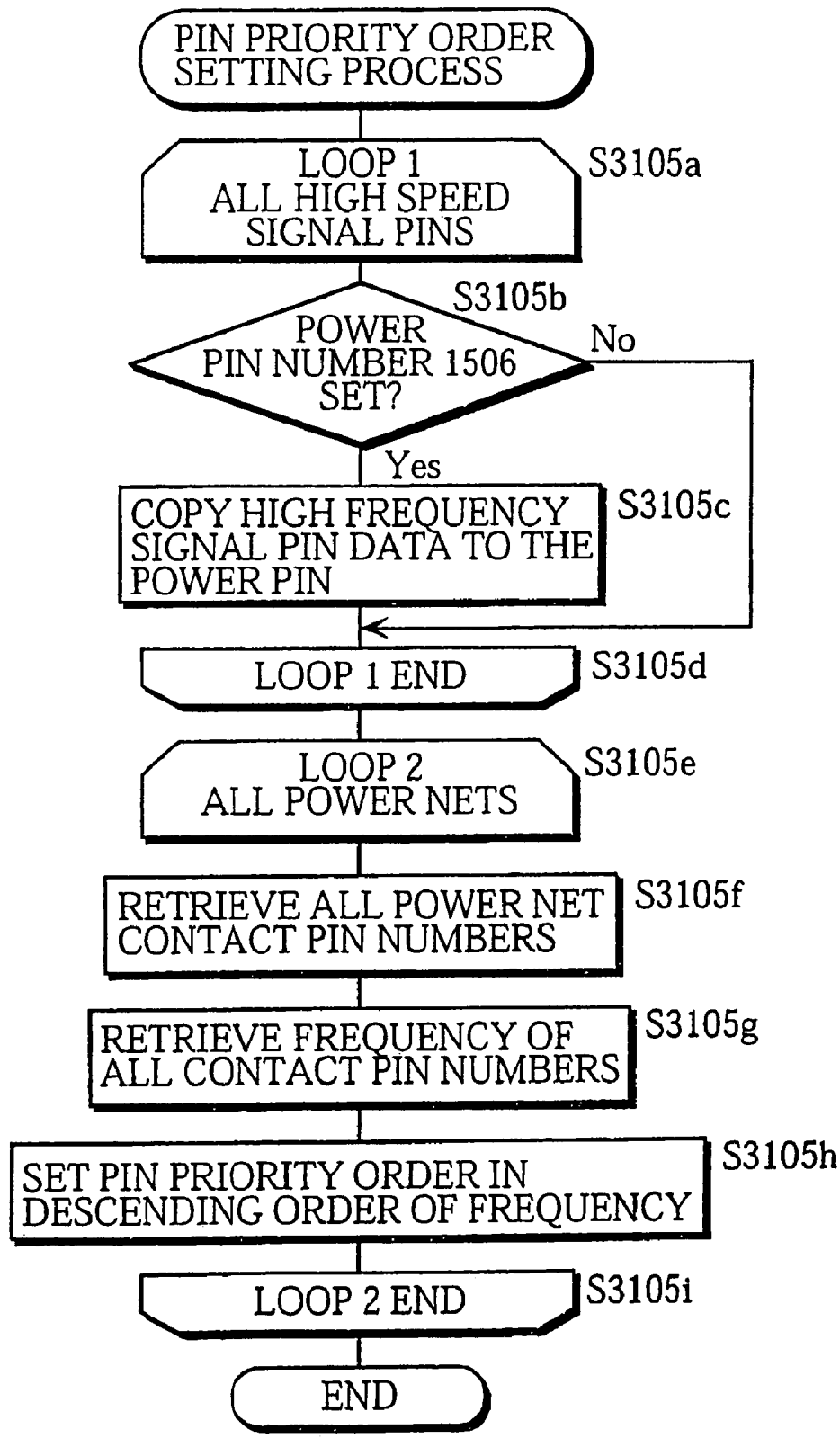
FIG. 22 is a flowchart showing in detail the pin priority order setting process by the pin priority order setting unit 3105.

FIG. 22 is a flowchart showing the pin priority order setting process performed by the pin priority order setting unit 3105 in detail.

As shown in FIG. 22, the pin priority order setting unit 3105 repeats the following (loop 1: S3105a to S3105d) for all the high frequency signal pins (pin type "clock") shown in the pin information list 1501 in FIG. 8, as shown in FIG. 22. Namely, in loop 1 the component priority setting unit 3105 judges whether the pin number 1506 has been set for the high frequency pin (S3105b), and if the pin number is judged to have been set, the pin priority order setting unit 3105 copies the data set in the pin information list 1501 for the high frequency signal pin as the data of the power pin (S3105c). Here, the data is the frequency 1507, the rising time 1508, the falling time 1509, the output voltage HIGH 1510, and the output voltage LOW 1511.

For example, for the high frequency signal line pin clk1 (pin name 1531) in FIG. 8, the pin priority order setting unit 3105 copies the data (frequency 1535, rising time 1536, falling time 1537, output voltage HIGH 1538, output voltage LOW 1539) to the data columns (frequency 1555, rising time 1556, falling time 1557, output voltage HIGH 1558, output voltage LOW 1559) for the power pin 4 (pin number 1551).

In the same way, the pin priority order setting unit 3105 copies data to the data of other high frequency signal line pins set with a power pin number 1506. The loop 1 process ends when processing of all the high frequency signal line pins finishes.

Next, the pin priority order setting unit 3105 repeats the following for all power nets (loop 2: S3105e to S3105i) Namely, the pin priority order setting unit 3105 retrieves the net name of a net of the net type "power" in the net information list 1401 in FIG. 7 (for example, Vcc1), and retrieves the pin number 1403 of each of the pins connected to the net (S3105f). Then the pin priority setting unit 3105 retrieves information (the frequency information 1507, the rising time 1508, the falling time 1509) relating to the frequencies corresponding to each pin number retrieved from the pin information list in FIG. 8 (S3105g), and sets the pin priority order 1512 of the contact pins connected to the relevant net, in descending order of frequency (or speed of rising time and falling time), in the pin information list 1501 (S3105h). In this way, for each net of the net type "power", the pin priority order is set for pins connected to the relevant network.

The component assigning unit 3106 assigns power pins of components belonging to the first component group in descending order of pin priority to second group components having high priority. In other words, the main component numbers 1208 and the auxiliary component numbers 1209 are set in the component information list 1201 shown in FIG. 5.

Figure 23:
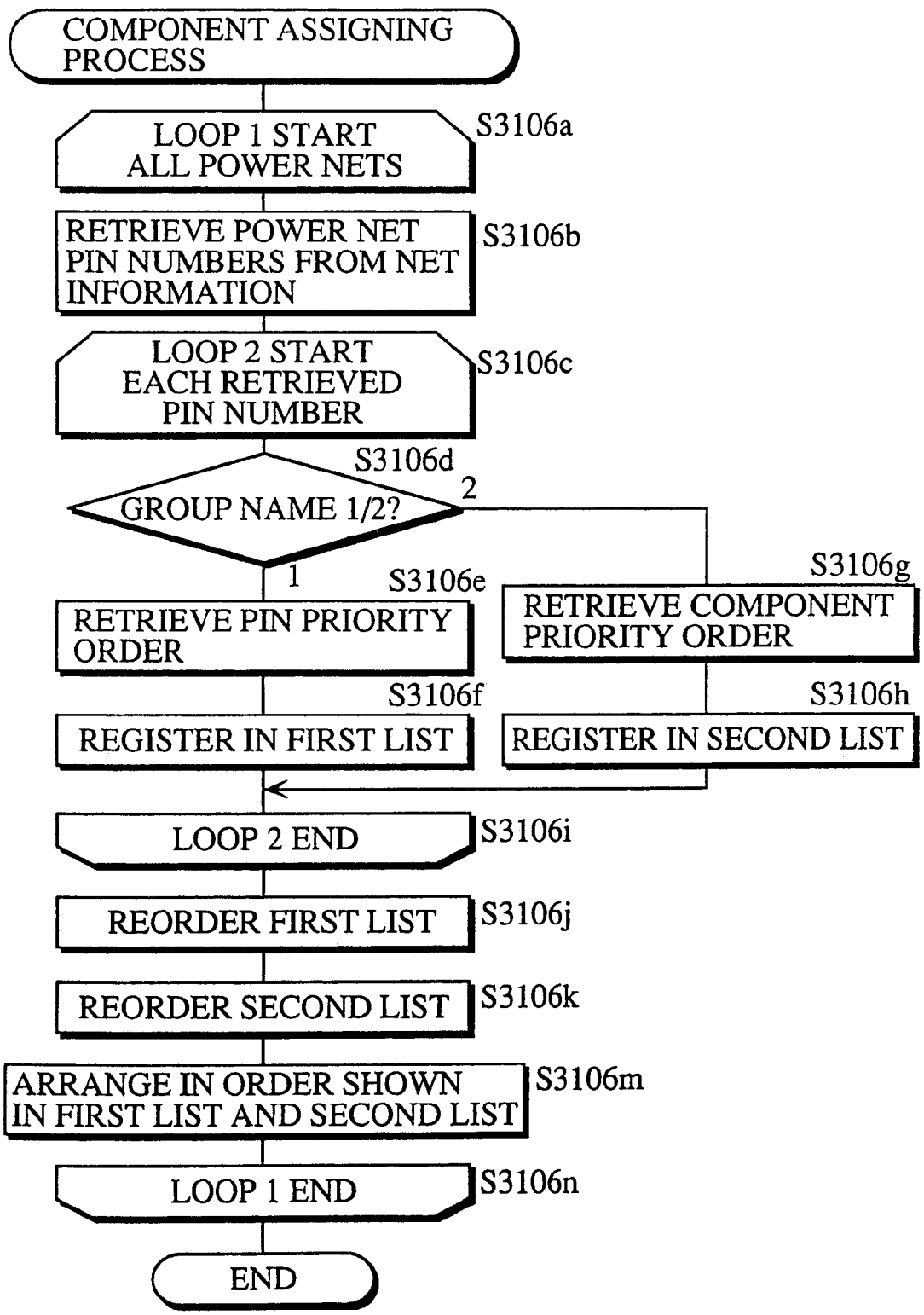
FIG. 23 is a flowchart showing a specific example of the assigning process in the component assigning unit 3106.

FIG. 23 is a flowchart showing a specific example of an assigning process in the component assigning unit 3106.

In FIG. 23, loop 1 shows the processing for each of all the power nets. Loop 2 shows the processing for each contact pin in a power network.

In loop 1, the component assigning unit 3106 retrieves all the pin numbers from the contact pin number 1422 column for one net in the net information shown in FIG. 7 whose net type is "power" (S3106b), and performs loop 2 processing on each of the retrieved pin numbers.

In loop 2 the component assigning unit 3106 refers to the component information shown in FIG. 5 to find the component group name 1210 of the component to which one retrieved pin number belongs. When the referred component group name is "1", the component assigning unit 3106 refers to the pin priority order 1512 in the pin information and registers a set of information consisting the pin number and the pin priority order in a work area in the memory (hereafter "first list") (S3106d,e,f) Furthermore, when the referred pin group name is "2", the component assigning unit 3106 retrieves the component priority order information from the component information and registers a set of information consisting the pin number and the component priority information in the work area in the memory (hereafter "second list") (S3106d,g,h) According to loop 1, the first list retains' the sets of information of the pin number and the pin priority order of components belonging to the first component group, and the sets of information of the pin number and the component priority order of components belonging to the second component group.

After loop 2 is completed, the component placement unit 3106 reorders the sets of information retained in the first list in descending order of pin priority order (S3106j), and reorders the sets of information retained in the second list in descending order of component priority (S3106k). Then, the component assigning unit 3106 refers to the first list and the second list and assigns components in the first component group whose pin priority order is high with components in the second component group whose component priority order is high (S3106m). Here, when the number of components in the first component group is different to the number of components in the second component group proportional distribution of the number of power pins of each component is desirable.

Please note that when the number of sets of information in the first list and the second list is equal the component assigning unit 3106 may assign components on a one to one basis after the reordering. When there are more sets in the first list than the second list the component assigning unit 3106 may consider power pins belonging to the same component whose coordinates are close as one group and assign the power pins as a group. Furthermore, when there are fewer sets in the first list than the second list, the sets may be assigned on a one to one basis starting from the top of both lists, then the remaining sets on the second list assigned on a one to one basis by starting form the top of the first list again.

As a result of the assigning, the component assigning unit 3106 writes the component numbers of the components in the second group assigned to the components in the first group as the auxiliary component numbers 1223, and the numbers of the first components as the main component numbers 1234.

<Control Operations by the Control Unit 3101>

The process in the CAD apparatus 3000 from when the control unit 3101 receives the second placement command from the command input analyzing unit 1104, through to when the placement of the small components controlled by the control unit 3101 ends will be explained.

Figure 24:
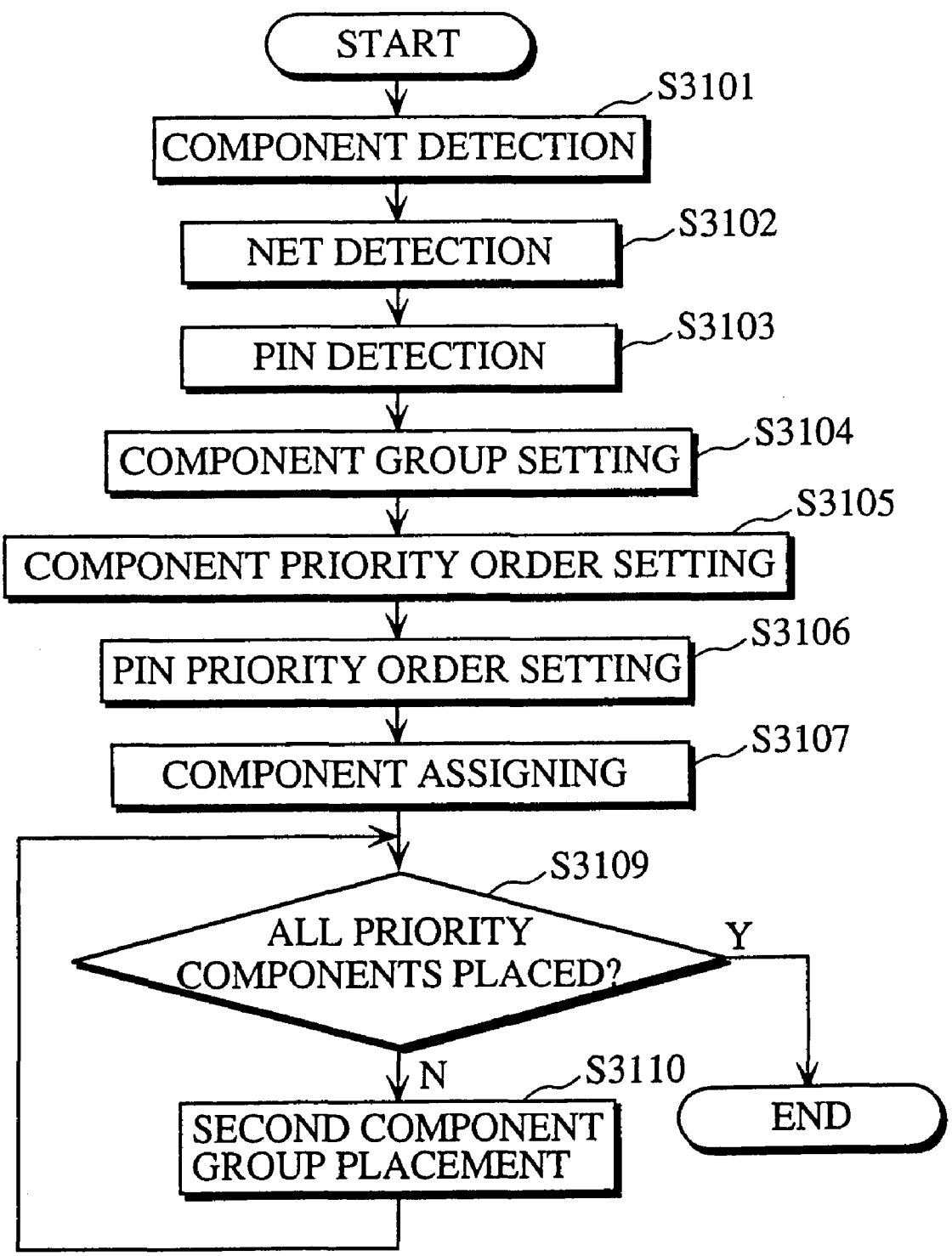
FIG. 24 is a flowchart showing the general operations of the CAD apparatus 3000.

FIG. 24 is a flowchart showing the operations of the CAD apparatus 3000 from receiving the second placement command through to the end of the placement of small components. The placement of large components according to a first placement command is assumed to be already completed.

As shown in FIG. 24, the control unit 3101 receives the second placement command from the command input analyzing unit 1104 and has the component detection unit 1105 retrieve component information from the design information storage unit 3107 (S3101), the net detection unit 3102 retrieve net information from the design information storage unit 3107 (S3102), and the pin detection unit 3103 retrieve pin information from the design information storage unit 3107 (S3103).

Next, the control unit 3101 activates the component group setting unit 3104 (S3104). The activated component group setting unit 3104 refers to the component information and the component master information retrieved by the component detection unit 1105, and sets the component group from the component type 1303. Then, the control unit 3101 activates the component priority order setting unit 1106 (S3105). The activated component priority order setting unit 1106 sets the component priority order from the component information. Then, the control unit 3101 activates the pin priority order setting unit 3105 (S3106) The activated pin priority order setting unit 3105 sets the pin priority order as shown in FIG. 22.

In addition, the control unit 3101 activates the component assigning unit 3106 (S3107). The component assigning unit 3106 refers to the pin priority order 1512 and the component priority order 1207, and assigns the first components and the second components as shown in FIG. 23. Next, the control unit 3101 retrieves the second components set whose priority order is set in the component priority order setting unit 1106, and after retrieval has finished (S3109), the placement unit 1107 places second components following the component priority setting order (S3110). This process is repeated until the retrieval of the component priority order is finished.

Figure 27:
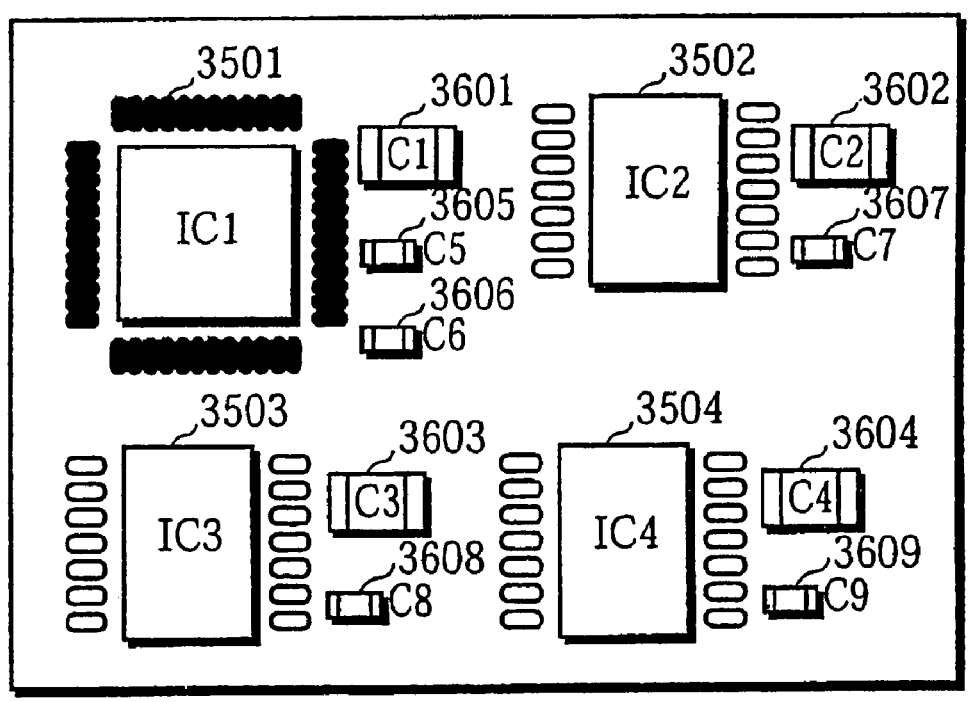
FIG. 27 is a conceptual figure showing the result of assigning of components according to the present invention.

FIG. 27 shows an example of component placement according to the above-described process. In FIG. 27 components 3501 to 3504 (IC1 to IC4) as the first component group and components 3601 to 3609 (C1 to C9) as the second component group are separated by group. The components 3601, 3605, and 3606 (C1, C5, and C6) are assigned to the component 3501 (IC1), the components 3602 and 3607 (C2 and C7) with the component 3502 (IC2), the components 3603 and 3608 (C3 and C8) with the component 3503 (IC3), and the components 3604 and 3609 (C4 and C9) with the component 3504 (IC4).

Figure 1:
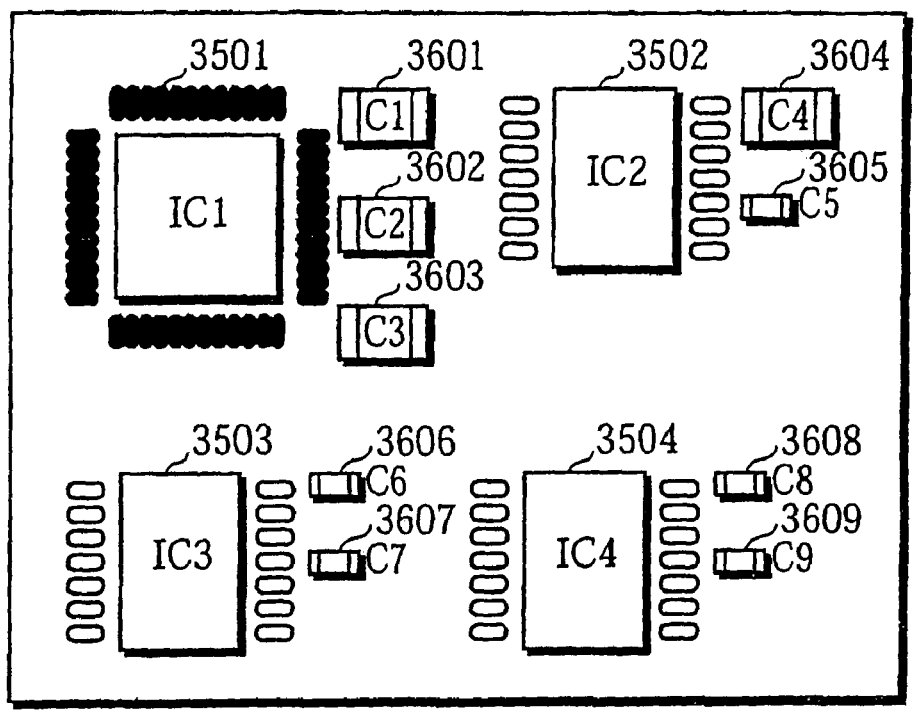
FIG. 1 is a conceptual figure showing the result of assigning of components according to component type.
Figure 2:
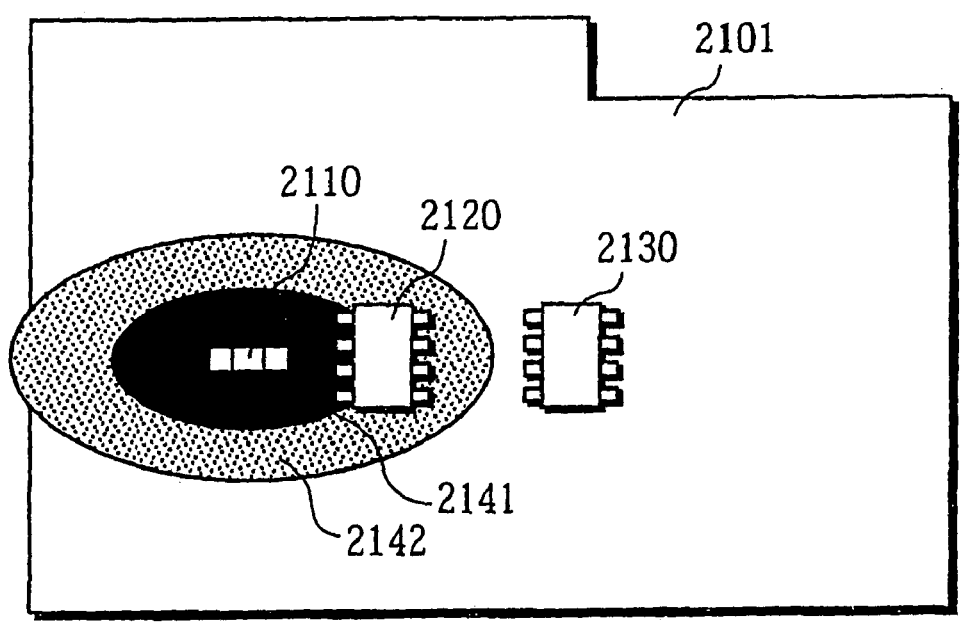
FIG. 2 shows a wiring board being designed displayed on a monitor of a CAD apparatus in the prior art.

Comparing FIG. 27 with FIG. 1 shown in the Prior Art, it can be seen that capacitors C6 to C9 whose capacity is low (impedance against high frequency is low) are assigned evenly, without clustering in FIG. 27.

Please note that in the third embodiment the pin priority order setting unit 3105 sets the pin priority order 1512 in the pin information list 1501 of power pins in descending order of the frequency 1507, but the pin priority order 1512 may be set in descending order of any of (a) speed of rising time 1508, (b) speed of falling time 1509, (c) consumed current 1516, and (d) consumed power. The consumed power may be added to the pin information list as a category to be set by the user. The consumed current 1516 may be obtained from the output voltage HIGH 1510 and the output voltage LOW 1511.

Figure 26:
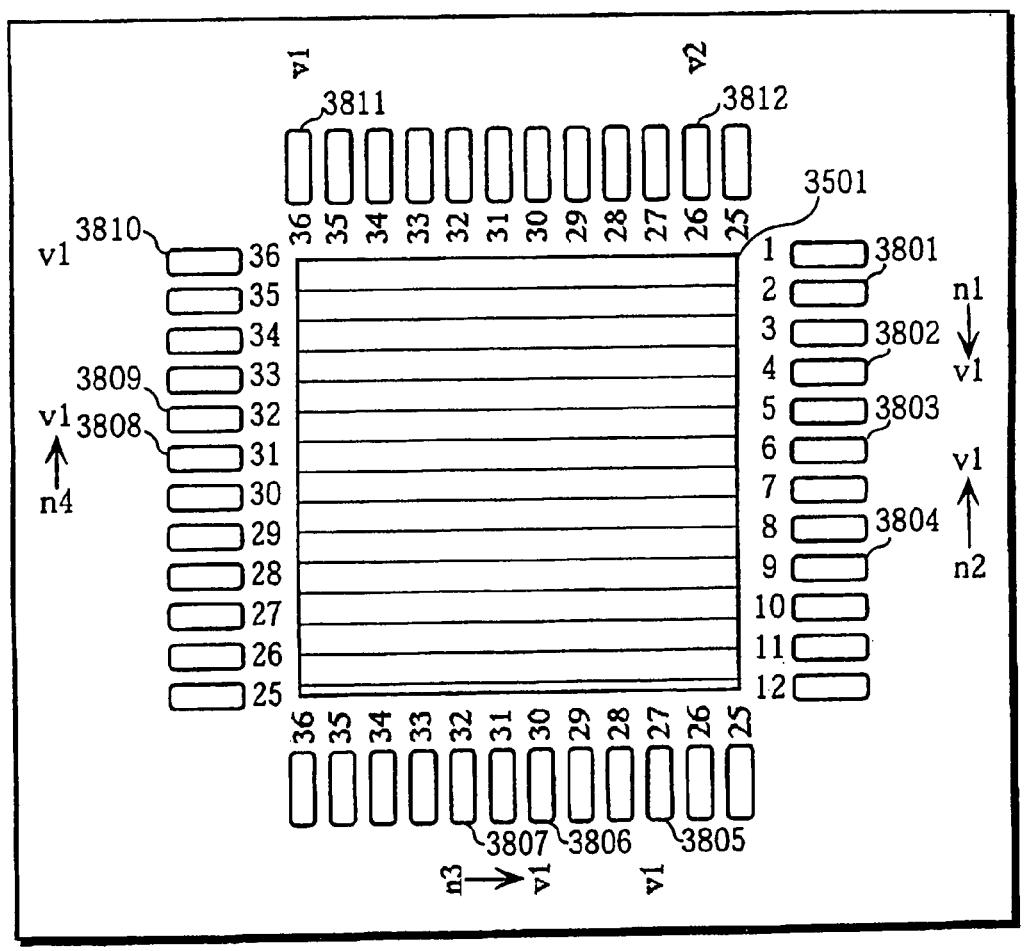
FIG. 26 is a conceptual figure of when power pins are detected from the pin number 3501.

Furthermore, in the third embodiment the pin priority order setting unit 3105 uses the attributes of power pins that supply current to the internal circuit of the high frequency pin as the power pin number 1506, but as shown in FIG. 26, close power pins may be selected from amongst power pins whose output voltage HIGH 1510 in FIG. 8 matches (for example, the output voltage 1538 of pin number 1531, and the output voltage 1558 of pin number 1551).

In the third embodiment the pin priority order setting unit 3105 uses the attributes of power pins that supply current to the internal circuit of the high frequency pin as the power pin number 1506, but as shown in FIG. 26, close power pins may be selected from amongst power pins whose power net name 1553 of the pin number 1531 and the net name 1421 of the pin number 1551 match.

In addition, in the third embodiment, the pin priority setting unit 3150 uses the attributes of power pins that supply current to the internal circuit of the high frequency pin as the power pin number 1506, but as shown in FIG. 26, a power pin whose pin number 3802 is close to the pin number 3801 may be selected.

Furthermore, in the third embodiment, the component assigning unit 3106 assigns first group components having pins which are high in the pin priority order 1512 by priority to second group components which are high in the component placement priority 1207, but first components shown in the pin priority order 1512 may be assigned by priority starting with second components which are high in the component priority order 1207.

Fourth Embodiment

In the CAD apparatus 3000 of the third embodiment the pin priority order 1512 is set in descending order of frequency of in the pin information list 1501, for power pins, however, in the present embodiment, an explanation of when the pin priority order 1512 is set in descending order of the usage frequency MAX 1514, rather than the frequency 1507 in the pin information list 1501, will be given.

Figure 28:
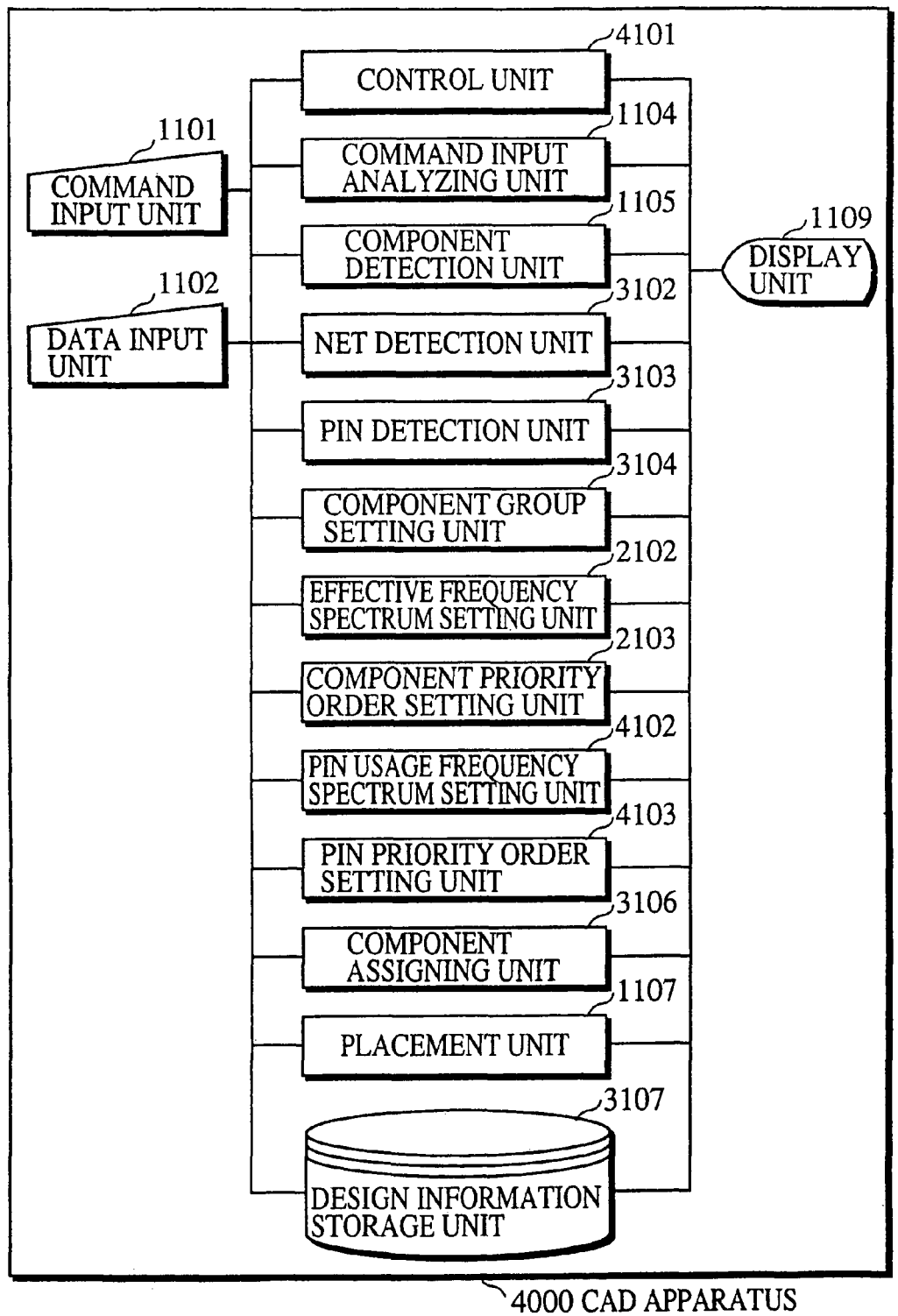
FIG. 28 is a is a block diagram showing the construction of a CAD apparatus 4000 of the fourth embodiment.

FIG. 28 is a block diagram showing the structure of a CAD apparatus 4000 of the present embodiment. In FIG. 28 elements with the same numbering as in FIG. 21 have the same functions, therefore an explanation of these elements will be omitted, and the focus will be on differing structure.

The CAD apparatus 4000 in FIG. 28 differs from FIG. 21 in that it includes an addition of an effective frequency spectrum setting unit 2102, a component priority order setting unit 2103 instead of the component priority order setting unit 1106, an addition of a pin usage frequency spectrum setting unit 4102, a pin priority setting unit 4103 instead of the pin priority setting unit 3105, and a control unit 4101 instead of the control unit 4101.

The effective frequency setting unit 2102, and the component priority setting unit 2103 are the same as the elements that have the same numbering in the second embodiment, so an explanation will be omitted.

The pin usage frequency spectrum setting unit 4102 sets the usage frequency MAX 1514 for each power pin, in the pin information list 1501 in FIG. 8.

Figure 29:
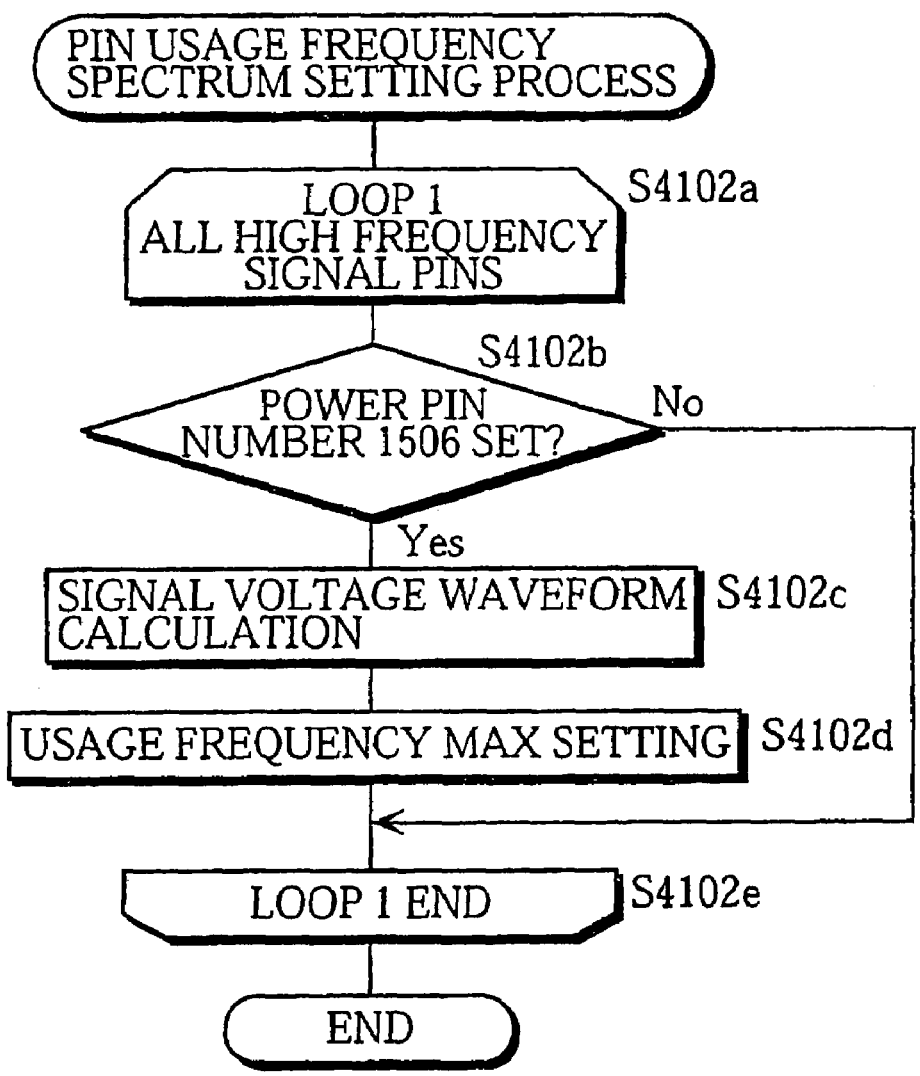
FIG. 29 shows a flowchart showing detailed contents of the pin processing of the pin usage frequency setting unit 4102.

FIG. 29 is a flowchart showing of the contents of the pin processing of the pin usage frequency spectrum setting unit 4102.

Figure 32:
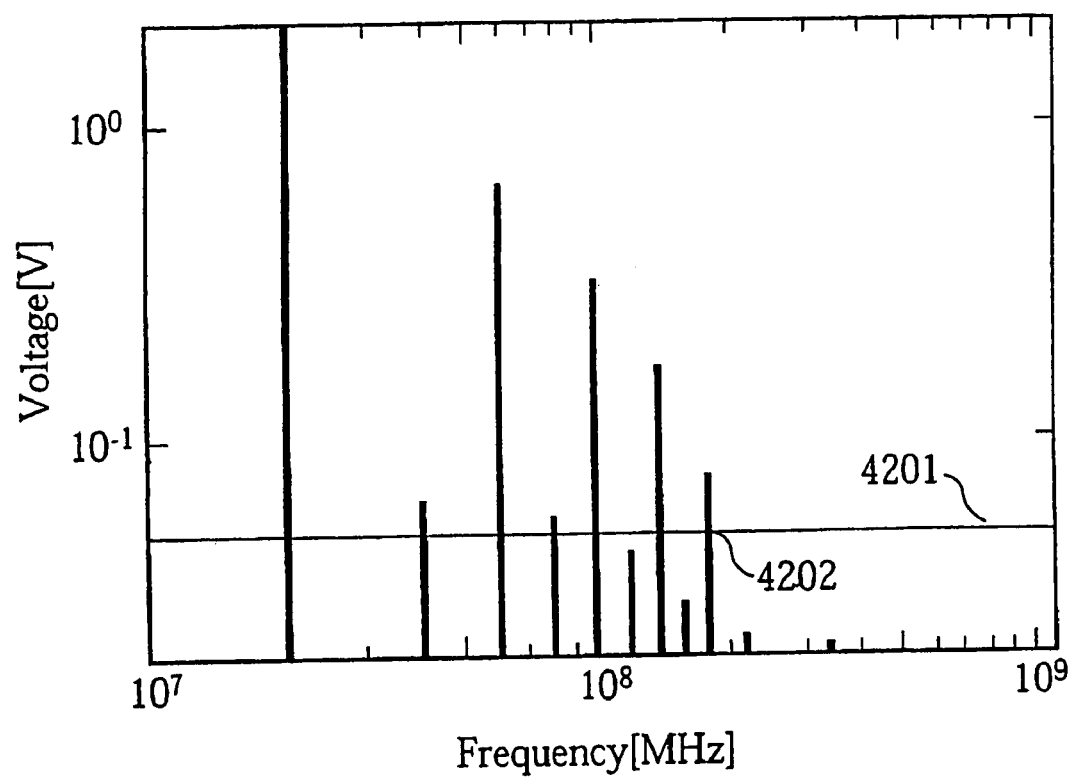
FIG. 32 is a conceptual figure showing signal voltage decomposed into frequency components.

As shown in FIG. 29, the pin usage frequency spectrum setting unit 4102 repeats the following (loop 1: S4102a to S4102e) for all high frequency signal (pin type "clock") pins in the pin information list 1501 shown in FIG. 8. Namely, in loop 1 the pin usage frequency spectrum setting unit 4102 judges whether a power pin number has been set for a high frequency signal pin (S4102b), and if the power pin number is judged to have been set, calculates the signal voltage waveform according to Equation 4, based on the high frequency signal pin data contained in the pin information list 1501 (frequency 1507, rising time 1508, falling time 1509, output voltage HIGH 1510, output voltage LOW 1511) (S4102c). The pin usage frequency spectrum setting unit 4102 decomposes the signal voltage waveform to a frequency component (f-V characteristic) such as that shown in FIG. 32, and sets the highest frequency which is greater than the voltage threshold value (the voltage 4201 in FIG. 32) in the power pin usage frequency MAX 1514 judged at step S4102b (S4102d).

$$V(f) = 2 \cdot V0 \cdot \tau \cdot f0 \cdot P \cdot Q(f)$$

Here $P = (\sin(n \cdot \pi \cdot \tau \cdot f0)/(n \cdot \pi \cdot \tau \cdot f0))$ $Q(f) = (\sin(n \cdot \pi \cdot tf \cdot f0)/(n \cdot \pi tf \cdot f0))$      Equation 4

V0: difference of output potential (output voltage HIGH-output voltage LOW), τ:duty ratio, f0: basic frequency, tf: falling time, f: frequency, n: positive integer Please note that in Equation 4 only the falling time is shown to be used, but the shorter of the rising time 1536 and the falling time 1537 may be used.

The pin priority order setting unit 4103 sets the priority order of power pins.

Figure 30:
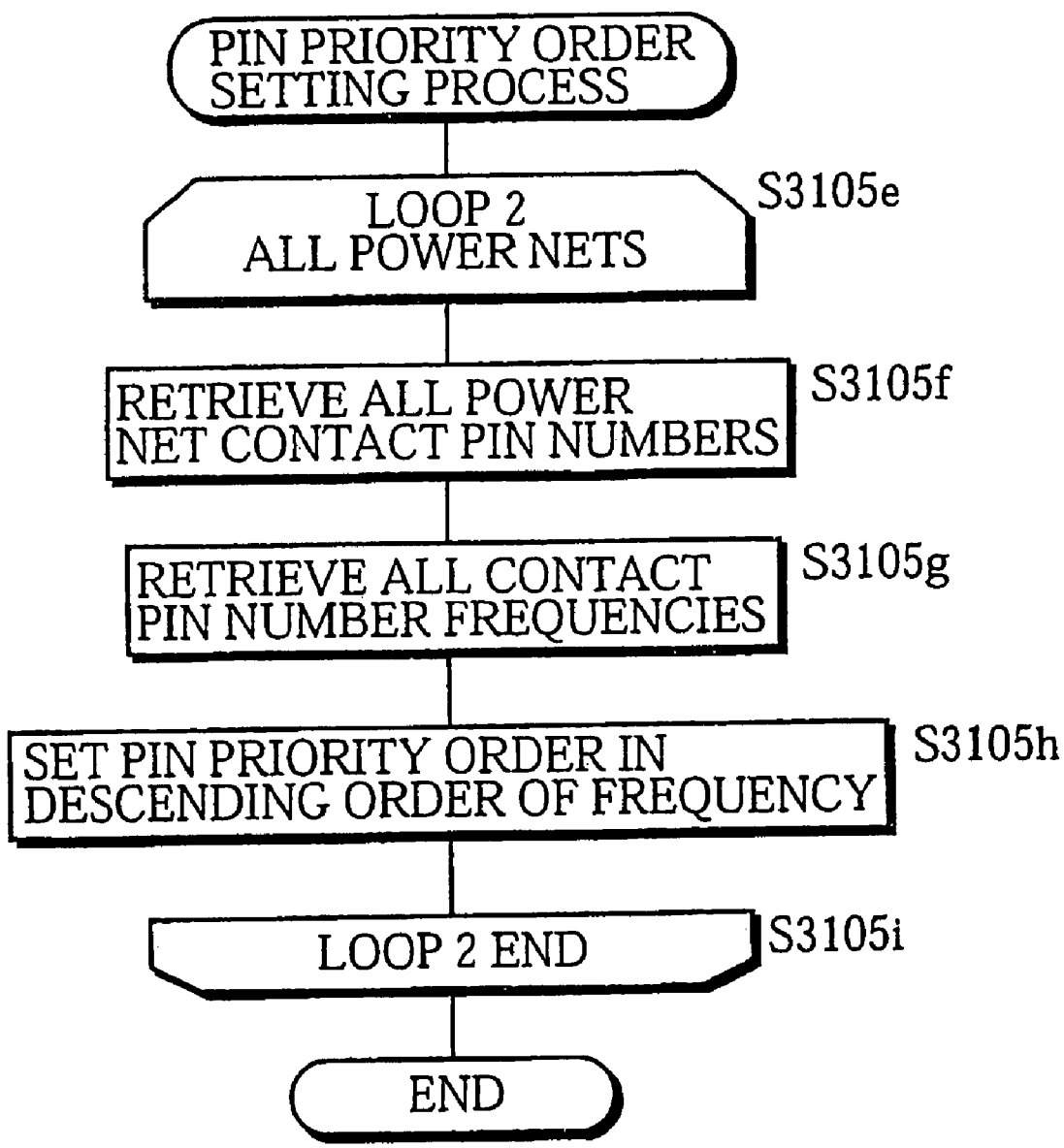
FIG. 30 is a flowchart showing the pin priority order setting process in the pin priority order setting unit 4103.

FIG. 30 is a flowchart showing the pin priority setting order setting process in the pin priority order setting unit 4103. In FIG. 30, the steps with the same numbering as FIG. 22 are the same processing, so an explanation will be omitted. FIG. 30 has a step 4103g instead of step S3105g in steps S3105e to S3105i.

At step 4103g the pin priority order setting unit 4103 retrieves the usage frequency MAX 1514 from the pin information list 1501 for all contact pin numbers retrieved at step S3105f (S3105g). According to this the pin priority order setting unit 4103 sets the pin priority order in descending order of usage frequency MAX 1514 for each power network.

<Control Operations by the Control Unit 4101>

Figure 33:
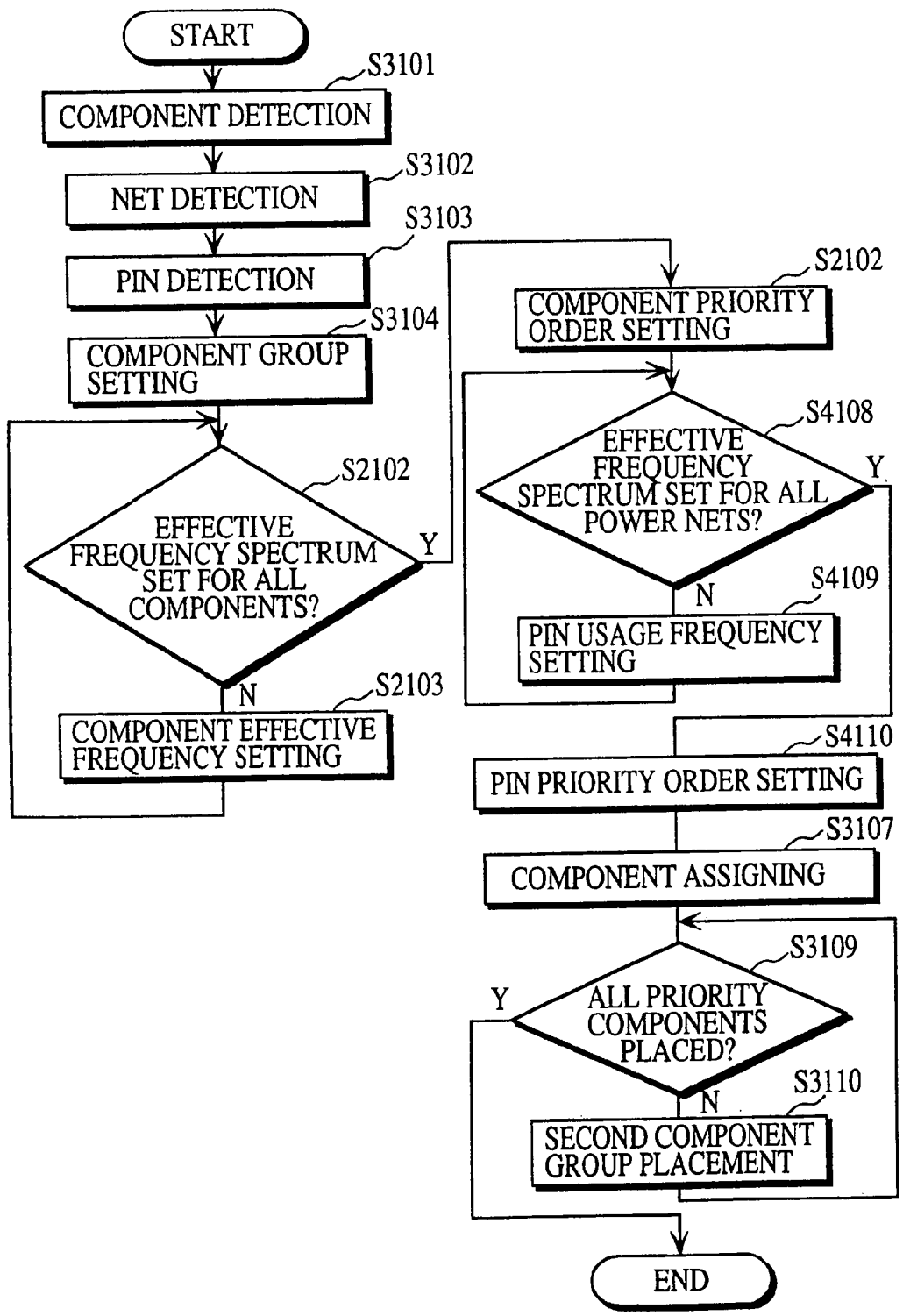
FIG. 33 is a flowchart showing the general operations of the CAD apparatus 4000.

FIG. 33 is a flowchart showing the operation of the CAD apparatus 4000 from when the second placement command is received to when the placement of small parts finished, according to the control of the control unit 4101. It is assumed that placement of large parts following the first placement command has already finished.

In FIG. 33, the steps with the same numbering as FIG. 24 and FIG. 20 are the same processing, so an explanation of these steps will be omitted. FIG. 33 differs in that it has step S4110 instead of step S3106 in FIG. 24, and also steps S4108 and S4109 directly preceding step S4110.

After the component priority order is set at step S2102, the control unit 4101 has the pin usage frequency spectrum setting unit 4102 set the pin usage frequency spectrum pin priority order 1512 (S4108, S4109). The details of steps S4108 and S4109 are shown in FIG. 30. According to this, the maximum value of the frequency that is greater than the threshold value of voltage that causes noise (the voltage shown in FIG. 32, 4201) is sought.

Furthermore, the control unit 4101 activates the pin priority order setting unit 4103 (S4110). The activated pin priority setting unit 4103 sets the pin priority order 1512 in descending order of the usage frequency MAX 1514, rather than the frequency, in the pin information list 1501.

As a result the pins that are high in the priority order, in other words pins which apply current with a high usage frequency spectrum MAX, are placed by priority in descending order from components that are high noise-countering components.

Please note that in the fourth embodiment the electrical characteristics in the pin information 1513 are referred to to calculate the frequency component of the signal voltage, but the frequency component of the signal voltage may also be calculated by searching for the contact pin number 1403 in the net information from the pin number 1530 and the pin number 1531, specifying the net name 1431, and referring to the frequency 1433, the rising time 1434, the falling time 1435, the output voltage HIGH 1436, the output voltage LOW 1437, and the duty ratio 1438.

Please note that in the fourth embodiment the pin usage frequency spectrum setting unit 4102 calculates the frequency component of the signal voltage based on the pin number 1531 data in the pin information, but the frequency component of the signal voltage may be calculated based on the internal clock-power net name 1308 in the component master information. In this case, the rising time, the falling time, the output voltage HIGH, the output voltage LOW, and the duty ratio are not included in the component master information list 1301, but these categories may be added to the master information list 1301 and input by the user, or the CAD apparatus 4000 may retain default values for these categories.

Fifth Embodiment

In the present embodiment a CAD apparatus that divides one power net into a plurality of first hierarchical nets and one second hierarchical net, and wires so as to prevent noise propagation between first hierarchical nets, after the noise-countering components have been placed by any of the above-described CAD apparatuses, will be explained. Here, the first hierarchical net is a power net in each group made up of a main component and the relevant auxiliary components. The second hierarchical net is a net connecting each group.

Figure 34:
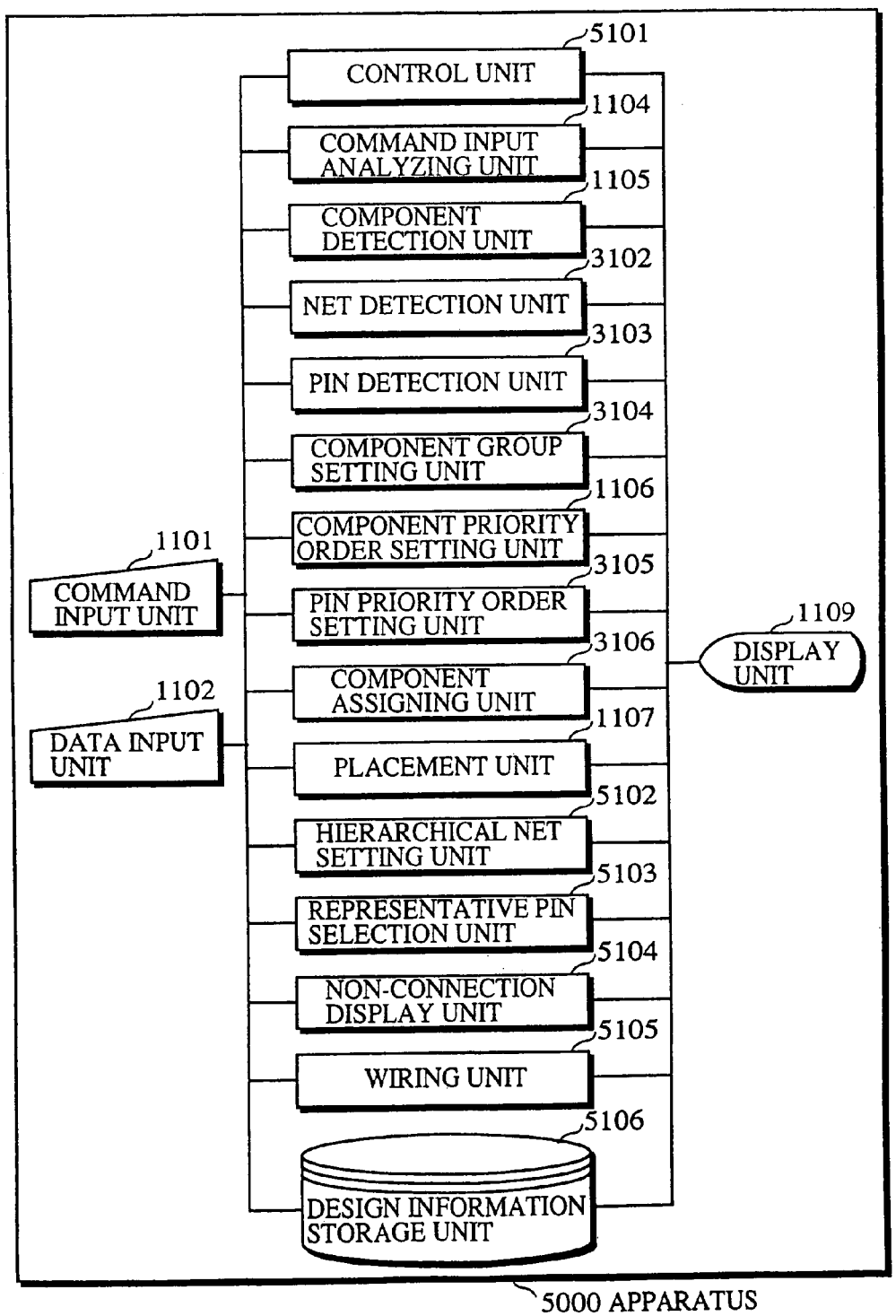
FIG. 34 is a is a block diagram showing the construction of the CAD apparatus 5000 of the fifth embodiment.

FIG. 34 is a block diagram showing the construction of a CAD apparatus 5000 in the present embodiment. In FIG. 34, compared with the CAD apparatus 3000 of the third embodiment shown in FIG. 21, the CAD apparatus 5000 includes a design information storage unit 5106 instead of the design information storage unit 3107, a control unit 5101 instead of the control unit 3101, and in addition a hierarchical net setting unit 5102, a representative pin selection unit 5103, a non-connection display unit 5104, and a wiring unit 5105. The following primarily explains the elements different from FIG. 21, omitting the common elements.

The design information storage unit 5106, in addition to the storage contents of the design information storage unit 3107 in FIG. 21, stores a hierarchical net information list 1801 set by the hierarchical net setting unit 5102.

FIG. 36 shows a specific example of the hierarchical net information list 1801. In FIG. 36 a net name 1802, in the same way as the net information, is an identifier that identifies a net, and is made up of net names which are of the net type "power" in the net information list 1401.

The contact pin number 1803 shows the pin number connecting to a net of the net name 1802.

The hierarchical net number 1804 is an identifier to identify a first hierarchical net which is formed by dividing a power net having a net name 1802.

The representative pin number 1805 shows a representative pin, amongst the pins belonging to a first hierarchical net, that is used to connect with another first hierarchical net. The above-described second hierarchical net connects the representative pins of a plurality of first hierarchical nets.

The hierarchical net contact pin number 1806 shows the pin number of a contact pin that connects first hierarchical nets.

The hierarchical net contact pin number 1806 has at least two pin numbers entered.

The hierarchical net setting unit 5102 refers to the net information from the design information storage unit 5106, retrieves a net name 1412 that is of the net type 1409 "power", and writes the net name 1412 into the net name 1822 in the hierarchical net information. Next, the hierarchical net setting unit 5102 refers to the contact pin number 1403, retrieves the contact pin number 1422 of the net name 1421, and writes the contact pin number 1422 to the contact pin number 1823 in the hierarchical net information. Next, the hierarchical net setting unit 5102 refers to the component information, retrieves the main component number 1208 and the auxiliary component numbers 1209 of the component belonging to the contact pin number 1823, gives a hierarchical net number to each main component number, and writes the pin number of the main component 1220 and the pin numbers, of the relevant auxiliary components 1230 into the hierarchical net contact pin number 1826. According to this, the power net is divided into nets, within each group, which are made up of a main component and the relevant auxiliary components.

The representative pin selection unit 5103 selects a component having the largest capacity from amongst the auxiliary components in a group, for each group corresponding to a first hierarchical net, and selects a pin of the component to connect to the first hierarchical net as the representative pin. In detail, the representative pin selection unit 5103 refers to the hierarchical net information list 1801, retrieves the pin number entered in the hierarchical net contact pin 1806, refers to the component information, and retrieves the component number 1223 set for the auxiliary component. In addition, the representative pin selection unit 5103 refers to the component master information of the component numbers 1223 set for the auxiliary components, and retrieves the C values 1323 of the relevant auxiliary components. Next, the representative pin selection unit 5103 compares the C values of the component numbers 1223 set for the auxiliary components, judges the component number 1230 having the greatest value, selects the judged component number as the representative pin, and writes the number into the representative pin number 1825 in the hierarchical net information list 1801.

The non-connection display unit 5104 displays non-connections of each of the first and second hierarchical nets of the display unit 1109, according to interactive operations by the user of the data input unit 1102. At this point, the first hierarchical nets and the second hierarchical net are displayed in different colors so as to be easily differentiable by the user.

The wiring unit 5105 wires the first hierarchical nets and the second hierarchical net each as independent nets, rather than the whole power net as one net, according to interactive operations by the user of the data input unit 1102. Furthermore, wiring of the non-connections displayed by the non-connection display unit 5104 is performed.

<Control Unit 5101>

The control operations when the control unit 5101 receives a second placement command are the same as in FIG. 24, and therefore will be omitted. Here, the control operations when the control unit 5101 receives a wiring command from the command input analyzing unit 1104 will be explained.

Figure 35:
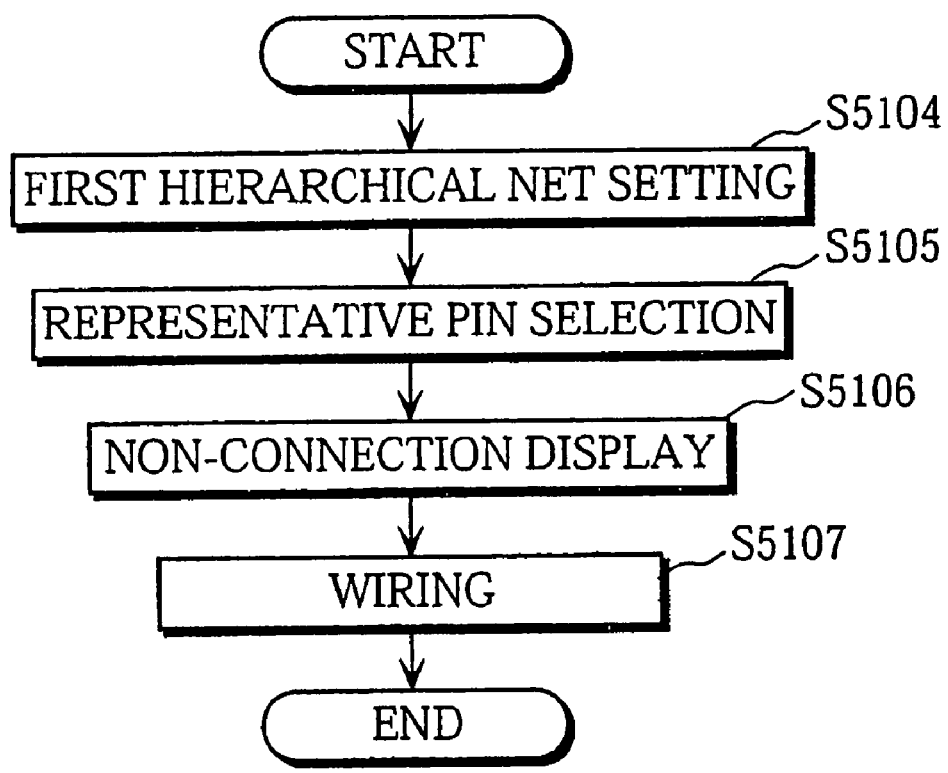
FIG. 35 is a flowchart showing the general operations of the CAD apparatus 5000.

FIG. 35 is a flowchart showing the process for performing wiring of the first hierarchical nets and the second hierarchical net, from when a wiring command is received.

The control unit 5101 receives a wiring command from the command input analyzing unit 1104 and activates the hierarchical net setting unit 5102 (S5104). The first hierarchical net setting unit 5102 refers to the component information, and writes the information into the hierarchical net information list 1801.

Figure 31:
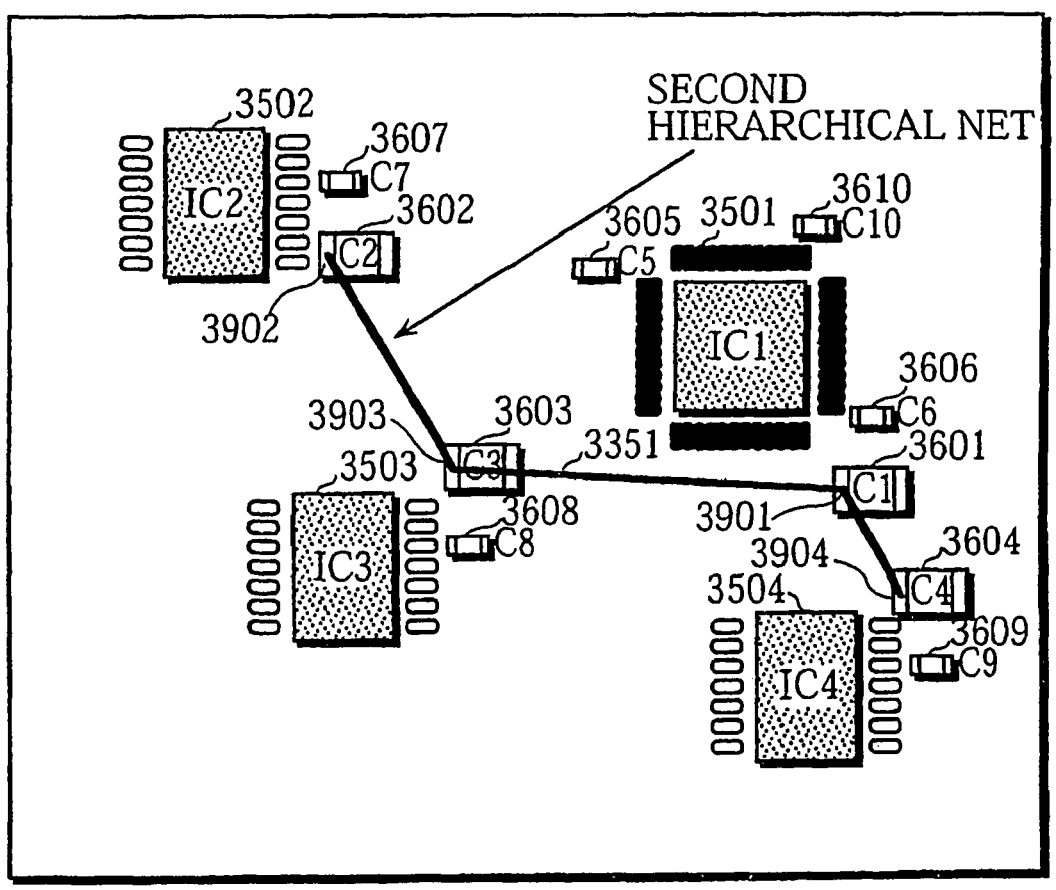
FIG. 31 is a conceptual figure showing a second hierarchical net.

Next, the control unit 5101 activates the representative pin selection unit 5103 (S5105). The representative pin selection unit 5103 refers to the hierarchical net information list 1801, retrieves the pin numbers entered in the hierarchical net contact pin 1806, refers to the component information, and retrieves the component numbers 1223 set for the auxiliary components. The representative pin selection unit refers to the component master information of the component numbers 1223 set for the auxiliary components, and retrieves the C values 1323 of the relevant auxiliary components. Next, the representative pin selection unit 5103 compares the C values of the component numbers 1233 set for the auxiliary components, judges the component number 1230 having the greatest C value, selects the judged pin number 1230 as the representative pin, writes the representative pin number 1825 into the hierarchical net information list 1801, and ends processing. FIG. 31 shows an example of the selection of representative pins. In FIG. 31 the representative pins are set respectively as: component 3601-pin 3901, component 3602-pin 3902, component 3603-pin 3903, and component 3604-pin 3904.

Figure 37:
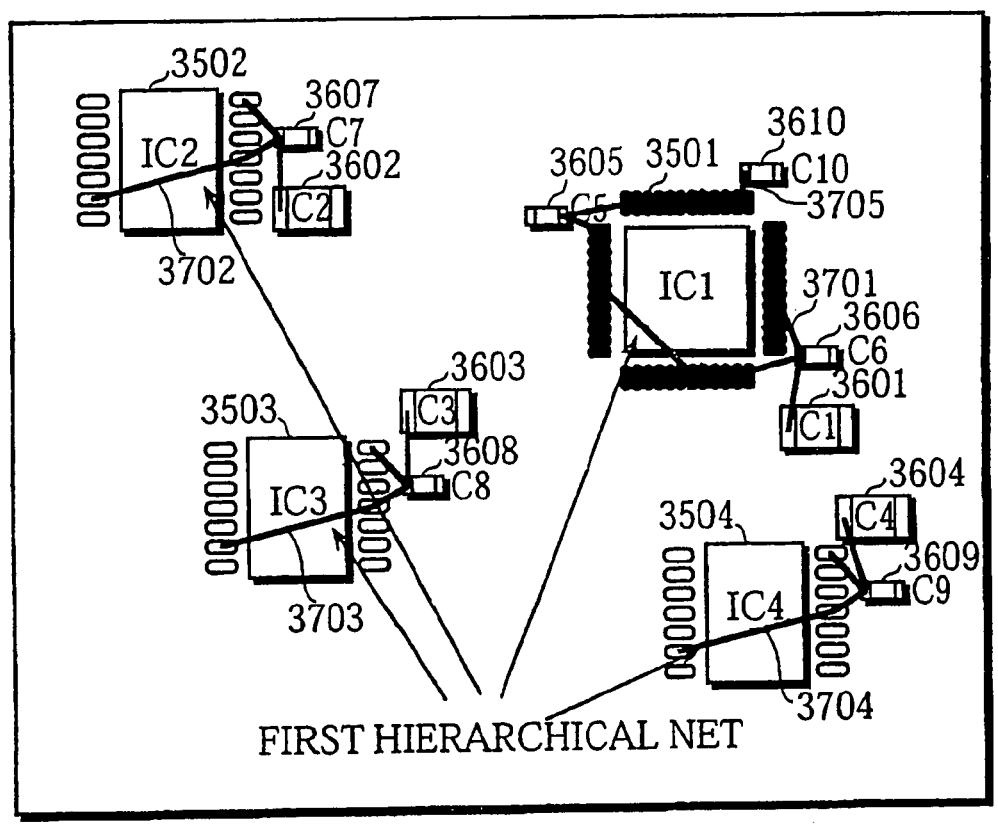
FIG. 37 is a conceptual figure showing first hierarchical nets.

Next, the control unit 5101 activates the non-connection display unit 5104 (S5106). The non-connection display unit 5104 displays the non-connections of the first hierarchical net and the second hierarchical net. FIG. 37 shows a display example of non-connections of first hierarchical nets. In FIG. 37, non-connections of four first hierarchical nets (the solid lines connecting components in FIG. 37) corresponding to groups of IC 1 to IC 4 are shown. FIG. 31 shows a display example of a non-connection of a second hierarchical net. In FIG. 31 a solid line connecting representative pins shows the non-connections. The non-connections are shown in a different state in each of FIG. 37 and FIG. 31 (such as a different color).

The control unit 5101 activates the wiring unit 5105 (S5107). The wiring unit 5105 performs wiring in accordance with the non-connections displayed by the non-connection display unit 5104. Please note that S5106 and S5107 are performed interactively with the user.

As explained above, in the present embodiment a plurality of first hierarchical nets are connected by a second hierarchical net through representative pins. The capacities of the representative pins are large, therefore it is difficult for noise signals in a first hierarchical net to propagate to other first hierarchical nets. In other words, it is difficult for a first hierarchical net to inflict noise on another first hierarchical net.

Please note that the representative pin selection unit 5103 may furthermore also select a second representative pin whose impedance is the second highest, a third representative pin whose impedance is the third highest, and so on, giving a plurality representative pins an order, and the wiring unit 5105 may, when a non-connection would occur (in other words when wiring would be impossible) when the first representative pin is used in wiring the second hierarchical net, wiring may be performed using the second representative pin.

In addition, the representative pin selection unit 5103 may choose a representative pin such as the second representative pin or the third representative pin so that the wiring of the second hierarchical net is as short as possible. In this case, while the representative pin selection unit 5103 makes the wiring of the second hierarchical net as short as possible, selection of a pin whose impedance is as high as possible is desirable.

Please note that in the fifth embodiment, the representative pin selection unit 5103 selects the pin of the component having the highest C value in the component master information list 1301 as the representative pin, but, it is sufficient for the impedance against noise to be high, a pin of a component whose L value is high may be selected.

In addition, in the fifth embodiment the representative pin selection unit 5103 selects the pin of the component having the highest C value in the component master information list 1301 as the representative pin, but the pin selection unit 5103 may extract the component shape 1232 corresponding to the component number 1230 in the component information list 1201, refer to the component shape information list 1701, refer to the pin spacing 1713 corresponding to the component shape 1710, and select a pin of a component whose pin spacing 1713 is large.

Please note that in the fifth embodiment the representative pin selection unit 5103 selects a pin of the component having the highest C value in the component master information list 1301 as the representative pin, but the representative pin selection unit 5103 may select a pin of a component whose priority is low in the component priority order 1207.

Furthermore, in the fifth embodiment the manner of selection of non-connection pin pairs in the non-connection display unit 5104 is not specified, but may be. performed in any of the following ways (a) to (e). (a) Pins of the auxiliary component with the lowest C value and a pin of the corresponding main component may be selected, from the components connected to a first hierarchical net, then, pin pairs may be selected in ascending order of C value, and non-connection display performed in this order. (b) A pin of the auxiliary component with the lowest L value and a pin of the corresponding main component may be selected, from the components connected to a first hierarchical net, and non-connection display performed. (c) A pin of the auxiliary component with the lowest L value and a pin of the corresponding main component may be selected, from the components connected to a first hierarchical net, then pin pairs selected in ascending order of L value, and non-connection display performed. (d) A pin of the auxiliary component with the smallest pin spacing and a pin of the corresponding main component may be selected, from the components connected to a first hierarchical net, and non-connection display performed. (e) A pin of the auxiliary component with the smallest pin spacing and a pin of the corresponding main component may be selected, from the components connected to a first hierarchical net, then pin pairs selected in ascending order of pin spacing, and non-connection display performed.

Please note that in the fifth embodiment no particular method of wiring by the wiring unit 5105 is designated, but the first hierarchical nets may be wired so wiring is as thick and short as possible, and the second hierarchical net may be wired so wiring is as thin and long as possible. Alternatively, the nets that are grouped into the first hierarchical nets and the second hierarchical net may be treated as nets which each have different names, and wired so that only the representative pins of each net are linked.

Sixth Embodiment

The apparatus of the present embodiment is an apparatus that aids a user to evaluate whether a component whose effects differ depending on the position in which the component is placed, such as a bypass capacitor, is placed appropriately. Furthermore, the apparatus displays the relationship of the bypass capacitor and the components on which the bypass capacitor may have an effect in such a way that the user can easily evaluate. Here, the relationship is relatively easily recognized because the bypass capacitor, the pins of the bypass capacitor, the switching element (hereafter represented by "IC") that will have noise reduced by the bypass capacitor, and the pins of the IC are displayed linked by a line on a monitor of the CAD apparatus, based on a correspondence stored in advance.

Furthermore, the relationship is made based on the spacing between the bypass capacitor and the pins of the bypass capacitor, and the IC and the pins of the IC.

Furthermore, the degree of effectiveness of each relationship is given a numerical value, and the display is differentiated in such a way that the user can easily evaluate. Here, relationships are displayed by lines of different thickness.

In addition, the effectiveness is not evaluated only by distance. The accuracy of evaluation is improved in response to reality by making the relationships by taking in to consideration things such as the matching of operation frequencies and the capacity of bypass capacitors.

<Construction>

Figure 38:
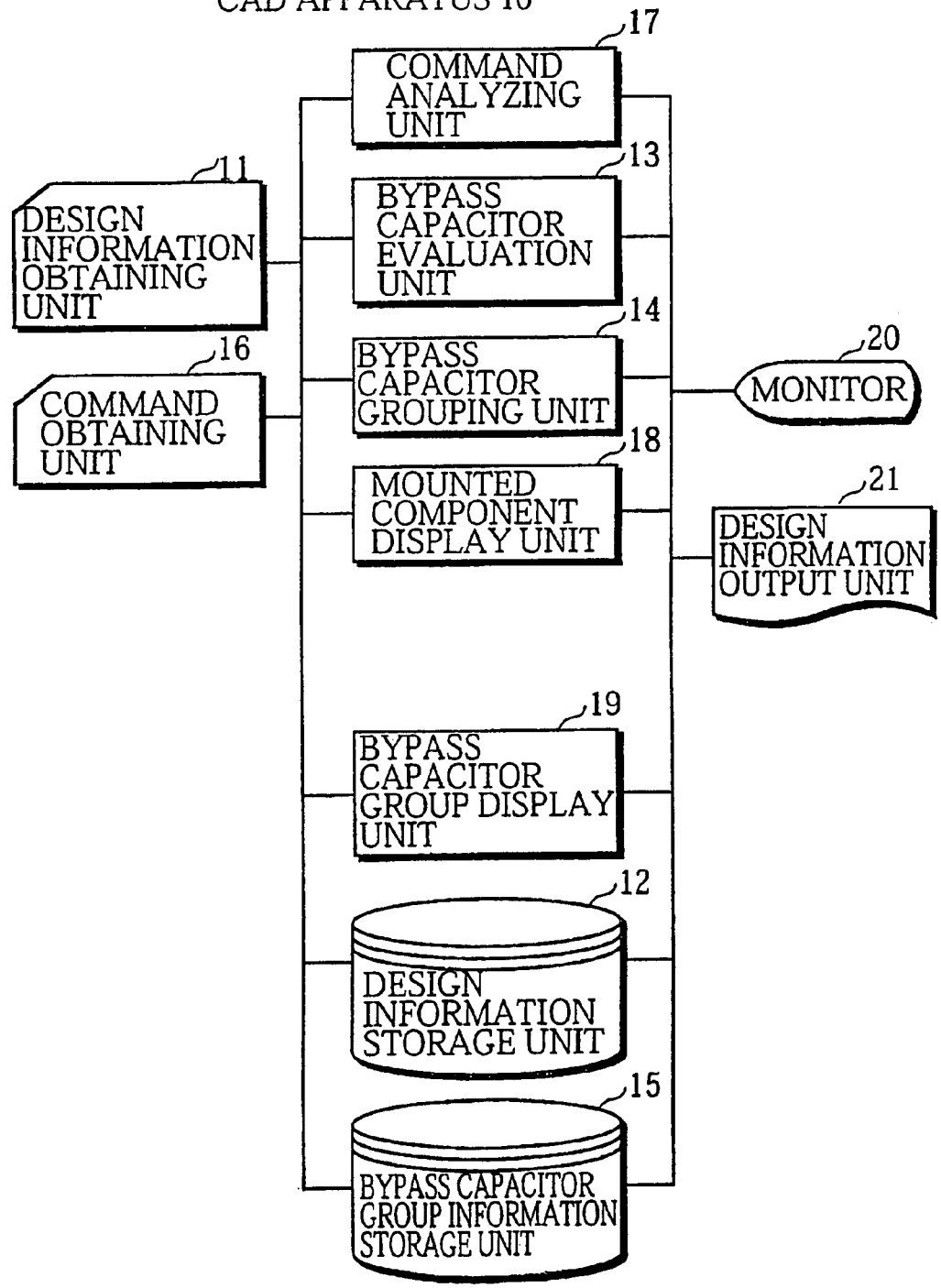
FIG. 38 is a diagram showing the construction of the CAD apparatus of the sixth embodiment.

FIG. 38 is a diagram showing the structure of the CAD apparatus of the present embodiment.

The CAD apparatus 10 shown in FIG. 38 includes a design information obtaining unit 11, a design information storage unit 12, a bypass capacitor evaluation unit 13, a bypass capacitor grouping unit 14, a bypass capacitor group information storage unit 15, a command obtaining unit 16, a command analyzing unit 17, a mounted component display unit 18, a bypass capacitor group display unit 19, a monitor 20, and a design information output unit 21.

The design information obtaining unit 11 obtains design information.

The design information storage unit 12 stores obtained design information.

FIG. 39A to FIG. 39C show examples of the design information obtained by the design information obtaining unit 11 and stored by the design information storing unit 12.

The design information is distinguished as component information, pin information, and net information.

As shown in FIG. 39A, the component information is made up of categories for component number, component name, component type, component characteristic, representative point coordinates, and minimum/maximum area.

Here, the component number is a number specifying each component.

The component name is a general component name. The component type is information showing the type of components, such as those shown as IC and capacitor.

Component characteristics shows characteristics such as electric characteristics, for example, for capacitors this is capacity (unit: [μF]), lead inductance and via inductance (unit: [nH]), and effective pin count (unit: number of pins).

The effective pin count is the number of IC power pins that a capacitor can be effective on simultaneously as a bypass capacitor.

The representative point coordinates are the coordinates of a representative point on a wiring board of a relevant placed component. For example, the relative coordinates of a first pin in relation to the top left of a wiring board.

The minimum/maximum area is coordinates showing the shape of a relevant placed component on a printed wiring board. For example, the relative coordinates of the top left and bottom right edges of the component in relation to the top left of the wiring board.

As shown in FIG. 39B, the pin information is made up of categories for information such as component number, pin number, net name, net type, operation frequency, pin characteristics, and representative point coordinates.

Here, the pin number is information specifying each component.

The pin number is information specifying each pin.

The net name is a name of a net for distinguishing electrically independent connection lines decided on for convenience in the CAD apparatus. Pins with the same name are electrically connected.

The net type shows whether a net to which a relevant pin belongs is connected to either the power or the ground, or is a general type connected to neither.

The operation frequency is the maximum frequency of a signal that flows through a relevant pin.

The pin characteristics show characteristics such as the electrical characteristics of a pin, for example, for an IC pin, the necessary capacity (unit: [μF]). The necessary capacity is the capacity with which an IC pin should be loaded.

The relative coordinates are the coordinates on a wiring board of a representative point of a relevant placed pin.

As shown in FIG. 39C, the net information is made up of categories for each of a net name, a component number, and a pin number. The net information is for specifying a pin number and a component number from the net name.

The bypass capacitor evaluation unit 13 performs evaluation which specifies ICs which each bypass capacitor uses effectively. Here, from the power pin of each bypass capacitor effectiveness is evaluated by specifying an IC having a power pin within a predetermined distance. In addition, the bypass capacitor puts the degree of effectiveness into a numerical value of effectiveness in accordance with the distance between the power pin of the bypass condenser and the power pin of the IC.

Furthermore, the distance mentioned here is a distance such as a straight line distance, a Manhattan distance, an actual wiring distance, and a path distance at which a loop area is a minimum. Here, the straight line distance is the shortest distance when power pins are linked by a straight line. The Manhattan distance is the distance between power pins linked by an segment on an X axis direction and a segment on Y axis direction. The actual wiring distance is the length of foil that has been wired. The path distance is the distance at which the area of current loop is a minimum when one of power and ground is a beta pattern (sheet, or foil of a wide width).

The bypass capacitor evaluation unit 13 uses the distances according to differences in the wiring pattern of ground and power, in for example, the following way.

For example, when both ground and power are beta patterns (sheet, or foil of a wide width) the straight line distance is used. When either power or ground is a beta pattern, and wiring has not been performed, Manhattan distance is used. When either power or ground is a beta pattern, and wiring has been performed, the path distance is used. When neither power or ground is a beta pattern, the actual wiring distance is used.

The distance calculated by the bypass capacitor evaluation unit 13 may be the actual wiring distance when wiring has been completed. When the both the ground and the power are beta patterns (sheet, or foil of a wide width), the straight line distance may be used. When either the ground or the power is a beta pattern, the path distance in which the area of a current loop is a minimum may be used.

The Manhattan distance is used when neither one nor both of ground and power is a beta patterns and the actual wiring cannot be taken into consideration due to wiring being expected to be limited to a vertical direction and a horizontal direction on the board when general wiring rules are followed, and when the path distance is one in which the loop is a minimum. The path distance in which the loop area is a minimum is used when the actual wiring can be taken into consideration but part is a beta pattern.

The bypass capacitor grouping unit 14, based on the evaluation result by the bypass capacitor evaluation unit 13, groups IC pins judged to be effective with the relevant bypass capacitor pins, and also makes group information which includes the addition of the effectiveness of each group. The bypass capacitor grouping unit 14 has the bypass capacitor group information storage unit 15 store the group information.

The bypass capacitor group information storage unit 15 stores the group information made by the bypass capacitor grouping unit 14.

FIG. 40 shows an example of the group information made by the bypass capacitor grouping unit 14 and stored by the bypass capacitor group information storage unit 15.

The group information shown in FIG. 40 is made up of categories for each of a group number, an IC number, an IC pin number, a bypass capacitor number, a bypass capacitor pin number, and effectiveness.

Here, group number is information specifying each group, IC pin number is information specifying each IC, the IC number is information specifying each IC pin, the bypass capacitor number is information specifying each bypass capacitor, the bypass capacitor pin number is information specifying each bypass capacitor pin, and the. effectiveness is a numerical value of the judged degree of effectiveness. Groups that are evaluated as being sufficiently effective have an effectiveness from 80 to 100, those with relatively high effectiveness from 60 to 79, those with moderate effectiveness 40 to 59, and those with low effectiveness 0 to 39.

Please note that in the example in FIG. 40 one group is made up of one IC pin and one bypass capacitor pin, but a group may be made up of a plurality of IC pins and one bypass capacitor pin, one IC pin and a plurality of bypass capacitor pins, or a plurality of IC pins and a plurality of bypass capacitor pins.

The command obtaining unit 16 obtains commands inputted by the user using a keyboard and a pointing device.

The command analyzing unit 17 analyzes commands obtained by the command analyzing unit 16.

The mounted component display unit 18 makes, based on the design information stored in the design information storage unit 12, for displaying on the a monitor 20, image data of each mounted component placed on a mounted board.

The bypass capacitor group display unit 19 modifies the image data made by the mounted component display unit 18 adapting the state so that the user can recognize that an IC pin and a bypass capacitor pin belong to the same group, based on the group information stored in the bypass capacitor information storage unit 15. For example, joining with a line, adapting the thickness of a display, the shape of a display (broken lines, wavy lines), display color, display shade, or display pattern.

The monitor 20 displays images made by the mounted component display unit 18 and the bypass capacitor group display unit 19, based on the modified data.

The design information output unit 21 is a device such as a printer, a plotter, a removable storage medium, or a driver connected to a predetermined network. The design information output unit 21 outputs design information stored in the design information storage unit 12.

<Display Operations>

The following explains the operations of the mounted component display unit 18 of the CAD apparatus 10 of the present embodiment, based on the design information stored in the design information storage unit 12, after making image data of each mounted component on a mounted board, the bypass capacitor group display unit 19, based on group information stored by the capacitor group information storage unit 15, modifies image data made be the mounted component display unit 18, adapting the state so that the user can recognize IC and bypass capacitor pins of the same group.

Figure 41:
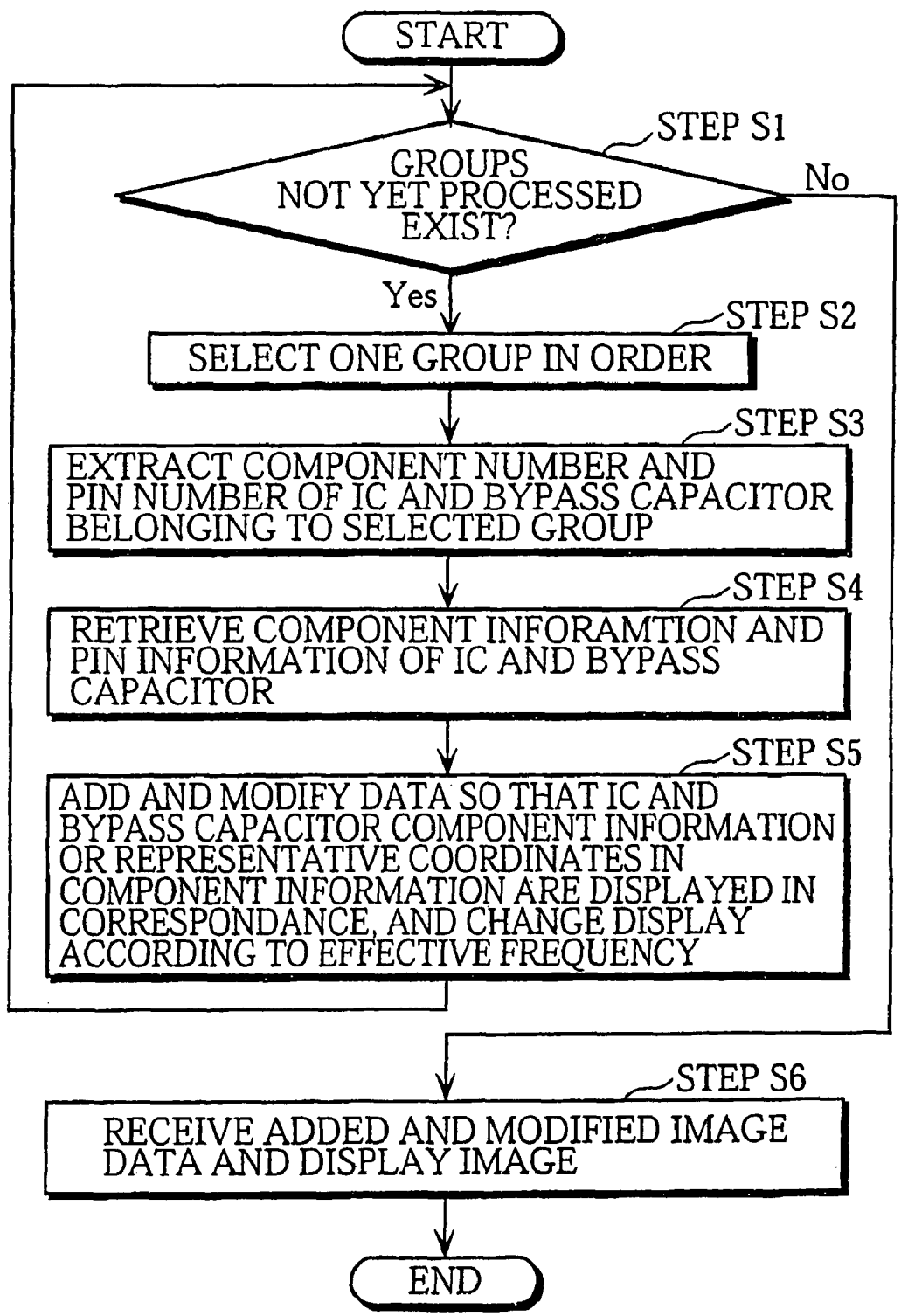
FIG. 41 is a diagram showing an example of the operations of the CAD apparatus 10 of the present embodiment.

FIG. 41 shows an example of the operation of the CAD apparatus 10 of the present embodiment.

The following uses FIG. 41 to explain the operation of the CAD apparatus 10 to modify image data, and display images.

(1) The CAD apparatus 10 judges whether there are still any groups in the bypass capacitor information storage unit that are to be processed (step S1). If there are none, the CAD apparatus 10 proceeds to a display process (step S6).

(2) If there are groups still to be processed, the CAD apparatus 10 selects groups one at a time from the bypass capacitor information storage unit 15 (step S2).

(3) The CAD apparatus 10 extracts, from the bypass capacitor group information storage unit 15, the component number and the IC pin number of the IC belonging to the selected group, in addition to the bypass capacitor component number, and the bypass capacitor pin number of the bypass capacitor belonging to the selected group (step S3).

(4) The CAD apparatus 10 retrieves, from the design information storage unit 12, the component information of the relevant IC based on the extracted IC component information, or retrieves the pin information of the relevant IC pin based on the retrieved component number of the IC and the pin number of the OC and retrieves the component information of the relevant bypass capacitor based on the retrieved component number of the bypass capacitor, or retrieves the pin information of the relevant bypass capacitor based on the retrieved component information of the bypass capacitor and the pin number of the bypass capacitor (step S4).

(5) The CAD apparatus 10 modifies the image data made by the mounted component display unit 18 so that the representative point coordinates in the retrieved component information of the IC, or the representative point coordinates in the retrieved pin information of the IC pin and the representative point coordinates in the retrieved component information of the bypass capacitor, or the representative coordinates in the retrieved pin information of the bypass capacitor are adapted and displayed in a state so that the user can easily recognize, then the CAD apparatus returns to the start to process the next group (step S5). For example, here, the representative points are joined by a line. Furthermore, according to the effectiveness attached to the group information, the thickness and shape (broken line, wavy line) are changed, such as a thick line when effectiveness is 80 to 100, an ordinary line when effectiveness is 60 to 79, a thin line when effectiveness is 40 to 59, and a broken line when effectiveness is 39 or less.

(6) After processing of all groups is finished, the monitor 20 receives the modified image data and displays the images (step S6).

The following shows a display example.

FIG. 42 is display examples of an image displayed on the monitor 20 when an IC pin and a bypass capacitor pin are linked by a line. Here, a power pin 511 of an IC 510 and a power pin 521 of a bypass capacitor 520 are considered to be stored in the bypass capacitor group information storage unit 15 as the same group.

Figure 42A:
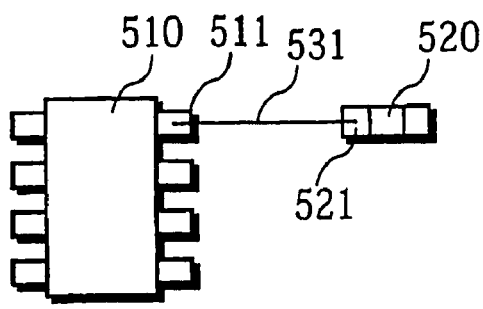
FIG. 42A is a display example of the image displayed on the monitor 20 when an IC pin and a bypass capacitor pin are linked by a line.

As shown in FIG. 42A, the IC power pin 511 and the bypass condenser power pin 521 are linked by a line 531.

Figure 42B:
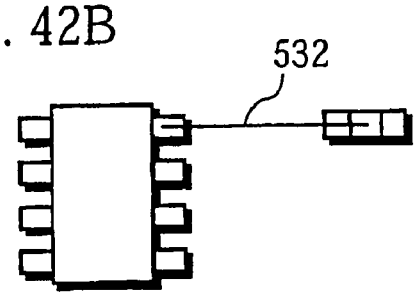
FIG. 42B is a display example of the image displayed on the monitor 20 when an IC pin and a bypass capacitor are linked by a line.

FIG. 42B is a display example of an image displayed on the monitor 20 when an IC pin is linked by a line to the center of a bypass capacitor. Here, the power pin 511 of the IC 510 and the bypass capacitor 520 are considered to be stored in the bypass capacitor group information storage unit 15 as the same group.

As shown in FIG. 42B, the IC power pin 511 and the center of the bypass condenser 520 are linked by a line 532.

Figure 42D:
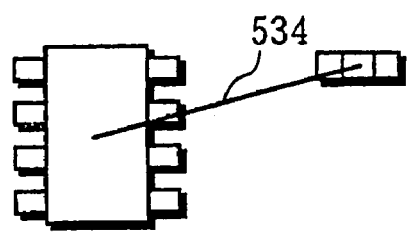
FIG. 42D is a display example of the image displayed on the monitor 20 when an IC and a bypass capacitor are linked by a line.
Figure 42C:
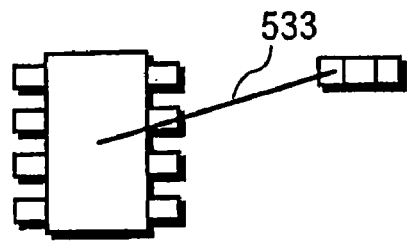
FIG. 42C is a display example of the image displayed on the monitor 20 when an IC and a bypass capacitor pin are linked by a line.

FIG. 42C is a display example of an image displayed on the monitor 20 when the center of an IC pin is linked by a line to a bypass capacitor. Here, the IC 510 and the power pin 521 of the bypass capacitor 520 are considered to be stored in the bypass capacitor group information storage unit 15 as the same group.

As shown in FIG. 42C, the center of the IC 510 and the power pin 521 of the bypass condenser 520 are linked by a line 533.

FIG. 42D is a display example of an image displayed on the monitor 20 when the center of an IC pin is linked by a line to the center of a bypass capacitor. Here, the IC 510 and the bypass capacitor 520 are considered to be stored in the bypass capacitor group information storage unit 15 as the same group.

As shown in FIG. 42D, the IC 510 and the bypass condenser 520 are linked by a line 534.

Please note that in FIG. 42A to FIG. 42D, one IC corresponds to one bypass condenser, but a plurality of ICs may correspond to one bypass capacitor, one IC to a plurality of bypass capacitors, or a plurality of ICs to a plurality of bypass capacitors.

Furthermore, a plurality of pins may belong to the same component or different components.

Figure 43A:
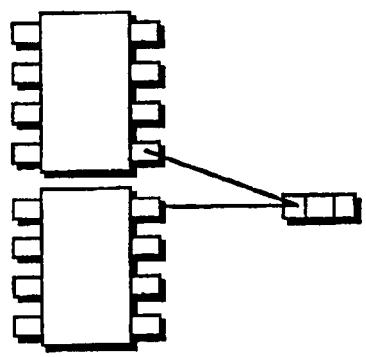
FIG. 43A is a diagram showing a display example of the image displayed on the monitor 20 when a plurality of IC pins and one bypass capacitor pin are linked by lines.

FIG. 43A is a display example of when a plurality of IC pins are linked by lines to one bypass capacitor pin.

Figure 43B:
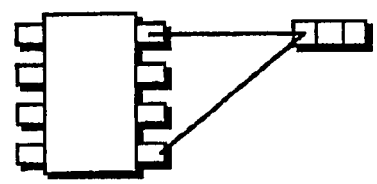
FIG. 43B is a diagram showing a display example of the image displayed on the monitor 20 when one IC pin and a plurality of bypass capacitor pins are linked by lines.

FIG. 43B is a display example of when one IC pin is linked by lines to a plurality of bypass capacitor pins.

Figure 43C:
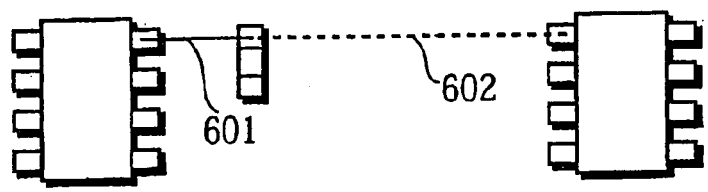
FIG. 43C is a diagram showing a display example of the image displayed on the monitor 20 when one pin of each of two ICs and one pin of a bypass capacitor are linked by a solid line and a broken line when effectiveness is taken into consideration.

FIG. 43C is a display example of when a pin of each of two bypass capacitors are linked by a solid line and a broken line taking effectiveness into consideration. Here, a display based on a group having sufficient effectiveness (effectiveness 80 to 100) is displayed with a solid line 601, while a display based on a group having relatively high effectiveness is displayed with a dotted line 602. Distinguishing the display state according to effectiveness allows for easier judgement of whether the placement of bypass capacitors in relation to ICs is appropriate.

Figure 44A:
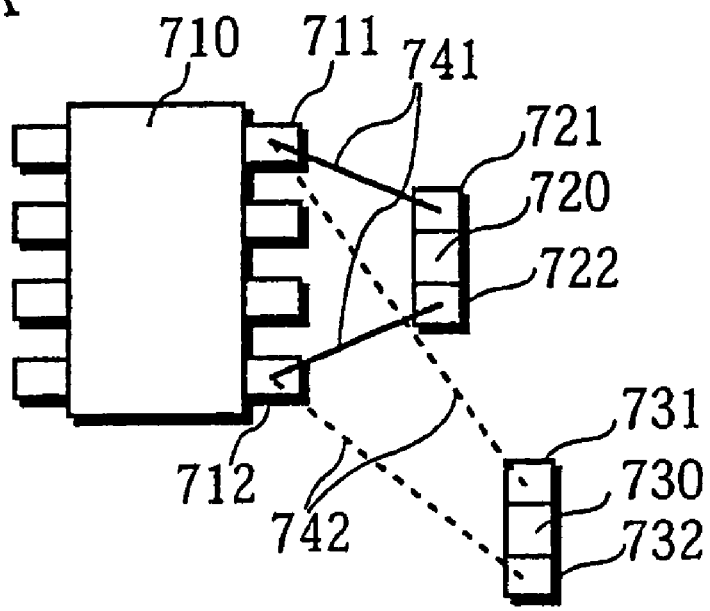
FIG. 44A is a diagram showing a display example of the image displayed on the monitor 20 when IC pins and bypass capacitor pins are linked by lines when effectiveness is taken into consideration.

FIG. 44A is a display example of an image displayed on the monitor 20 when an IC pin and a bypass capacitor pin are linked by a line, taking effectiveness into consideration. Here, a power pin 711 of an IC 710, a power pin 721 of a bypass capacitor 720, and a power pin 731 of a bypass capacitor 730 are considered to be stored as the same group in the bypass capacitor group information storage unit 15. A ground pin 712 of an IC 710, a ground pin 722 of a bypass capacitor 720, and a ground pin 732 of a bypass capacitor 730 are considered to be stored as the same group in the bypass capacitor group information storage unit 15.

As shown in FIG. 44A, a display based on the group of the IC power pin 711 and the bypass condenser power pin 721, and the group of the IC ground pin 712 and the bypass condenser ground pin 722, which have sufficient effectiveness (effectiveness 80 to 100) within each group, are each displayed with a solid line 741. The group of the IC power pin 711 and the bypass condenser power pin 731, and the group of the IC ground pin 712 and the bypass condenser ground pin 732, which have relatively high effectiveness (effectiveness 60 to 79) within each group, are displayed with a solid line 741.

Figure 44B:
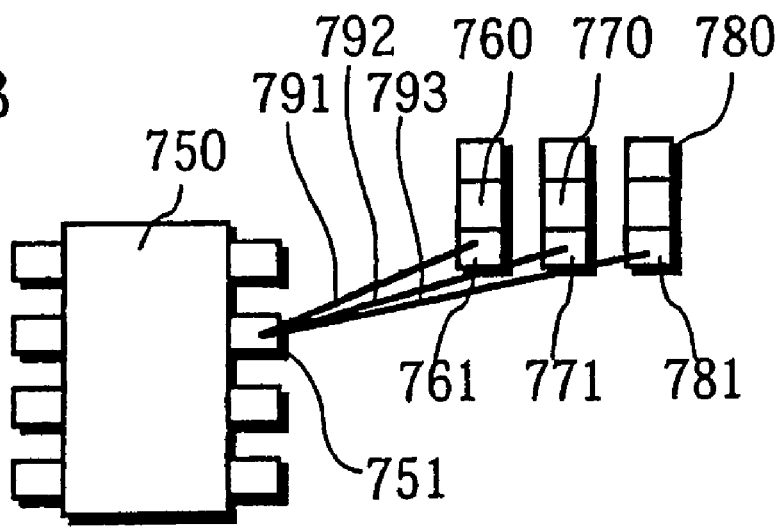
FIG. 44B is a diagram showing a display example of the image displayed on the monitor 20 when IC pins and bypass capacitor pins are linked by lines of differing thickness according to effectiveness.

FIG. 44B shows a display example of an image displayed on the monitor 20 when IC pins and bypass condenser pins are linked by lines of different thickness according to effectiveness. Here, a power pin 751 of an IC 750, a power pin 761 of a bypass capacitor 760, a power pin 771 of a bypass capacitor 770, and a power pin 781 of a bypass capacitor 780 are considered to be stored as the same group in the bypass capacitor group information storage unit 15.

As shown in FIG. 44B, the IC power pin 751 and the bypass capacitor power pin 761 are linked by a thick line 791, the IC power pin 751 and the bypass capacitor power pin 771 are linked by a line of ordinary thickness 792, and the IC power pin 751 and the bypass capacitor power pin 781 are linked by a thin line 793.

Here, the distance between an IC pin and a bypass capacitor pin is d[mm], dmin=2 [mm], and the effectiveness $\alpha$ is defined by the following formula.

· when $d > d\text{min}$ $$\alpha = (d\text{min}/d) \times 100$$

· when $d \leq d\text{min}$ $$\alpha = 100$$

For example, if the distance between the power pin 751 and the power pin 761 is 4 mm, the distance between the power pin 751 and the power pin 771 is 6 mm, and the distance between the power pin 751 and the power pin 781 is 8 mm, the effectiveness is respectively 50, 33, and 25.

Please note that here the effectiveness was found using a specific mathematical formula based on the distance between an IC pin and a bypass capacitor pin, but the effectiveness may be found using any guide which shows whether a bypass capacitor is effective.

Furthermore, here the effectiveness is defined by a numeric value up to 100, but the effectiveness may be defined using any comparison judgement such as a three level expression A, B, and C, or a 5 level expression 1 to 5.

Furthermore, here difference in effectiveness was displayed by distinguishing with solid lines and dotted lines, and by changing the thickness of lines according to effectiveness, but any method of display that distinguishes effectiveness is possible. For example, the color of lines, the shade of lines, or the pattern of lines. Furthermore, effectiveness may be distinguished not by linking pins, but by the display state of the pins themselves.

In this way, the display state can be distinguished according to effectiveness, allowing for easier judgement of whether the placement of bypass capacitors in relation to ICs is appropriate.

Furthermore, here, corresponding IC pins and bypass condenser pins are displayed linked by lines, but any method in which corresponding IC pins and bypass capacitor pins can be distinguished visually may be used. For example, corresponding IC pins and bypass capacitor pins maybe displayed in the same state (such as thickness, shape, color, shade, pattern, and highlighting), or a list of correspondence may be displayed. Furthermore, as the above-described state, display may be different according to which side of a board pins are on. Display may also be temporary, and display may be deleted or started if the user so instructs.

<Grouping Operations>

The following will explain the operations of the bypass capacitor evaluation unit 13 of the CAD apparatus 10 of the present embodiment performing evaluation to specify ICs that use each bypass capacitor effectively, the bypass capacitor grouping unit 14 grouping the IC pins judged to be relevant with the respective bypass capacitor pins based on the evaluation results by the bypass capacitor evaluation unit 13, making group information which has the effectiveness added, and having the bypass capacitor information storage unit 15 store the information.

Figure 45:
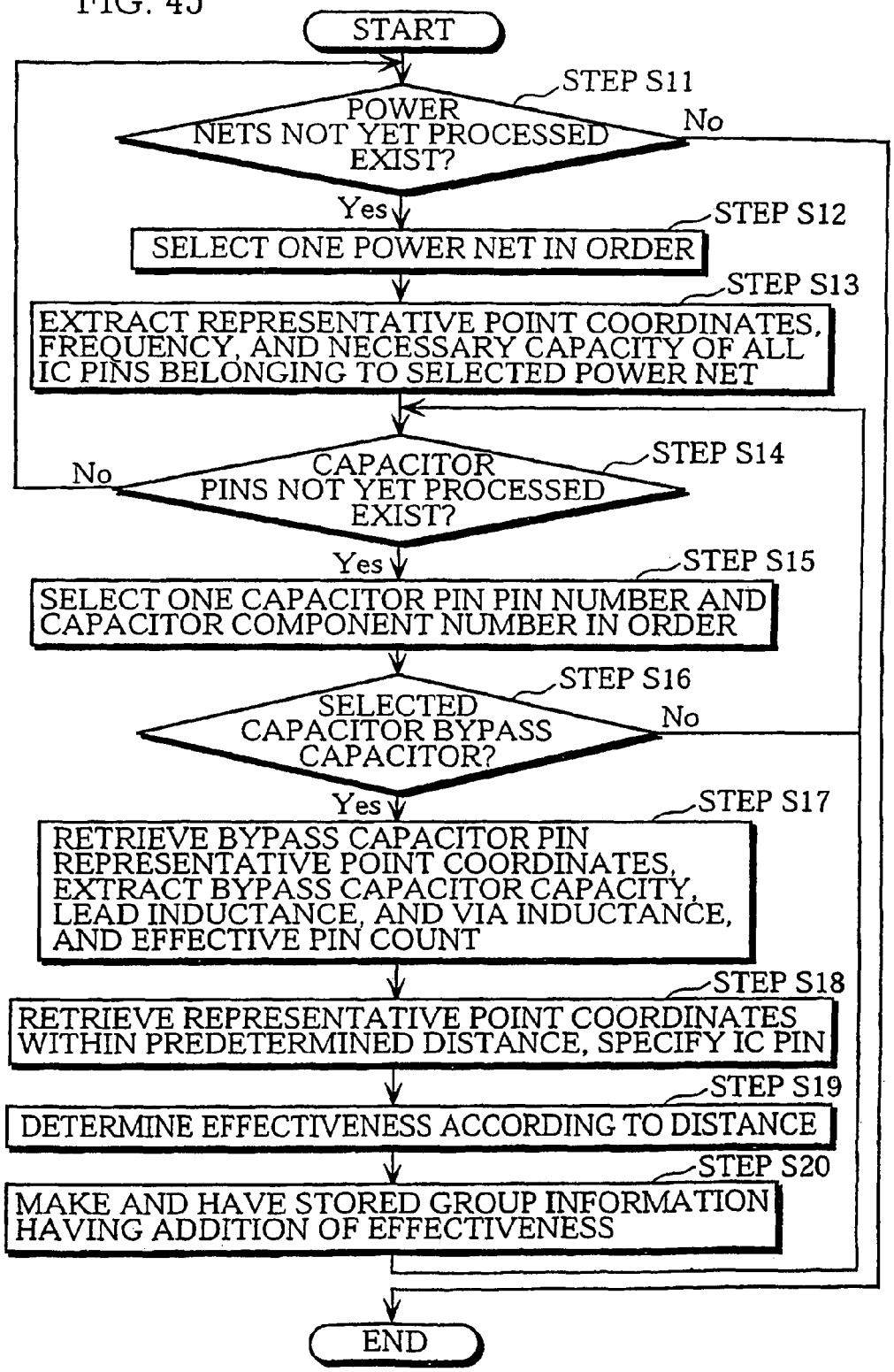
FIG. 45 is a diagram showing an example of the operations of the CAD apparatus 10 in the present embodiment.

FIG. 45 shows an example of the operations of the CAD apparatus 10 of the present embodiment.

The following explains the operations when the CAD apparatus 10 evaluates each bypass capacitor, and makes and stores group information, using FIG. 45.

(1) The CAD apparatus 10 judges whether there are any power nets in the information list stored in the design information storage unit 12 that have not been processed (step S11). If there are none the processing ends.

(2) If there are power nets that have not been processed, the CAD apparatus 10 selects one power net at a time successively from the net information stored in the design information storage unit 12 (step S12).

(3) The CAD apparatus 10 extracts the representative point coordinates, the frequency, and the necessary capacity for all IC pins belonging to the selected power net, from the pin information stored in the design information storage unit 12 (step S13).

(4) The CAD apparatus 10 judges whether there are any capacitor pins connected to the selected net that have not been processed (step S14). If there are none the CAD apparatus 10 proceeds to process the next net (step S11).

(5) If there are capacitor pins that have not been processed, the CAD apparatus 10 selects the pin number of a pin and the component number of the component to which the pin belongs, one at a time successively from the net information stored in the design information storage unit 12 (step S15).

(6) The CAD apparatus 10 refers to the pin information stored in the design information storage unit 12 and judges whether, amongst the pins of the selected capacitor, a pin not belonging to a power net belongs to a ground net (step S16). If the pin does not belong to a ground net, the CAD apparatus 10 judges the relevant capacitor not to be used as a bypass capacitor, and proceeds to process the next capacitor pin (step 14). If the pin belongs to a ground net, the CAD apparatus 10 judges the relevant capacitor to be a bypass capacitor and continues the processing.

(7) The CAD apparatus 10, based on the pin number of the bypass capacitor pin and the component number of the bypass capacitor, retrieves the representative point coordinates of the relative bypass capacitor pin in the pin information, and extracts the capacity, the lead and via inductance, and the effective pin count from the component information of the bypass capacitor stored in the design information storage unit 12 (step 17).

(8) The CAD apparatus 10 retrieves sets of representative point coordinates that are within a predetermined distance of the representative coordinates of the bypass capacitor pin from the sets of representative point coordinates extracted at step 13, and specifies the ICs having the retrieved sets of representative point coordinates (step S18).

Furthermore, when taking the effective pin count into consideration, when the number is greater than the effective pin count of the capacitor, the IC pins of the IC equivalent to the excess amount are not specified.

Here, when taking the frequency characteristics of the bypass capacitor and the ICs into consideration, IC pins of ICs of which the frequency characteristics do not match those of the bypass capacitor are not specified.

Furthermore, when taking capacity into consideration, if the capacity of the capacitor is insufficient, IC pins of the ICs equivalent to the insufficient amount are not specified.

(9) The CAD apparatus 10 determines the effectiveness of the representative point coordinates of the bypass capacitor pin and representative point coordinates of the ICs that are within the predetermined distance, according to the distance (step S19).

(10) The CAD apparatus 10 groups the respective pin information of the bypass capacitors and the pin information of the IC pins judged to be effective, makes group information adding the effectiveness to the information, has the bypass capacitor group information storage unit 15 store the information, and proceeds to process the next capacitor pin at step S14 (step S20).

Figure 46A:
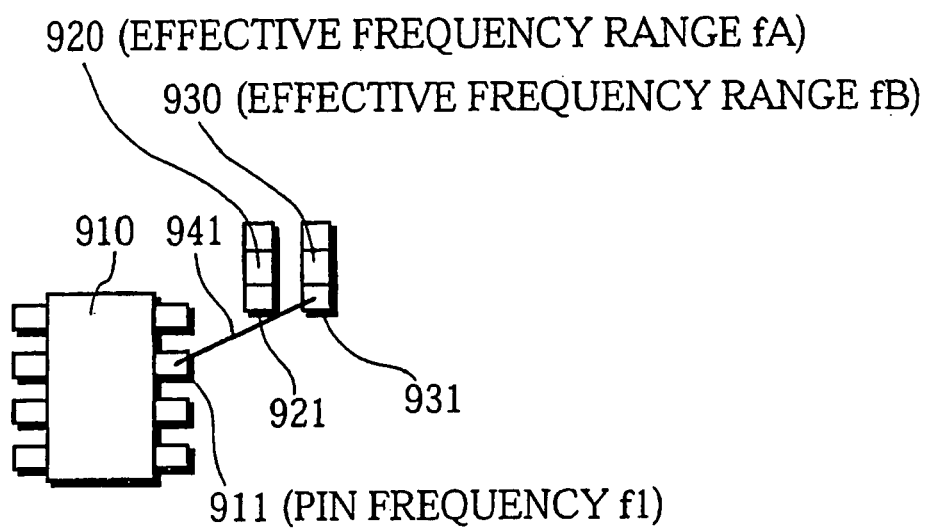
FIG. 46A is a display example of the image displayed on the monitor 20 when frequency characteristics are taken into consideration.

FIG. 46A shows a display example of an image displayed on the monitor 20 when frequency characteristics are taken into consideration. Here, a power pin 911 of an IC 910, a power pin 921 of a bypass capacitor 920, and a power pin 931 of a bypass capacitor 930 are stored as the same group in the bypass capacitor group information storage unit 15. The effective frequency range of the power pin 921 is fA, and the effective frequency range of the power pin 931 is fB. The pin frequency f1 of the power pin 911 is included in the effective frequency range fA, but not in the effective frequency range fB.

As shown in FIG. 46A, the power pin 921 is closer than the power pin 931 to the power pin 911, but is not grouped with the power pin because of differing frequency characteristics. As a result, the power pin 911 and the power pin 931 are linked by a line 941.

Figure 46B:
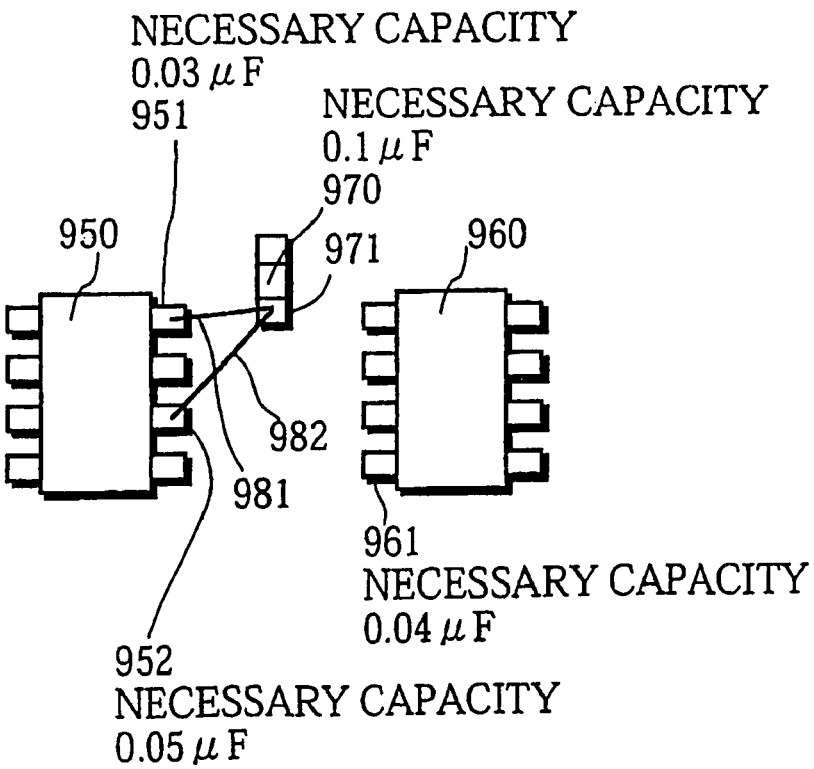
FIG. 46B is a display example of the image displayed on the monitor 20 when capacity is taken into consideration.

FIG. 46B shows a display example of an image displayed on the monitor 20 when capacity is taken into consideration. Here, a power pin 951 of an IC 950, a power pin 952 of the IC 950, a power pin 961 of an IC 960, and a power pin 971 of a bypass capacitor 970 are stored as the same group in the bypass capacitor group information storage unit 15. The necessary capacity of the power pin 951 is 0.03 [µf], the necessary capacity of the power pin 952 is 0.05 [µf], the necessary capacity of the power pin 961 is 0.04 [µf], and the necessary capacity of the bypass capacitor 970 is 0.1 [µf].

As shown in FIG. 46B, the IC power pin 951 and the bypass capacitor power pin 971 are linked by a line 981, and the IC power pin 952 and the bypass capacitor power pin 971 are linked by a line 982, but the IC power pin 961 and the bypass capacitor 971 are not linked. This is because the total of the necessary capacity of the power pin 951 and the power pin 952 is 0.03+0.05=0.08 [μf], which does not exceed the capacity of the bypass capacitor 970 which is 0.1 [μf], therefore the capacity is sufficient. However, when the total of the necessary capacity of the power pin 961 is further added: 0.08+0.04=0.12 [μf], the capacity 0.1 [μf] of the bypass capacitor 970 is exceeded, and the capacity is insufficient.

Please note that in the present embodiment the CAD apparatus 10 judges whether an IC pin is within a predetermined distance of a bypass capacitor and specifies the IC, based only on power net information, but the judgment may be based not only on power net, but may be based only on ground net, or on both power net and ground net.

Furthermore, the CAD apparatus 10 does not have to judge whether an IC pin is within a predetermined distance, but may specify the IC pin with the closest distance, or may specify a predetermined number of IC pins in order of closeness, and give effectiveness in order.

Furthermore, the CAD apparatus 10 may retrieve IC pins in advance, and specify bypass capacitors from IC pins.

Furthermore, in the present embodiment each set of coordinates is two-dimensional as the thickness of a wiring board is not taken into consideration, but each set of coordinates may be three-dimensional to take the thickness of the wiring board into consideration, in order to calculate a more accurate distance.

Figure 47:
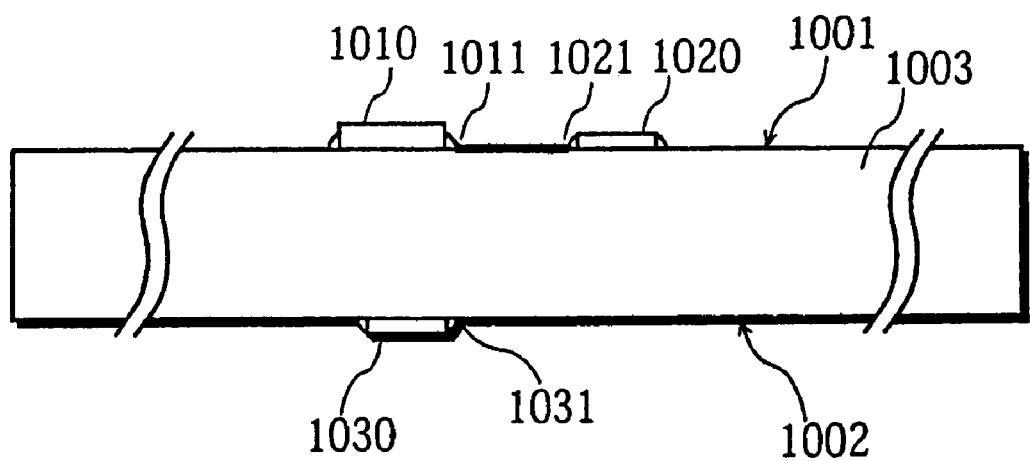
FIG. 47 is a diagram showing a cross section of a wiring board for explaining an outline of the method of calculating a more accurate distance when the thickness of the wiring board is also taken into consideration.

FIG. 47 shows a cross section of a wiring board in order to explain an outline of the method of calculating a more accurate distance taking into consideration the thickness of the wiring board.

Here, for simplicity, an IC pin whose distance is closest to a bypass capacitor pin is specified, based only on power net.

In FIG. 47 an IC 1010 and a bypass capacitor 1020 are placed on a component surface 1001 (top surface) of a printed wiring board 1003, and a bypass capacitor 1030 has been placed on a soldered surface 1002 (bottom surface).

Here, a pin 1011 of the IC 1010, a pin 1021 of the bypass capacitor 1020, and a pin 1031 of the bypass capacitor 1030 belong to the same power net. The pin 1011 and the pin 1021 are connected at the distance shown in FIG. 47 by a wire 1030. The bypass capacitor whose distance is the closest to the pin 1011 is, if the thickness of the wiring board is not taken into consideration, the pin 1031, but is the pin 1021 if the thickness of the wiring board is considered.

Next, a supplementary explanation will be given regarding the path distance in which the loop area is a minimum.

Figure 48:
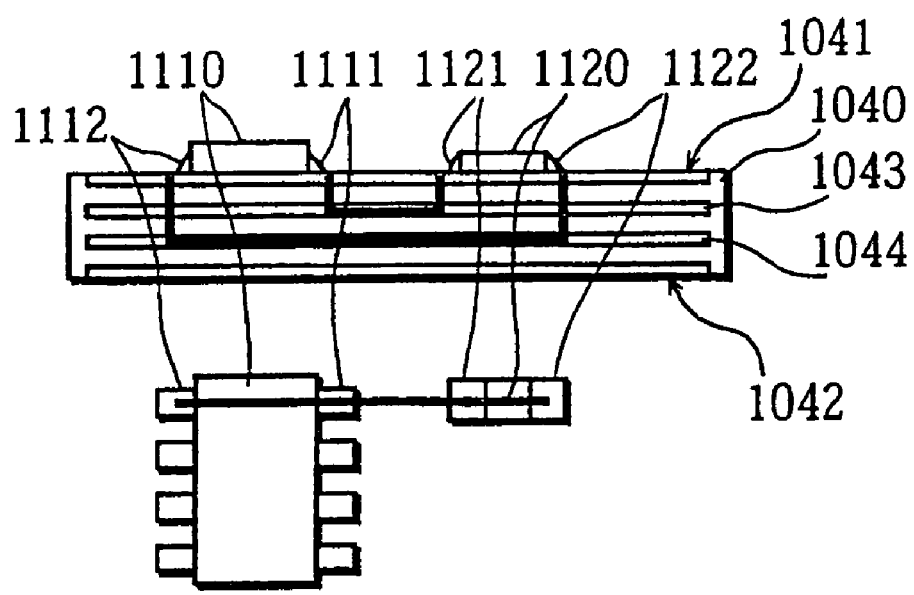
FIG. 48 is a figure showing a side view and a top view of a wiring board for explaining an example of a method of calculating a path distance in which a loop area is smallest.

FIG. 48 is a side view and a top view of a wiring board for explaining an example of calculating a path distance in which the loop area is a minimum in a multilayer wiring board.

An IC 1110 and a bypass capacitor 1120 are placed on the component surface 1041 (top surface) of the wiring board 1040 shown in FIG. 48. Furthermore, both an inner layer 1043 which is a power layer, an inner layer 1044 which is a ground layer, are beta patterns.

Here, a pin 1111 of the IC 1110, and a pin 1121 of the bypass capacitor 1120 belong to the same power net as the inner layer 1103. A pin 1112 of the IC 1110, and a pin 1122 of the bypass capacitor 1120 belong to the same ground net as the inner layer 1104. The current path in which the area of the loop is the smallest is as a path 1131 and a path 1132 shown in FIG. 48. Therefore, a path distance in such a case, is a route distance determined without taking the thickness into consideration, plus twice the distance from the surface to the inner layer.

Figure 49:
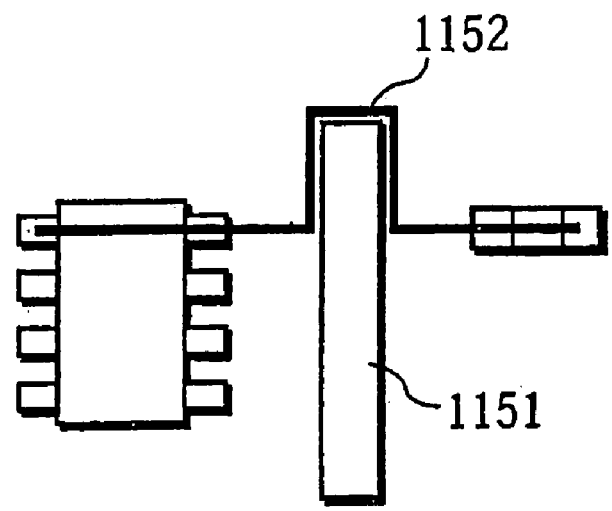
FIG. 49 is a figure showing a top view of a wiring board for explaining a method of calculating a path distance in which a loop area is smallest.

FIG. 49 is a top view of the printed wiring board for explaining an example of the method of calculating a route distance so that a loop area is a minimum.

Here, almost the entire ground layer is a beta pattern, therefore if there is a slit 1151 as shown in FIG. 49, the current that flows through the power layer must take a path 1152 around the slit 1151.

Here, almost the entire ground layer is a beta pattern, therefore the current that flows through the ground layer can take a route that is a straight line, but in that case the loop area will not be a minimum, so the end result is that the current takes the same route as the route 1152 of the power layer.

Furthermore, when the distance is calculated more accurately by making each set of coordinates three-dimensional, there are cases in which bends occur in a route that will make a loop area a minimum. In such a case it is possible to find by persistent, precise examination and simulation, however a path in which the area of a path projected on an appropriate specified surface is a minimum may be found and substituted.

Next, a supplementary explanation will be given regarding the method of making group information when taking frequency characteristics into consideration.

(1) In the specification of an IC pin shown at step S18 in FIG. 45, the resonance frequency (hereafter "f0") of a bypass capacitor is calculated from the capacity (hereafter "C"), the lead and via inductance (hereafter "L") obtained at step 17, using the following formula.

$$f0 = 1/(2\pi\sqrt{(LC)})$$

Figure 50:
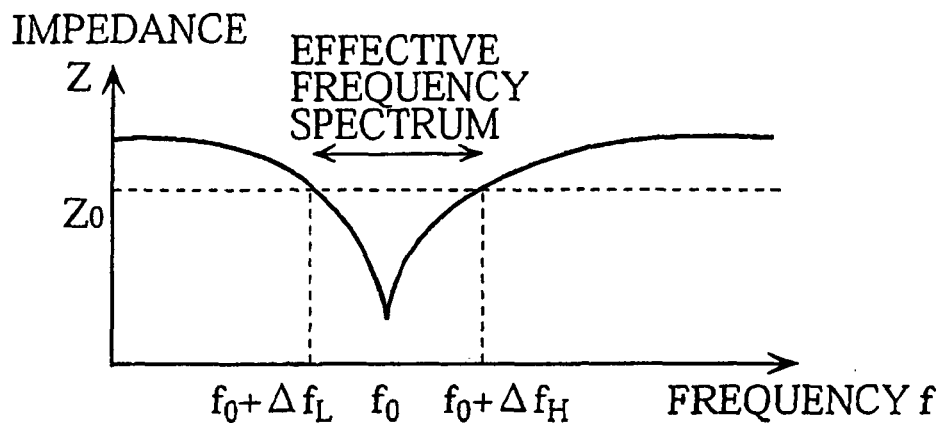
FIG. 50 is a diagram showing the relationship between the frequency f and the impedance Z of a bypass capacitor.

FIG. 50 shows the relationship between the impedance Z of a bypass capacitor and the frequency f.

As shown in FIG. 50, the impedance Z of the bypass is at a minimum when the frequency f=f0.

Here, if the bypass capacitor is effective against a frequency in a range that takes an impedance of no more than a specified value Z0, the effective frequency range f is written as:

$$f = f0 - \Delta fL \sim f0 + \Delta fH$$

(2) The pins retrieved at step S18 in FIG. 45 belong to either a power net or a ground net, therefore, although generally the pins themselves do not have a frequency, current such as a switching current that includes high frequency components does occur in pins that in pins according to the operation frequency of the internal circuit that uses the pin as power or ground.

Figure 51A:
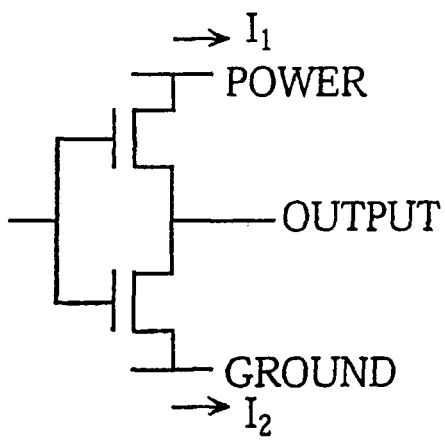
FIG. 51A is a diagram showing a device model for calculating the frequency of an IC pin belonging to a power net or a ground net.

FIG. 51A shows a device model for calculating the frequency of an IC pin belonging to either a power network or a ground network.

A simulation of the circuit shown in FIG. 51A is performed. The waveform is found as a pin current I(t), I(t) being the current that flows through the power pin or the current that flows through the ground pin.

Figure 51B:
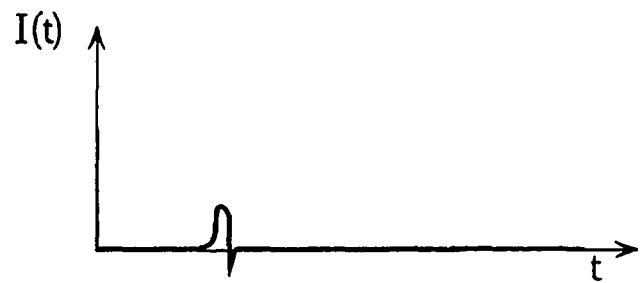
FIG. 51B is a diagram showing the relationship between the pin current I(t) and time t.

FIG. 51B shows the relationship between the pin current I(t) and time t.

The waveform shown in FIG. 51B is transformed by Fourier transformation as the current I(f) of a frequency domain.

Figure 51C:
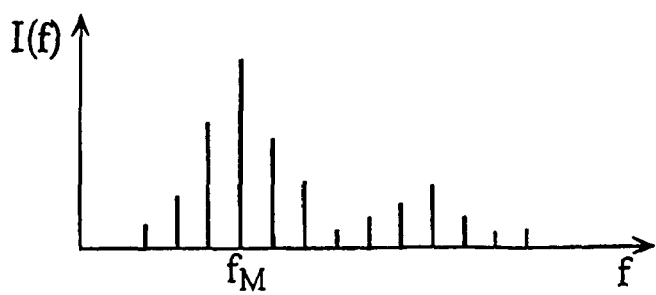
FIG. 51C is a diagram showing the relationship between the frequency domain of the current I(f) and the frequency f.

FIG. 51C shows the relationship between the current I(f) of the frequency domain and the frequency f.

As shown in FIG. 51C, the frequency that takes the maximum value of I(f) is made fM, and fM is made the frequency of the IC pin.

The frequency of the IC pin is stored in advance as pin information in the design information storage unit 12, and extracted at step S13 in FIG. 45.

(3) At step S18 in FIG. 45, only when the frequency extracted at step S13 is included in the effective frequency range f, is the IC pin specified.

Please note that an IC may have not only one frequency, but a plurality of frequencies.

Furthermore, the effective frequency range f of a bypass capacitor does not have to be found from the L, C, Z0 and so on using a formula, but may be stored in advance.

Furthermore, the frequency of an IC pin does not have to be derived from a device model, but may be found by actually measuring, or defined as the maximum internal frequency of the IC, or derived by any of a number of methods, or given in advance.

Furthermore, the pin frequency does not have to be the frequency which takes the maximum value of the current I(f) of the frequency domain, but frequencies exceeding a predetermined value may all be made pin frequencies.

Next, a supplementary explanation will be given regarding the method of making group information when capacity is taken into consideration.

When specification of the IC pin shown in step S18 of FIG. 45 is performed, when taking capacity into consideration, the necessary capacity of the IC pin extracted at step S13 and the capacity of the bypass capacitor extracted at step S17 are compared, and the IC pin is specified only when the necessary capacity of the IC pin is less that the capacity of the bypass capacitor.

Furthermore, when the total of the necessary capacity of a plurality of IC pins is within a range not exceeding the capacity of the bypass capacitor, one bypass capacitor may be grouped corresponding with a plurality of IC pins.

Furthermore, when one bypass capacitor is grouped corresponding with a plurality of IC pins, it is rare that the output corresponding to each IC pin is actually switched simultaneously. Therefore, rather using the total of the necessary capacity of the plurality of IC pins as is, the ratio of being switched simultaneously may be set, and a revised value of the total of the necessary capacity multiplied by the ratio may be used. For example, in the example shown in FIG. 46B, if the ratio of being switched simultaneously is 0.8, the total necessary capacity of the three IC pins "0.12 μF" is multiplied by the ratio "0.8", the result being "(0.12× 0.8=) 0.096 μF". This value is less than the bypass capacitor "0.1 μF", so the three IC pins can be grouped.

The following explains an example of calculating the necessary capacity of an IC pin.

Here, the excess current ΔI of a pin, and the noise margin ΔV allowed in a pin are given.

Here the impedance X is sought using the following formula.

$$X = \Delta V / \Delta I$$

If the internal operation frequency of an IC is f, the necessary capacity Ci is sought using the following formula.

$$Ci = 1/(2\pi f X)$$

Please note that the impedance X and the necessary capacity Ci are calculated using a formula, from a state in which the excess current ΔI and the noise margin ΔV are already given, but the excess current ΔI and the noise margin ΔV themselves can also be calculated using a formula.

Furthermore, the necessary capacity is sought using a simple formula, but the necessary capacity may be derived from a device model in the same manner as the frequency of the IC pin, by any other method, or may be previously given.

As explained above, according to the CAD apparatus 10 of the present embodiment, corresponding relationships are made based on the distance between pins that is estimated to be actually closer, taking into consideration things such as the matching of operation frequencies and the capacity of bypass capacitors, and bypass capacitors and switching elements that have corresponding relationships can be displayed linked by lines according to the degree of effectiveness.

Seventh Embodiment

<Outline>

The present embodiment discovers bypass capacitor placement leaks easily by retrieving and highlighting switching elements and pins of switching elements that do not correspond with any bypass capacitors.

<Construction>

Figure 52:
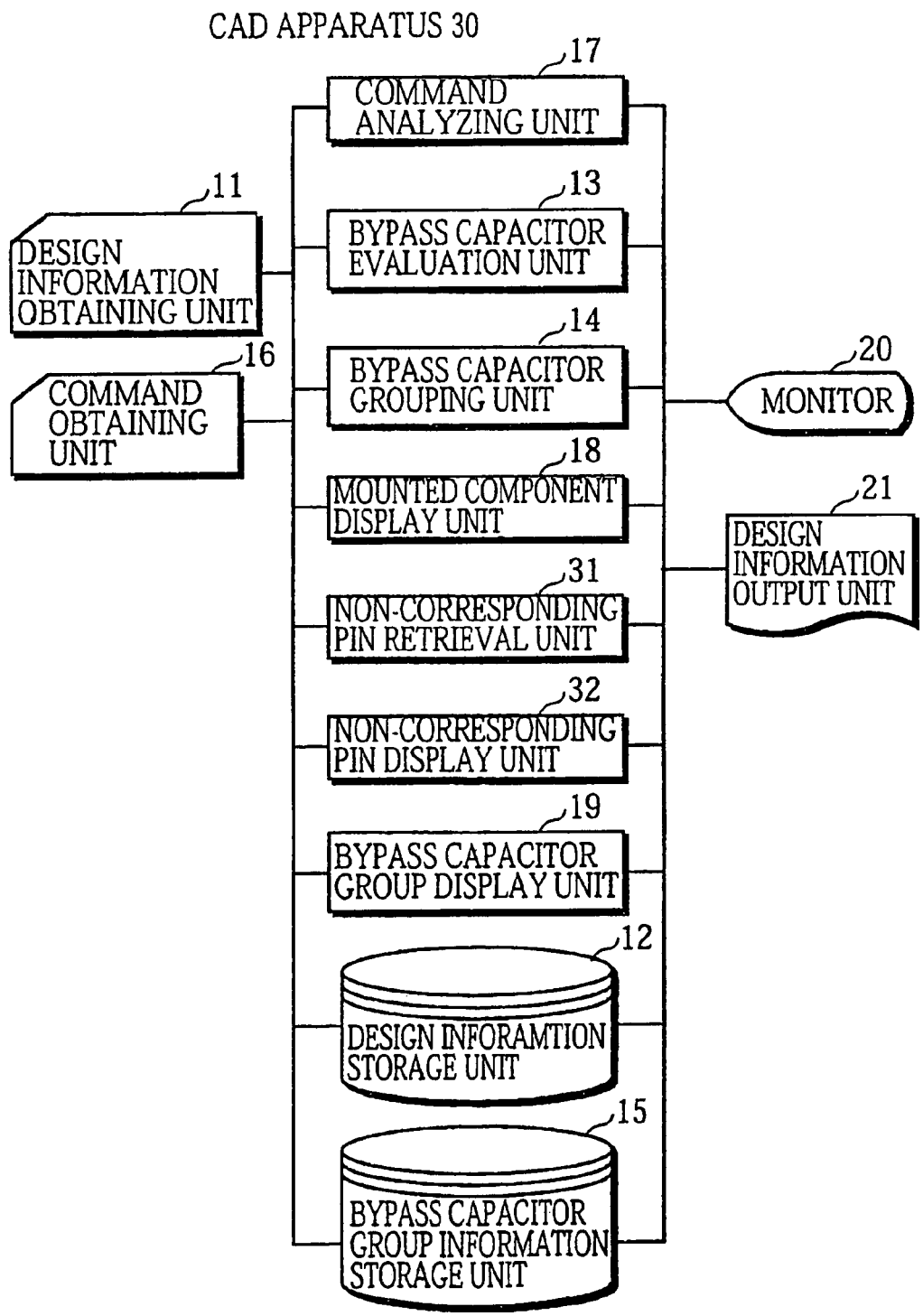
FIG. 52 is a diagram showing the construction of the CAD apparatus of the seventh embodiment.

FIG. 52 shows the construction of a CAD apparatus of the present embodiment.

The CAD apparatus shown in FIG. 52 includes a design information obtaining unit 11, a design information storage unit 12, a bypass capacitor evaluation unit 13, a bypass capacitor grouping unit 14, a bypass capacitor group information storage unit 15, a command obtaining unit 16, a command analyzing unit 17, a mounted component display unit 18, a bypass capacitor group display unit 19, a monitor 20, a design information output unit 21; a non-corresponding pin retrieval unit 31, and a non-corresponding pin display unit 32.

Here, the elements numbered in the same way as the elements in the CAD apparatus 10 shown in FIG. 38 in the first embodiment have the same functions, so an explanation of these elements will be omitted.

The non-corresponding pin retrieving unit 31 retrieves all the pins not included in the group information stored in the bypass capacitor group information storage unit 15, from amongst the IC power pins and the IC ground pins in the pin information stored in the design information storage unit 12, and recognizes the retrieved pins as non-corresponding bypass capacitor pins.

The non-corresponding-pin display unit 32 displays the IC pins recognizes by the non-corresponding pin retrieval unit 31 as bypass capacitor non-corresponding pins, and displays the non-corresponding pins in a user-recognizable state.

<Operations>

The following explains the operations when the mounted component display unit 18 of the CAD apparatus 30 of the present embodiment makes image data of each mounted component placed on a mounted board for displaying on the monitor 20, based on the design information stored in the design information storage unit 12, and the non-corresponding pin display unit 32 modifies, in correspondence with a user-recognizable state, the image data made by the mounted component display unit 18 based on the group information stored in the bypass capacitor group storage information unit 18, and then the non-corresponding pin retrieval unit 31 recognizes the bypass capacitor non-corresponding pins, and the non-corresponding pin display unit 32 displays the non-corresponding pins on the monitor 20.

Figure 53:
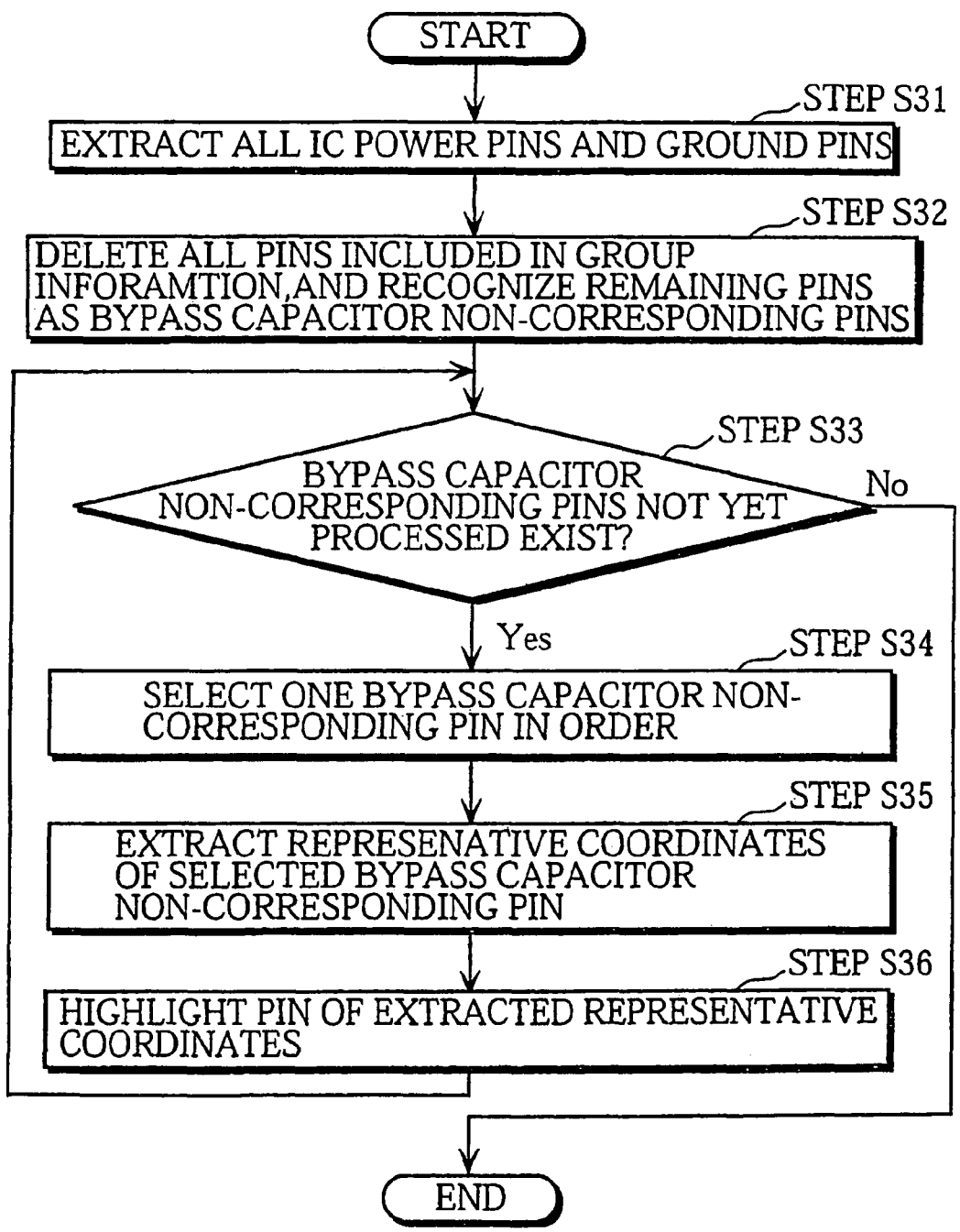
FIG. 53 is a diagram showing an example of the operations of the CAD apparatus 30 of the present embodiment.

FIG. 53 shows an example of operations of the CAD apparatus 30 of the present embodiment.

The following explains, using FIG. 53, the operations of the CAD apparatus 30 evaluating each bypass capacitor, and making and storing group information.

(1) The CAD apparatus 30 extracts all the IC power pins and the IC ground pins in the pin information stored in the design information storage unit 12 (step S31).

(2) The CAD apparatus 30 deletes all pins from the extracted power pin and ground pin information that are included in the group information stored in the bypass capacitor group information storage unit 15, and recognizes the remaining pins as non-corresponding pins (step S32).

(3) The. CAD apparatus 30 judges whether there are any bypass capacitor non-connected pins that have not been processed (step S33) If there are none the process ends.

(4) If bypass capacitor non-corresponding pins that have not been processed are judged to exist, the CAD apparatus 30 selects one bypass capacitor non-corresponding pin at a time in order (step S34).

(5) The CAD apparatus 30 extracts, from the pin information stored in the design information storage unit 12, the representative point coordinates of the selected bypass capacitor non-corresponding pin (step S35).

(6) The CAD apparatus 30 displays the pin of the extracted representative point coordinates in a user-recognizable state, and proceeds to process the next bypass capacitor non-corresponding pin at step S33 (step S36). For example, the pin may be highlighted by thickening the outer lines of the shape of the pin, by filling in the area corresponding to the pin, or changing the display color of the pin.

Figure 54:
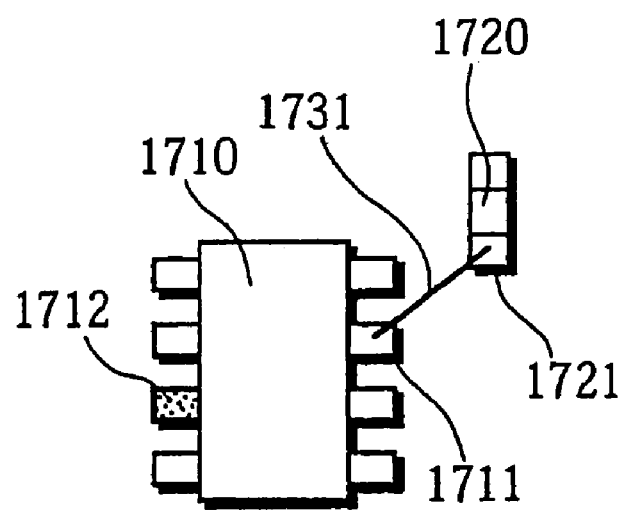
FIG. 54 is a display example of the image displayed on the monitor 20 when a bypass capacitor non-corresponding pin is displayed in a user-recognizable state.

FIG. 54 is a display example of an image displayed on the monitor 20 when a bypass capacitor non-connected pin is displayed in a user-recognizable state. Here, a power pin 1711 of an IC 1710, and a power pin 1721 of a bypass capacitor 1720 are stored in the bypass capacitor group information storage unit 15 as the same group. A power pin 1712 of the IC 1710 is not stored in the bypass capacitor group information storage unit 15.

As shown in FIG. 54 the IC power pin 1711 and the bypass capacitor power pin 1721 are linked by a line 1731, but the power pin 1712 is not linked at all. In addition, here the power pin 1712 is highlighted by the outer lines of the shape being thickened, and the area being filled in.

As explained above, according to the CAD apparatus 30 of the present embodiment, IC pins that do not correspond with a bypass capacitor can be highlighted.

Please note that here the IC pin is highlighted, but the IC may be highlighted.

Eighth Embodiment

<Outline>

The present embodiment discovers superfluous bypass capacitors easily by retrieving and highlighting bypass capacitors and bypass capacitor pins that are not in relation with switching elements.

<Construction>

Figure 55:
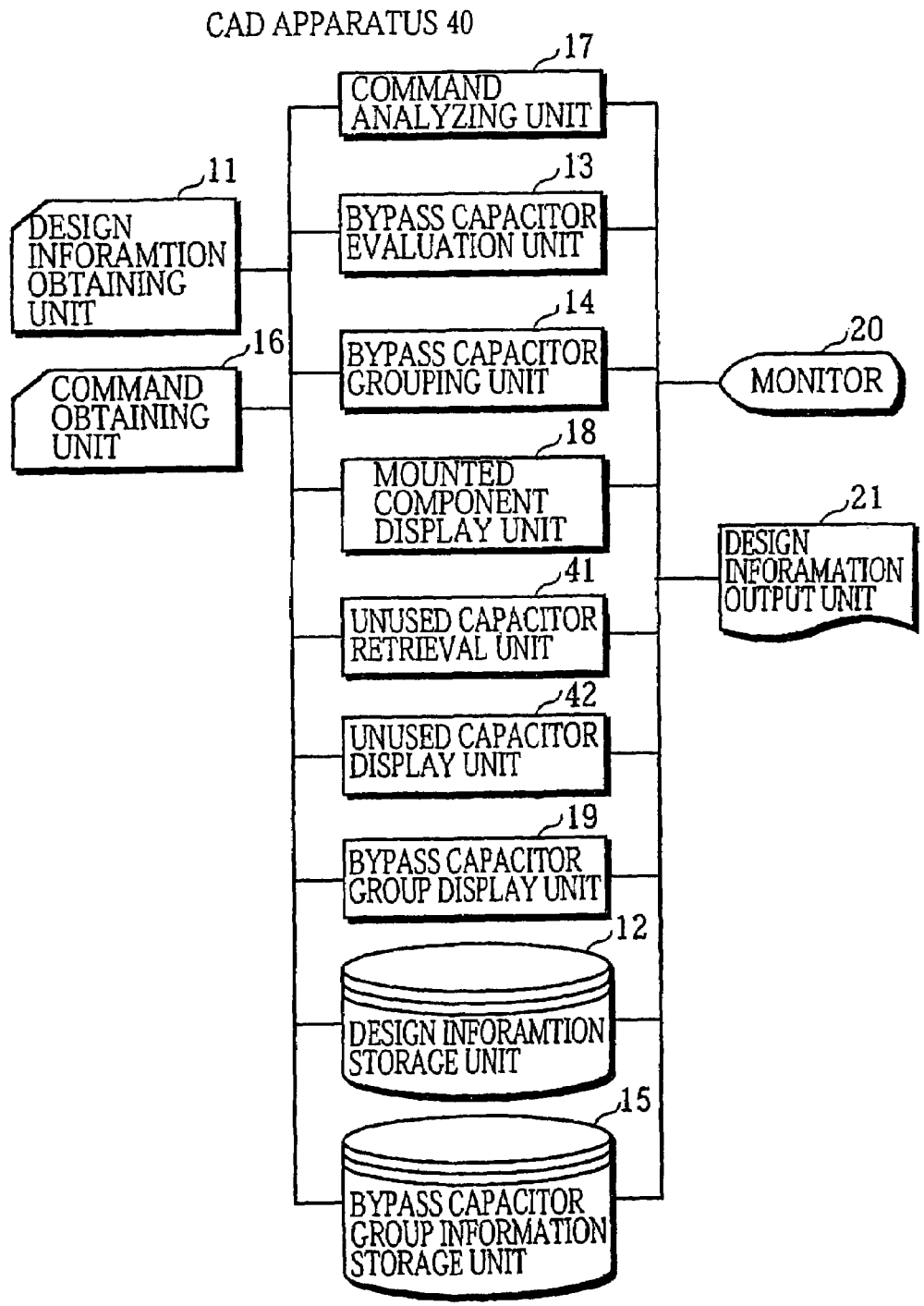
FIG. 55 is a diagram showing the structure of the CAD apparatus of the eighth embodiment.

FIG. 55 shows the construction of a CAD apparatus of the present embodiment.

The CAD apparatus 40 shown in FIG. 55 includes a design information obtaining unit 11, a design information storage unit 12, a bypass capacitor evaluation unit 13, a bypass capacitor grouping unit 14, a bypass capacitor group information storage unit 15, a command obtaining unit 16, a command analyzing unit 17, a mounted component display unit 18, a bypass capacitor group display unit 19, a monitor 20, a design information output unit 21, an unused capacitor searching unit 41, and an unused capacitor display unit 42.

Here, the elements numbered in the same way as the elements in the CAD apparatus 10 in the sixth embodiment shown in FIG. 38 have the same functions, so an explanation of these elements will be omitted.

The unused capacitor display unit 41 retrieves all the pins not included in the group information stored in the bypass capacitor group information storage unit 15, from amongst the capacitor power pins and the capacitor ground pins in the pin information stored in the design information storage unit 12, and recognizes the capacitors that have the retrieved pins as unused capacitors.

The unused capacitor display unit 42 displays the capacitors recognized by the unused capacitor search unit 41 as being unused capacitors in a user-recognizable state.

<Operations>

The following explains the operations when the mounted component display unit 18 of the CAD apparatus 40 of the present embodiment makes image data of each mounted component mounted on a fully populated board for displaying on the monitor 20, based on the design information stored in the design information storage unit 12, and the unused capacitor pin display unit 42 modifies, in correspondence with a user-recognizable state, the image data made by the mounted component display unit 18 based on the group information stored in the bypass capacitor group storage information unit 18, and then the unused capacitor retrieval unit 41 recognizes the unused bypass capacitors, and the unused capacitor display unit 42 displays the non-corresponding pins on the monitor 20.

Figure 56:
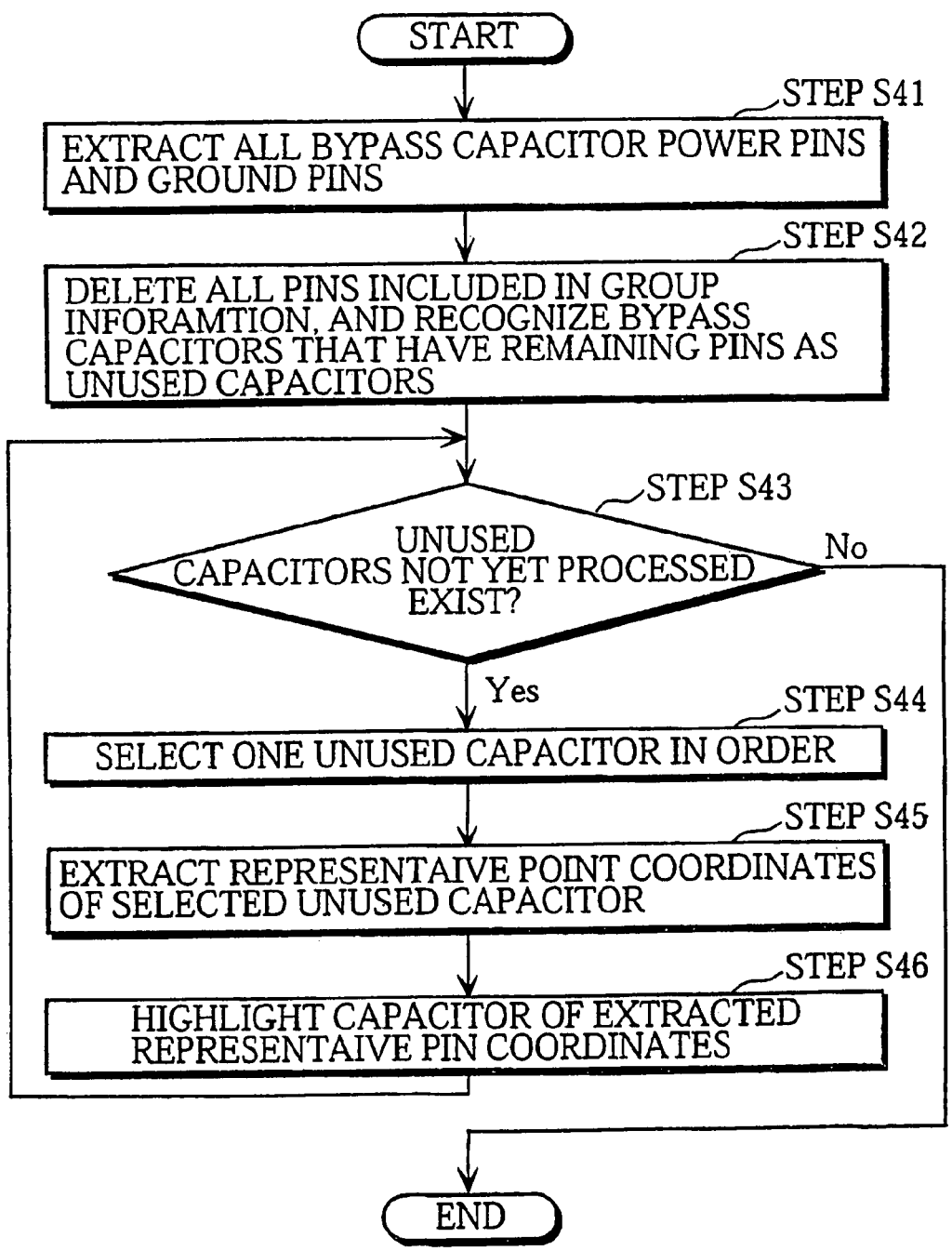
FIG. 56 is a diagram showing an example of the operations of the CAD apparatus 40 in the present embodiment.

FIG. 56 shows an example of the operations of the CAD apparatus 40 of the present embodiment.

The following explains, using FIG. 56, the operations of the CAD apparatus 40 evaluating each bypass capacitor, and making and storing group information.

(1) The CAD apparatus 40 extracts all the IC power pins and the IC ground pins in the pin information stored in the design information storage unit 12 (step S41).

(2) The CAD apparatus 40 deletes all pins from the extracted power pin and ground pin information that are included in the group information stored in the bypass capacitor group information storage unit 15, and recognizes the bypass capacitors having the remaining pins as unused capacitors (step S42).

(3) The CAD apparatus 40 judges whether there are any unused capacitors that have not been processed (step S43). If there are none the process ends.

(4) If unused capacitor that have not been processed are judged to exist, the CAD apparatus 40 selects one unused capacitor at a time in order (step S44).

(5) The CAD apparatus 40 extracts, from the pin information stored in the design information storage unit 12, the representative point coordinates of the selected unused capacitor (step S45).

(6) The CAD apparatus 40 displays the capacitor of the extracted representative point coordinates in a user-recognizable state (step S46), and proceeds to process the next unused capacitor (step S33). For example, the capacitor may be highlighted by thickening the outer lines of the shape of the capacitor, by filling in the area corresponding to the capacitor, or changing the display color of the capacitor.

Figure 57:
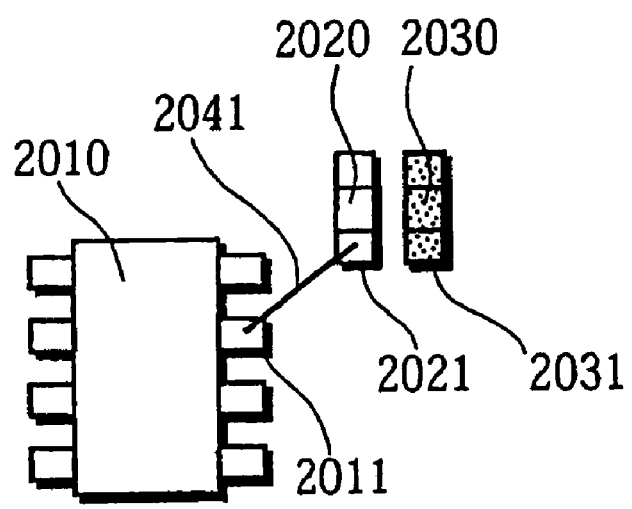
FIG. 57 is a display example of the image displayed on the monitor 20 when an unused capacitor is displayed in a user-recognizable state.

FIG. 57 is a display example of an image displayed on the monitor 20 when an unused capacitor is displayed in a user-recognizable state. Here, a power pin 2011 of an IC 2010, and a power pin 2021 of a bypass capacitor 202b are stored as the same group in the bypass capacitor group information storage unit 15. A power pin 2031 of a bypass capacitor 2030 is not stored in the bypass capacitor group information storage unit 15.

As shown in FIG. 57, the IC power pin 2011 and the bypass capacitor power pin 2021 are linked by a line 2041, but the power pin 2031 is not linked at all. In addition, here the bypass capacitor 2030 is highlighted by the outer lines of the shape being thickened, and the area being filled in.

As explained above, according to the CAD apparatus 40 of the present embodiment, bypass capacitors that do not correspond with an IC pin can be highlighted.

Please note that in the sixth to the eighth embodiment the example of bypass capacitors is used as components whose effects differ according to placement position, but the component type is not limited to bypass capacitors. For example, the component type may be diving resistors, terminal resistors, ferrite cores, or EMI-countering components.

In each of the above-described embodiments, a CAD apparatus for aiding the design of printed wiring boards is explained, but the present invention can naturally also be applied to a CAD apparatus for aiding the design of IC internal circuit chips (bare chips).

Furthermore, a program that implements operations in a computer such as the operations in the first to the third embodiments can be recorded in a computer readable recording medium. This storage medium can be distributed and traded.

Here the computer readable recording medium is not limited to any particular medium and may be, for example, a removable storage medium such as floppy disc, a CD, an MO, a DVD, or a memory card, or a fixed storage medium such as a hard disk or a semiconductor memory.

Although the present invention has been fully described by way of examples with reference to accompanying drawings, it is to be noted that various changes and modifications will be apparent to those skilled in the art. Therefore, unless such changes and modifications depart from the scope of the present invention, they should be construed as being included therein.

What is claimed is:

1. A component placement evaluation aiding computer program embodied on a computer readable medium for displaying a placement of components that are on a wiring board and aiding an evaluation by a user of whether a placement of a position dependent component whose effectiveness differs according to a placement position is appropriate, the program realizing on a computer:

a position information storage step for storing a set of position information which is made up of information showing a position on a wiring board of (a) a position dependent component, or a pin thereof, and (b) one or more effected components, or pins thereof, which are potentially effected by the position dependent component, wherein the position information storage step includes determining and storing effective components based on an effective frequency spectrum according to pin spacing:

a retrieval step for retrieving from the position dependent component or the pin thereof, based on the sets of position information stored in the position information storage step, for each effected component or the pins thereof, whether the effected component or the pin thereof is within a predetermined distance from the placement dependent component or the pin thereof, or for retrieving a predetermined number of effected components or pins thereof in a predetermined order; and a relationship information storage step for storing the effected component or the pin of the effected component retrieved in the retrieval step in relation with the position dependent component or the pin thereof from which the retrieval was performed, as relationship information.

2. The component placement evaluation aiding computer program of claim 1 wherein the position information storage step includes storing a priority order for noise generating components.

3. The component placement evaluation aiding computer program of claim 1 wherein the position information storage step includes identifying components that are noise-countering components.

4. A component placement evaluation aiding computer program embodied on a computer readable medium for displaying a placement of components that are on a wiring board and aiding an evaluation by a user of whether a placement of a position dependent component whose effectiveness differs according to a placement position is appropriate, the program realizing on a computer:

a position information storage step for storing a set of position information which is made up of information showing a position on a wiring board of (a) a position dependent component, or a pin thereof, and (b) one or more effected components, or pins thereof, which are potentially effected by the position dependent component, wherein the position information storage step includes determining a pin priority order;

a retrieval step for retrieving from the position dependent component or the pin thereof, based on the sets of position information stored in the position information storage step, for each effected component or the pins thereof, whether the effected component or the pin thereof is within a predetermined distance from the placement dependent component or the pin thereof, or for retrieving a predetermined number of effected components or pins thereof in a predetermined order; and a relationship information storage step for storing the effected component or the pin of the effected component retrieved in the retrieval step in relation with the position dependent component or the pin thereof from which the retrieval was performed, as relationship information.

5. The component placement evaluation aiding computer program of claim 4 wherein the position information storage step includes storing a priority order for noise generating components.

6. The component placement evaluation aiding computer program of claim 4 wherein the position information storage step includes identifying components that are noise-countering components.

7. A component placement evaluation aiding computer program embodied on a computer readable medium for displaying a placement of components that are on a wiring board and aiding an evaluation by a user of whether a placement of a position dependent component whose effectiveness differs according to a placement position, is appropriate, the program realizing on a computer:

a position information storage step for storing a set of position information which is made up of information showing a position on a wiring board of (a) a position dependent component, or a pin thereof, and (b) one or more effected components, or pins thereof, which are potentially effected by the position dependent component, wherein the position information storage step includes determining an effected component priority order in ascending order of impedance;

a retrieval step for retrieving from the position dependent component or the pin thereof, based on the sets of position information stored in the position information storage step, for each effected component or the pins thereof, whether the effected component or the pin thereof is within a predetermined distance from the placement dependent component or the pin thereof, or for retrieving a predetermined number of effected components or pins thereof in a predetermined order; and a relationship information storage step for storing the effected component or the pin of the effected component retrieved in the retrieval step in relation with the position dependent component or the pin thereof from which the retrieval was performed, as relationship information.

8. The component placement evaluation aiding computer program of claim 7 wherein the position information storage step includes storing a priority order for noise generating components.

9. The component placement evaluation aiding computer program of claim 7 wherein the position information storage step includes identifying components that are noise-countering components.

* * * * *

UNITED STATES PATENT AND TRADEMARK OFFICE
CERTIFICATE OF CORRECTION

PATENT NO. : 7,120,885 B2  Page 1 of 1
APPLICATION NO. : 10/620535
DATED : October 10, 2006
INVENTOR(S) : Nakayama et al.

It is certified that error appears in the above-identified patent and that said Letters Patent is hereby corrected as shown below:

In the Claims:
Column 49, line 58, ":" should be --;--.

Signed and Sealed this

Twenty-third Day of January, 2007

JON W. DUDAS
*Director of the United States Patent and Trademark Office*